(12) United States Patent
Lilak et al.

(10) Patent No.: US 11,239,236 B2
(45) Date of Patent: Feb. 1, 2022

(54) FORKSHEET TRANSISTOR ARCHITECTURES

(71) Applicant: Intel Corporation, Santa Clara, CA (US)

(72) Inventors: Aaron D. Lilak, Beaverton, OR (US); Rishabh Mehandru, Portland, OR (US); Ehren Mannebach, Beaverton, OR (US); Patrick Morrow, Portland, OR (US); Willy Rachmady, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 11 days.

(21) Appl. No.: 16/827,566

(22) Filed: Mar. 23, 2020

(65) Prior Publication Data

US 2021/0296315 A1    Sep. 23, 2021

(51) Int. Cl.
*H01L 27/092* (2006.01)
*H01L 23/528* (2006.01)
*H01L 29/10* (2006.01)

(52) U.S. Cl.
CPC ...... *H01L 27/0922* (2013.01); *H01L 23/5283* (2013.01); *H01L 29/1033* (2013.01)

(58) Field of Classification Search
CPC ............. H01L 29/1033; H01L 23/5283; H01L 29/785; H01L 27/0922
See application file for complete search history.

(56) References Cited

U.S. PATENT DOCUMENTS

| 2015/0021784 A1* | 1/2015 | Lin .................. H01L 24/92 257/774 |
| 2019/0355845 A1* | 11/2019 | Zhou ................ H01L 29/78642 |
| 2020/0105752 A1* | 4/2020 | Liaw ................ H01L 29/78696 |

* cited by examiner

*Primary Examiner* — Changhyun Yi
(74) *Attorney, Agent, or Firm* — Schwabe, Williamson & Wyatt, P.C.

(57) ABSTRACT

Embodiments disclosed herein include a semiconductor device. In an embodiment, the semiconductor device comprises a first transistor strata. The first transistor strata comprises a first backbone, a first transistor adjacent to a first edge of the first backbone, and a second transistor adjacent to a second edge of the first backbone. In an embodiment, the semiconductor device further comprises a second transistor strata over the first transistor strata. The second transistor strata comprises a second backbone, a third transistor adjacent to a first edge of the second backbone, and a fourth transistor adjacent to a second edge of the second backbone.

24 Claims, 37 Drawing Sheets

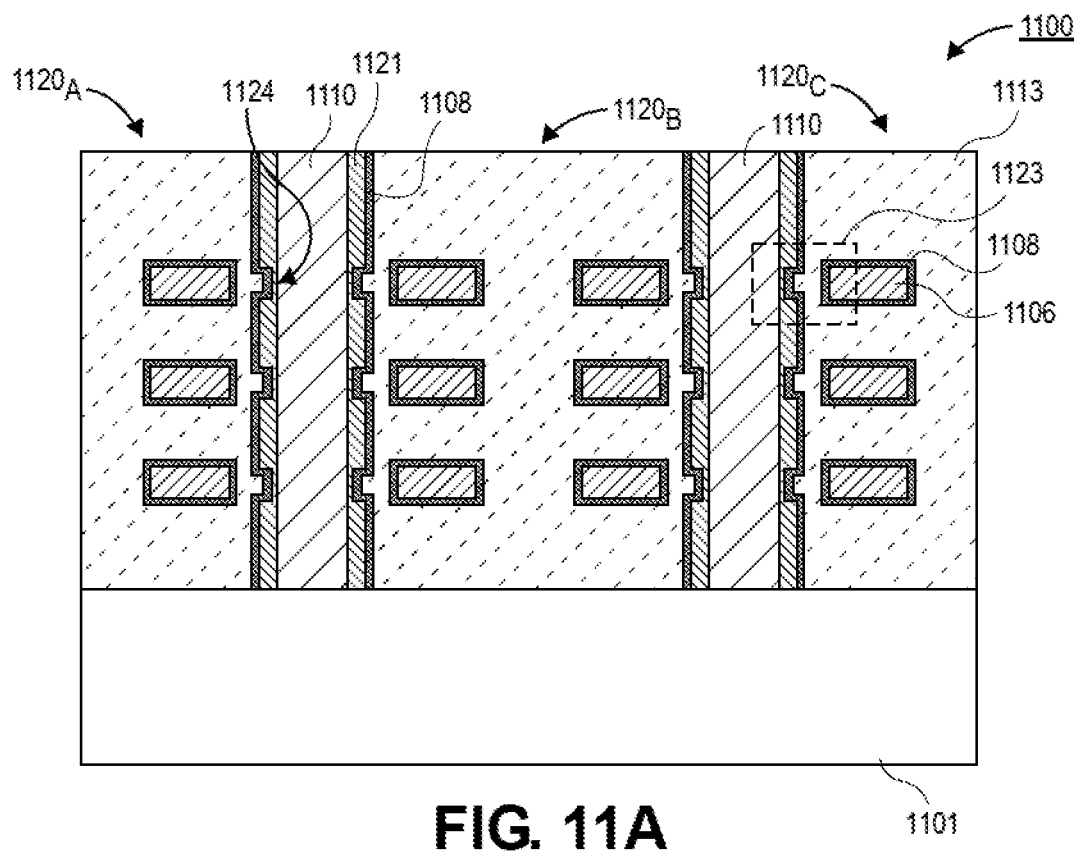
FIG. 11A
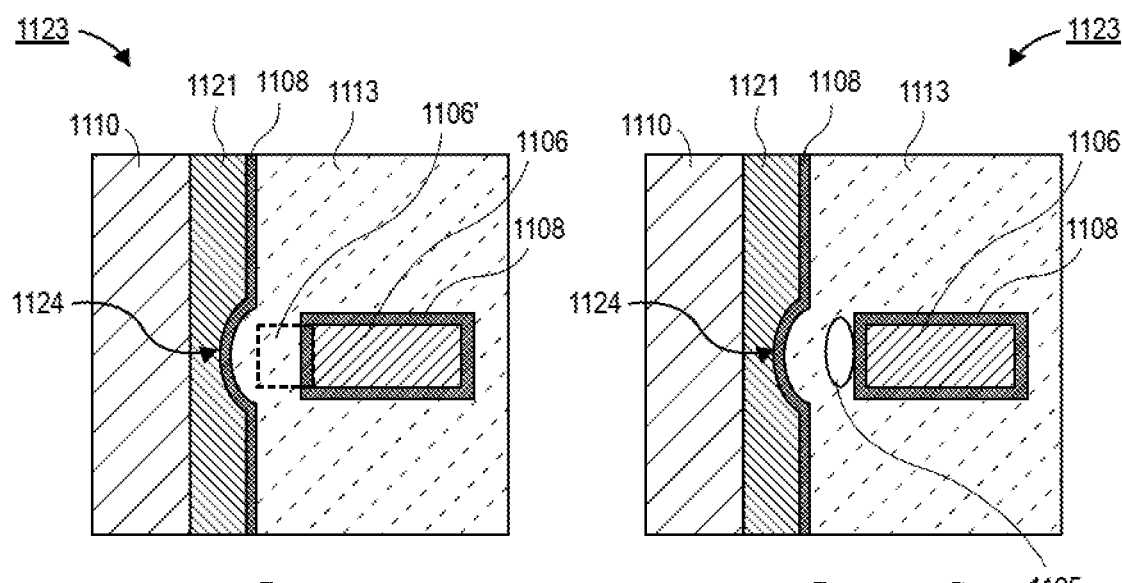
FIG. 11B          FIG. 11C

FORKSHEET TRANSISTOR ARCHITECTURES

TECHNICAL FIELD

Embodiments of the present disclosure relate to semiconductor devices, and more particularly to forksheet transistors with various architectures and interconnects.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In another aspect, maintaining mobility improvement and short channel control as microelectronic device dimensions scale below the 10 nanometer (nm) node provides a challenge in device fabrication. Nanowires used to fabricate devices provide improved short channel control.

Scaling multi-gate and nanowire transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

In order to combat the demands of spacing between features, a forksheet transistor architecture has been proposed. In a forksheet architecture, an insulating backbone is disposed between a first transistor and a second transistor. The semiconductor channels (e.g., ribbons, wires, etc.) of the first transistor and the second transistor contact opposite sidewalls of the backbone. As such, the spacing between the first transistor and the second transistor is reduced to the width of the backbone. Since one surface of the semiconductor channels contacts the backbone, such architectures do not allow for gate all around (GAA) control of the semiconductor channels. Additionally, compact interconnect architectures between the first transistor and the second transistor have yet to be proposed.

BRIEF DESCRIPTION OF THE DRAWINGS

FIG. 11A is a cross-sectional illustration of forksheet transistors with a catalytic oxidant material for the liner over the backbones, in accordance with an embodiment.

FIGS. 11B and 11C are zoomed in illustrations that illustrate the topography of the liner proximate to the semiconductor channel, in accordance with various embodiments.

EMBODIMENTS OF THE PRESENT DISCLOSURE

Described herein are forksheet transistors with various architectures and interconnect schemes, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1A:
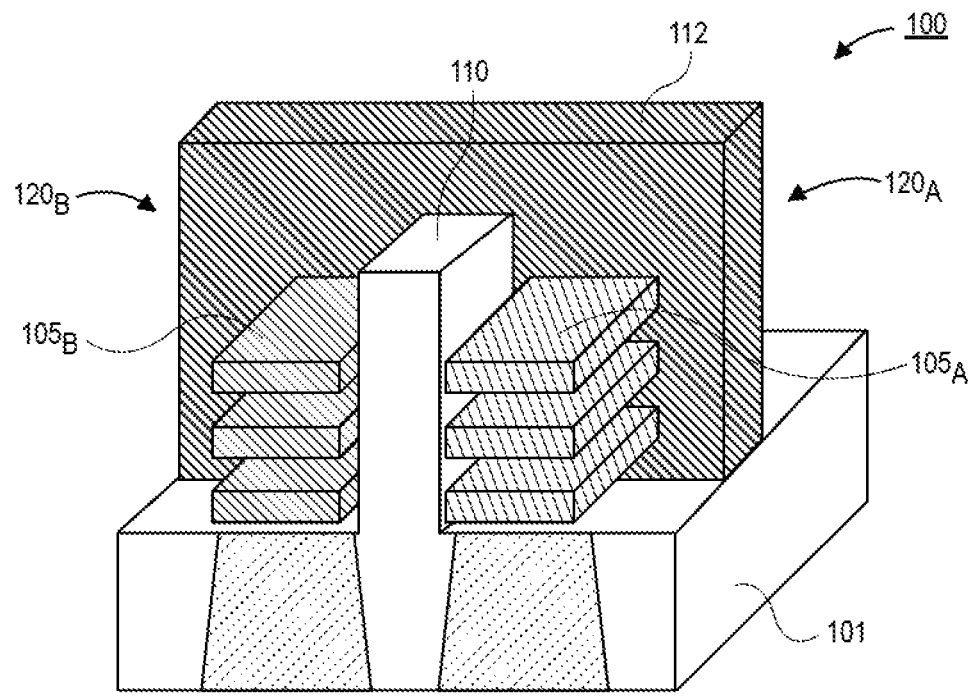
FIG. 1A is a perspective view illustration of forksheet transistors.

As noted above, forksheet transistors allow for increased density of non-planar transistor devices. An example of semiconductor device 100 with forksheet transistors $120_A$ and $120_B$ is shown in FIG. 1A. A forksheet transistor includes a backbone 110 that extends up from a substrate 101 with a transistor 120 adjacent to the either sidewall of the backbone 110. As such, the spacing between transistors $120_A$ and $120_B$ is equal to the width of the backbone 110. Therefore, the density of such forksheet transistors 120 can be increased compared to other non-planar transistor architectures (e.g., fin-FETs, nanowire transistors, etc.).

Sheets 105 of semiconductor material extend away (laterally) from the backbone 110. In the illustration of FIG. 1A, sheets $105_A$ and $105_B$ are shown on either side of the backbone 110. The sheets $105_A$ are for the first transistor $120_A$ and the sheets $105_B$ are for the second transistor $120_B$. The sheets $105_A$ and $105_B$ pass through a gate structure 112. The portions of the sheets $105_A$ and $105_B$ within the gate structure 112 are considered the channel, and the portions of the sheets $105_A$ and $105_B$ on opposite sides of the gate structure 112 are considered source/drain regions. In some implementations, the source/drain regions comprise an epitaxially grown semiconductor body, and the sheets 105 may only be present within the gate structure 112. That is, the stacked sheets $105_A$ and $105_B$ are replaced with a block of semiconductor material.

Figure 1B:
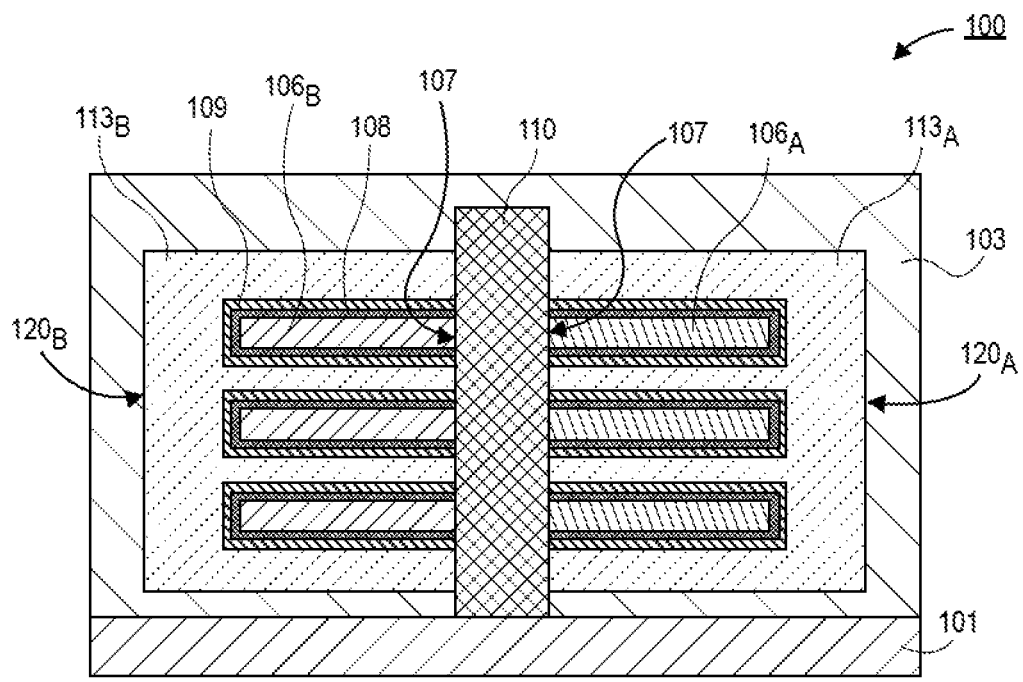
FIG. 1B is a cross-sectional illustration of forksheet transistors across the semiconductor channels.

Referring now to FIG. 1B, a cross-sectional illustration of the semiconductor device 100 through the gate structure 112 is shown. As shown, vertical stacks of semiconductor channels $106_A$ and $106_B$ are provided through the gate structure 112. The semiconductor channels $106_A$ and $106_B$ are connected out of the plane of FIG. 1B to the source/drain regions. The semiconductor channels $106_A$ and $106_B$ are surrounded on three sides by a gate dielectric 108. The surfaces 107 of the semiconductor channels $106_A$ and $106_B$ are in direct contact with the backbone 110. A workfunction metal 109 may surround the gate dielectric 108, and a gate fill metal $113_A$ and $113_B$ may surround the workfunction metal 109. In the illustration, the semiconductor channels $106_A$ and $106_B$ are shown as having different shading. However, in some implementations, the semiconductor channels $106_A$ and $106_B$ may be the same material. An insulator layer 103 may be disposed over the gate fill metals $113_A$ and $113_B$.

While such forksheet transistors $120_A$ and $120_B$ provide many benefits, there are still many areas for improvement in order to provide higher densities, improved interconnection architectures, and improved performance. For example, embodiments disclosed herein provide further density improvements by stacking a plurality of transistor strata over each other. Whereas the semiconductor device 100 in FIGS. 1A and 1B illustrate a single strata (i.e., a pair of adjacent forksheet transistors $120_A$ and $120_B$), embodiments disclosed herein comprise a first strata and a second strata (e.g., to provide four forksheet transistors) within the same footprint illustrated in FIGS. 1A and 1B. Additionally, embodiments disclosed herein provide interconnect architectures that allow for electrical coupling between the first strata and the second strata to effectively utilize the multiple strata. Additionally, embodiments disclosed herein include interconnect architectures that allow for bottom side connections to the buried strata.

Embodiments disclosed herein also include forksheet transistors with architectures that allow for gate-all-around (GAA) control of the semiconductor channels. Whereas existing forksheet transistors include a surface of the semiconductor channels that is in direct contact with the backbone, embodiments disclosed herein comprise various liner architectures for the backbone that allow for semiconductor channels to be spaced away from the backbone. In some embodiments, the liner is completely removed in the gate region. In other embodiments, the liner comprises a catalytic oxidant that allows for selective removal of portions of the liner adjacent to the semiconductor channels or for removal of a portion of the semiconductor immediately adjacent to the catalytic oxidant material.

Embodiments disclosed herein also comprise interconnect architectures that allow for interconnections between forksheet transistors within the same strata. For example, embodiments include interconnects that pass across the backbone in order to connect source/drain regions and/or gate electrodes of neighboring forksheet transistors. In some embodiments, the interconnects are formed with a timed etching process. In other embodiments, the interconnects are formed using an etchstop layer that is embedded in the backbone.

Embodiments disclosed herein also comprise architectures for providing selective interconnects to contacts that underlie the forksheet transistors (i.e., bottom side contacts). The selective bottom side contact formation is implemented using an etch selective layer below the forksheet transistors. The etch selective layer may be aligned with overlying semiconductor channels in some embodiments. In some architectures disclosed herein, etch selective layers that comprise the same material are below both neighboring forksheet transistors. In other embodiments, a first etch selective layer is below a first forksheet transistor, and a second etch selective layer (that has a different etch selectivity than the first etch selective layer) is below the neighboring second forksheet transistor.

Figure 2A:
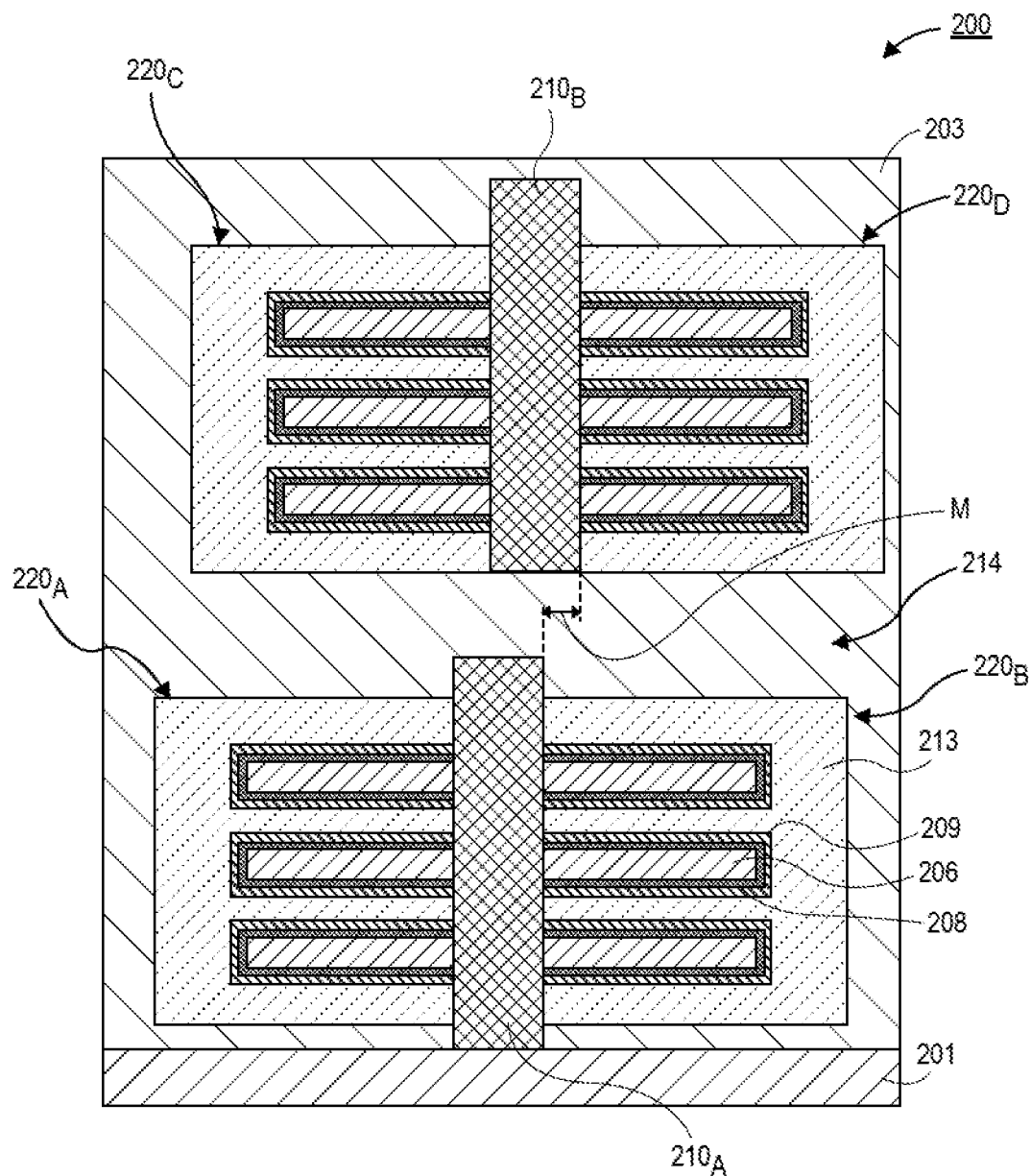
FIGS. 2A-2C are cross-sectional illustrations of stacked forksheet transistors, in accordance with various embodiments.

Referring now to FIG. 2A, a cross-sectional illustration of a semiconductor device 200 is shown, in accordance with an embodiment. The cross-sectional illustration in FIG. 2A is through the gate region and perpendicular to the semiconductor channels 206. The semiconductor device 200 comprises a first strata of forksheet transistors $220_A$ and $220_B$ and a second strata of forksheet transistors $220_C$ and $220_D$ over the first strata. In an embodiment, an insulating layer 214 may separate the first strata from the second strata. The insulating layer 214 may be part of an insulating layer 203 that surrounds both strata. In other embodiments, the insulating layer 214 may be a discrete layer from the insulating layer 203.

In an embodiment, the first strata and the second strata may be disposed over a substrate 201. In an embodiment, the substrate 201 is an insulating layer. The substrate 201 may overly a semiconductor substrate in some embodiments. In an embodiment, the underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials.

In the illustrated embodiment, the first strata comprises forksheet transistors $220_A$ and $220_B$ that have a first conductivity type, and the second strata comprises forksheet transistors $220_C$ and $220_D$ that have a second conductivity type. For example, the first strata may comprise P-type transistors 220 and the second strata may comprise N-type transistors 220. However, in other embodiments one or both of the first strata and the second strata may comprise transistors 220 with both conductivity types. For example, the first transistor $220_A$ may be P-type and the second transistor $220_B$ may be N-type. In the illustrated embodiment, each of the transistors 220 are shown as having three semiconductor channels 206. However, it is to be appreciated that any number of semiconductor channels 206 may be used in the various transistors 220.

In an embodiment, the first strata may comprise a first backbone $210_A$. Semiconductor channels 206 may extend out (laterally) from the first backbone $210_A$. In an embodiment, the semiconductor channels 206 may comprise material such as, but not limited to, silicon, germanium, SiGe, GaAs, InSb, GaP, GaSb, InAlAs, InGaAs, GaSbP, GaAsSb, and InP. In some embodiments, a surface of the semiconductor channels 206 may directly contact an edge of the first backbone $210_A$. In other embodiments (as will be described in greater detail below) the semiconductor channels 206 may be spaced away from the first backbone $210_A$. In the illustrated embodiment, the semiconductor channels 206 are shown as having a substantially rectangular cross-section. However, it is to be appreciated that the cross-section of the semiconductor channels 206 may have any suitable shape. In some instances, the semiconductor channels 206 may be referred to as nanoribbons or nanowires.

In an embodiment, a perimeter of the semiconductor channels 206 may be (at least partially) surrounded by a gate dielectric 208. The gate dielectric 208 may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric 208 layer to improve its quality when a high-k material is used.

In an embodiment, a workfunction metal 209 may surround the gate dielectric 208. When the workfunction metal 209 will serve as an N-type workfunction metal, the workfunction metal 209 preferably has a workfunction that is between about 3.9 eV and about 4.2 eV. N-type materials that may be used to form the workfunction metal 209 include, but are not limited to, hafnium, zirconium, titanium, tantalum, aluminum, and metal carbides that include these elements, i.e., titanium carbide, zirconium carbide, tantalum carbide, hafnium carbide and aluminum carbide. When the workfunction metal 209 will serve as a P-type workfunction metal, the workfunction metal preferable has a workfunction that is between about 4.9 eV and about 5.2 eV. P-type materials that may be used to form the workfunction metal 209 include, but are not limited to, ruthenium, palladium, platinum, cobalt, nickel, and conductive metal oxides, e.g., ruthenium oxide.

In an embodiment, a gate fill metal 213 may surround the workfunction metal 209. The gate fill metal 213 may comprise a wide range of materials, such as polysilicon, silicon nitride, silicon carbide, or various suitable metals or metal alloys, such as aluminum, tungsten, titanium, tantalum, copper, titanium nitride, or tantalum nitride, for example. The combination of the gate fill metal 213 and the workfunction metal 209 may sometimes be referred to herein as a gate electrode for simplicity.

In an embodiment, the second strata may comprise a second backbone $210_B$. The third transistor $220_C$ and the fourth transistor $220_D$ may be positioned on opposing edges of the second backbone $210_B$. The structures and materials for the third transistor $220_C$ and the fourth transistor $220_D$ may be substantially similar to those described above with respect to the first transistor $220_A$ and the second transistor $220_B$.

In an embodiment, the first strata and the second strata may be fabricated with different processing flows. That is, the first strata may be fabricated using a first lithography process, and the second strata may be fabricated using a second lithography process. As such, there may be some registration error between the first strata and the second strata due to overlay limits of existing lithography tools. For example, a registration error M is shown in FIG. 2A. That is, an edge of the first backbone $210_A$ may be misaligned with respect to an edge of the second backbone $210_B$.

In order to eliminate the registration error M, some embodiments disclosed herein utilize a self-aligned process to form stacked strata of forksheet transistors. An example of such an embodiment is shown in FIG. 2B.

Figure 2B:
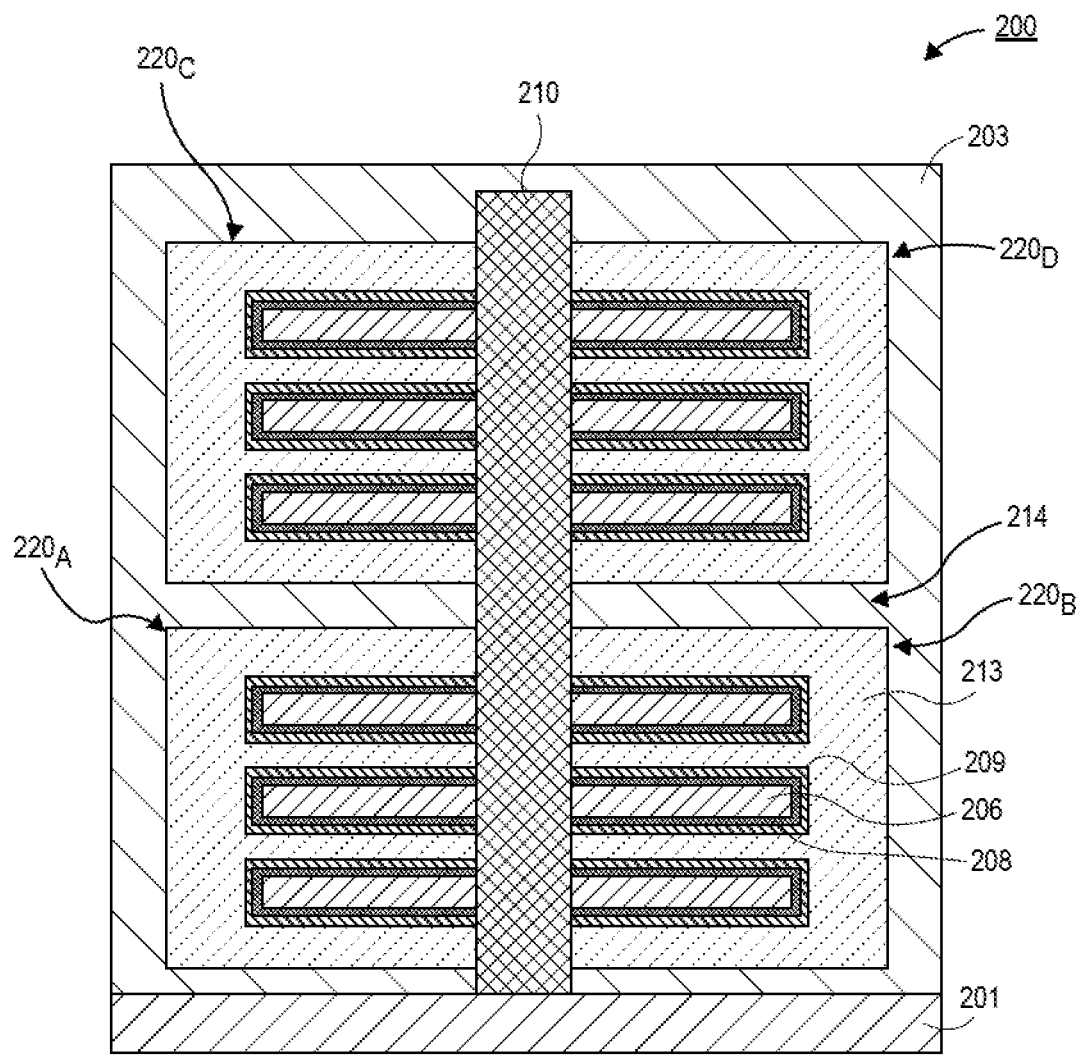

As shown in FIG. 2B, the semiconductor device 200 includes a first strata (i.e., first transistor $220_A$ and second transistor $220_B$) and a second strata (i.e., third transistor $220_C$ and fourth transistor $220_D$). The semiconductor device 200 in FIG. 2B is substantially similar to the semiconductor device 200 in FIG. 2A, with the exception that a single backbone 210 is provided, and there is no registration error between the two strata. In an embodiment, the first strata and the second strata of transistors 220 may both be adjacent to the backbone 210. The elimination of the registration error between the strata is made possible by using a self-aligned fabrication process. For example, a single lithography operation is used to pattern the backbone 210 (used by both strata), and a single lithography operation is used to pattern the semiconductor channels 206 of both strata. A more detailed explanation of such a self-aligned process flow is provided with respect to FIGS. 3A-3D below.

Figure 2C:
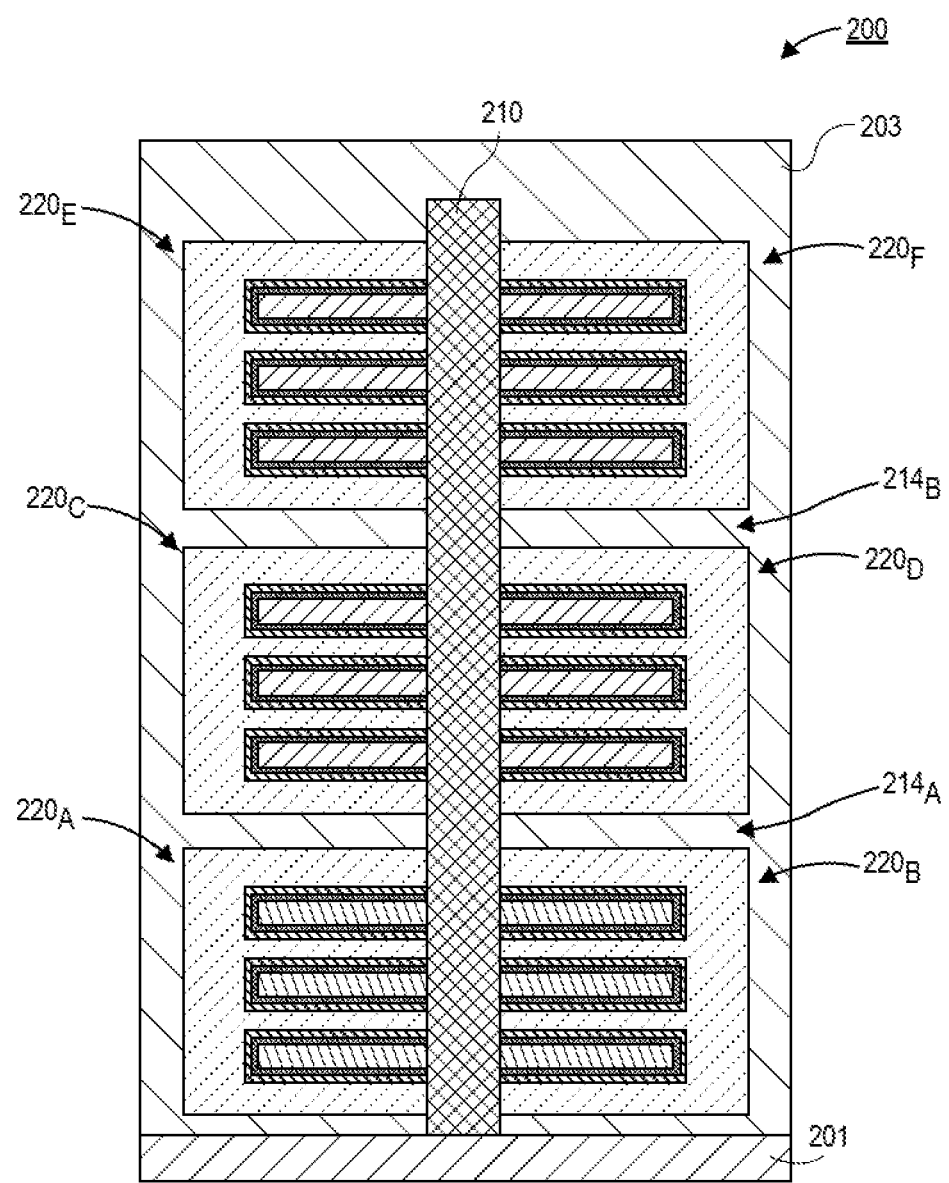

Referring now to FIG. 2C, a cross-sectional illustration of a semiconductor device 200 is shown, in accordance with an additional embodiment. The semiconductor device 200 in FIG. 2C is substantially similar to the semiconductor device 200 in FIG. 2B, with the exception that a third strata (i.e., fifth transistor $220_E$ and sixth transistor $220_F$) are positioned above the second strata. As shown, the third strata is also self-aligned with the underlying strata, and shares the single backbone 210. While examples of two strata and three strata are shown herein, it is to be appreciated that a semiconductor device 200 may be implemented with any number of stacked strata. The plurality of stacked strata may be implemented with a self-aligned process (e.g., similar to FIGS. 2B and 2C) or with discrete processing (e.g., similar to FIG. 2A).

Referring now to FIGS. 3A-3D a series of illustrations depicting a process for fabricating self-aligned stacked forksheet transistors is shown, in accordance with an embodiment.

Figure 3A:
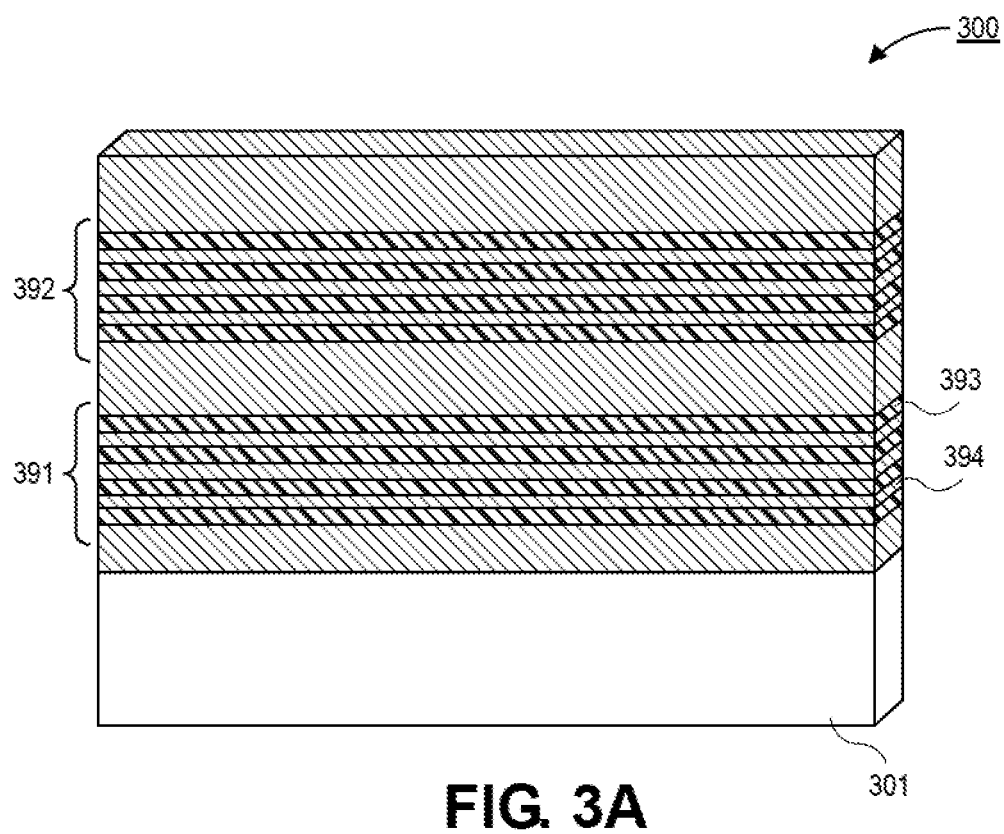
FIGS. 3A-3D are cross-sectional illustrations depicting a process for fabricating self-aligned stacked forksheet transistors, in accordance with an embodiment.

Referring now to FIG. 3A, a perspective view illustration of a semiconductor device 300 is shown, in accordance with an embodiment. In an embodiment, the semiconductor device 300 comprises a substrate 301 and a plurality of epitaxially grown layers 393, 394 over the substrate 301. The layers 393, 394 may be arranged into a first strata 391 and a second strata 392 over the first strata 391. The layers 393 may be a semiconductor material that is to be used for the channels of transistor devices. For example, the layers 393 may comprise silicon. The layers 394 may be sacrificial layers that are etch selective to the layers 393. For example, when layer 393 is silicon, layer 394 may comprise silicon germanium. In an embodiment, the layers 393 and 394 may be patterned into a fin. In another embodiment, the layers 393 may be comprised of semiconductor layers and the layers 394 may be comprised of dielectric layers such as silicon dioxide, silicon nitride, silicon oxynitride.

Figure 3B:
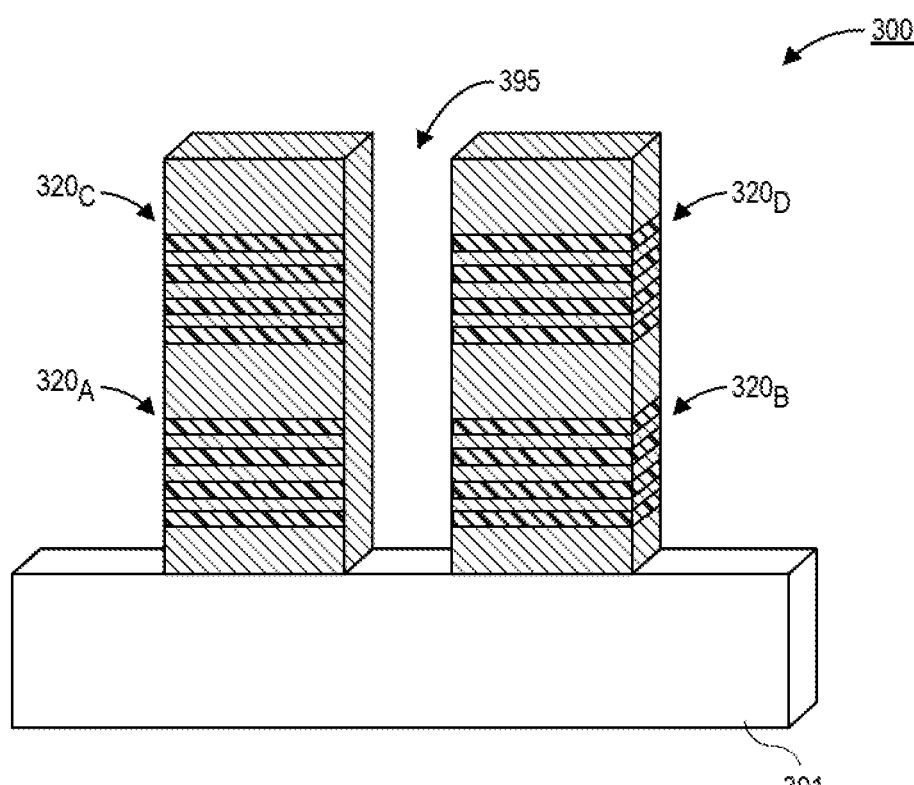

Referring now to FIG. 3B, a perspective view illustration of the semiconductor device 300 after a backbone trench 395 is formed through the first strata 391 and the second strata 392. A single lithographic operation provides a self-alignment between the portion of the backbone between the first strata 391 and the portion of the backbone between the second strata 392. In an embodiment, the backbone trench 395 may be formed with one or more etching processes. The backbone trench 395 defines the plurality of transistor devices 320 in the semiconductor device 300. A first transistor $320_A$ and a second transistor $320_B$ are in the first strata 391, and a third transistor $320_C$ and a fourth transistor $320_D$ are in the second strata 392.

Figure 3C:
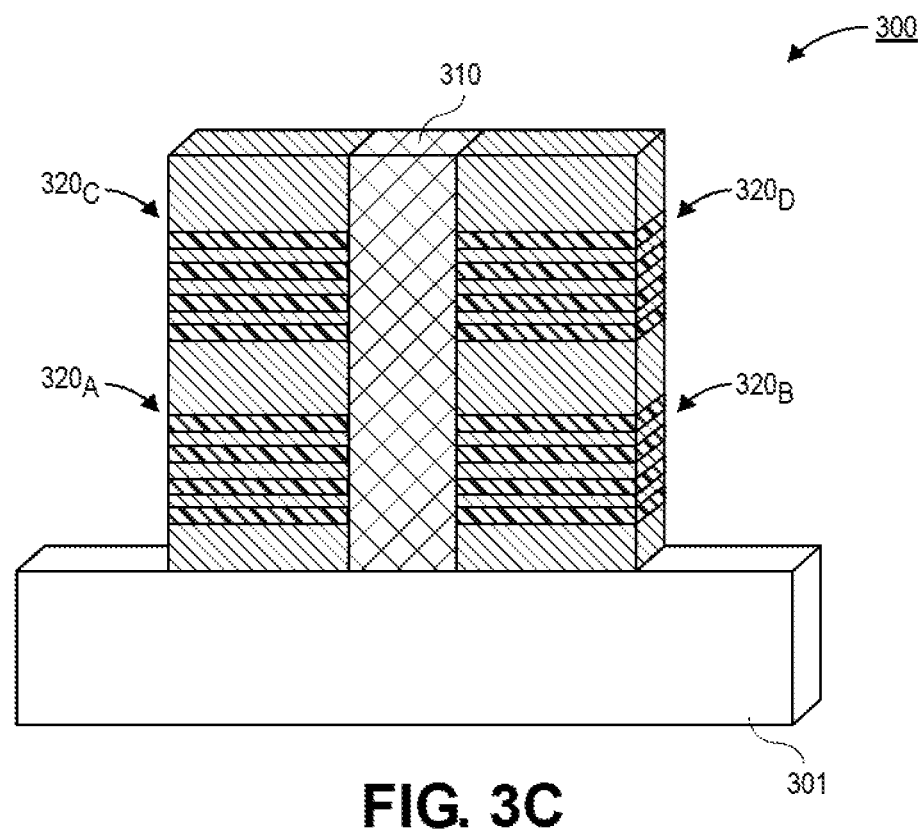

Referring now to FIG. 3C, a perspective view illustration of the semiconductor device 300 after a backbone 310 is disposed in the backbone trench 395. The backbone 310 is an insulative material. The backbone 310 may be deposited with any suitable deposition process. In some embodiments, portions of the backbone 310 outside of the backbone trench 395 may be remove with an etching process.

Figure 3D:
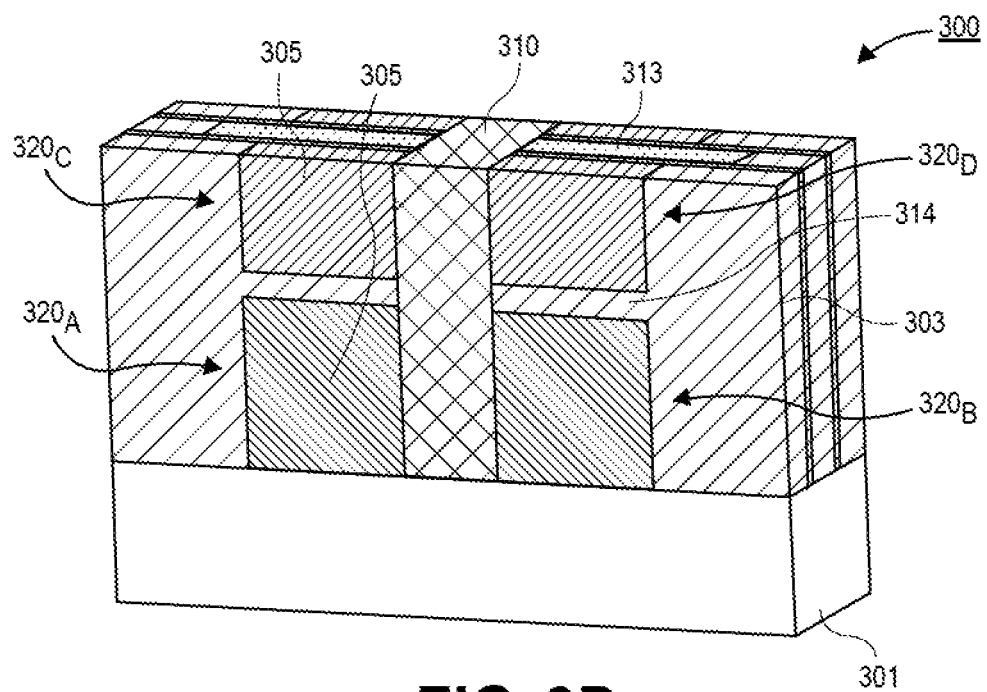

Referring now to FIG. 3D, a perspective view illustration of the semiconductor device 300 after the formation of source/drain regions 305 and the gate electrode 313 is shown, in accordance with an embodiment. The formation of the source/drain regions 305 may be implemented using standard processes. In an embodiment, a portion 314 of insulating layer 303 may separate the source/drain regions 305 in the first transistor $320_A$ from the source/drain regions 305 in the third transistor $320_C$, and the portion 314 may separate the source/drain regions 305 in the second transistor $320_B$ from the source/drain regions 305 in the fourth transistor $320_D$. Some details of the semiconductor device 300 (e.g., spacers) are omitted from FIG. 3D for simplicity.

Figure 4A:
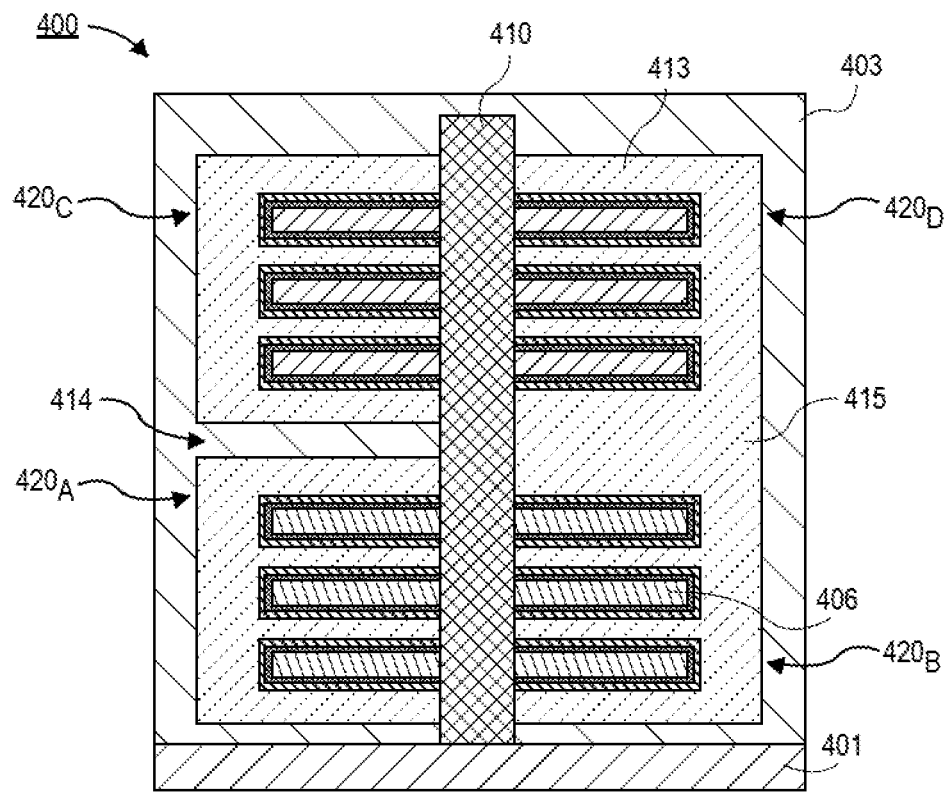
FIGS. 4A and 4B are cross-sectional illustrations of stacked forksheet transistors with an interconnect between gate electrodes of a pair of the forksheet transistors, in accordance with various embodiments.

Referring now to FIG. 4A, a cross-sectional illustration of semiconductor device 400 with stacked forksheet transistors is shown, in accordance with an embodiment. The semiconductor device 400 may comprise a backbone 410 disposed over a substrate 401. A first strata comprising a first transistor $420_A$ and a second transistor $420_B$ may be positioned below a second strata comprising a third transistor $420_C$ and a fourth transistor $420_D$. Each transistor 420 may include semiconductor channels 406. An insulating layer 403 may surround the first and second strata.

Figure 4B:
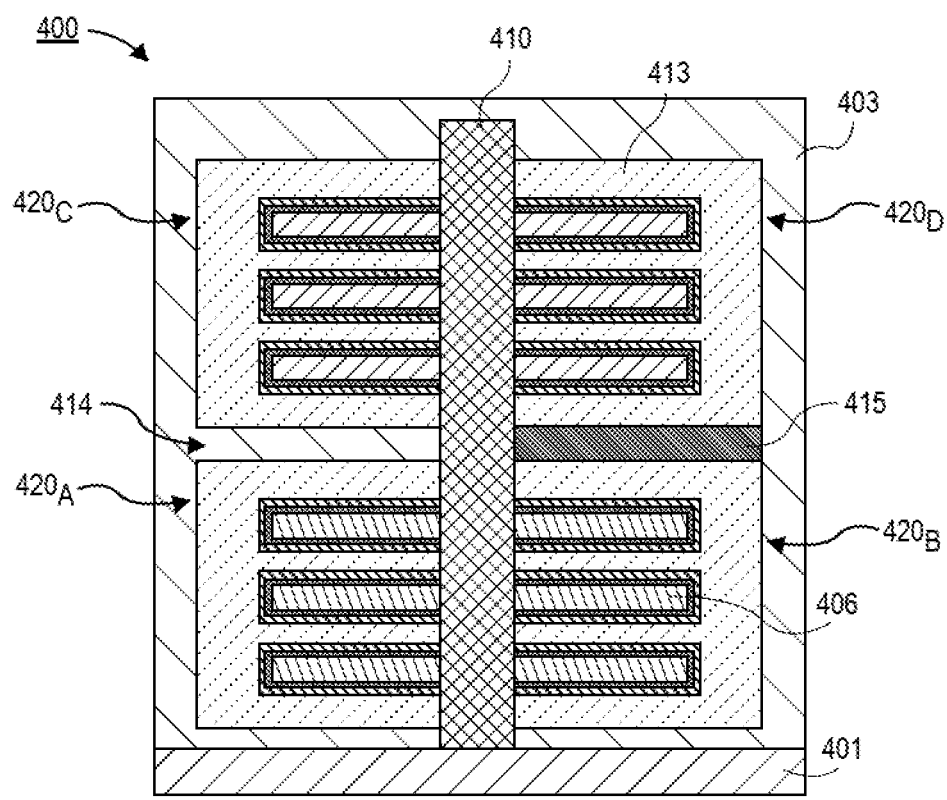

In an embodiment, the semiconductor device 400 may be substantially similar to the semiconductor device 200 in FIG. 2B, with the exception that an interconnect 415 is disposed through the insulating layer 414 between the first strata and the second strata to connect the gate electrode 413 of the second transistor $420_B$ to the gate electrode 413 of the fourth transistor $420_D$. In an embodiment, the interconnect 415 may be the same material as the gate electrode 413. However, in other embodiments, such as the embodiment illustrated in FIG. 4B, the interconnect 415 may be a different material than the material of the gate electrodes 413.

In an embodiment, gate electrode 413 of the first transistor $420_A$ may be electrically isolated from the gate electrode 413 of the third transistor $420_C$ by the insulating layer 414. Additionally, when looking globally at various locations on a semiconductor die, some forksheet transistor stacks may include interconnects 415 to connect stacked gate electrodes 413, and other forksheet transistor stacks may include no interconnect 415 between stacked gate electrodes 413. In yet another embodiment, a first interconnect 415 may be included between the gate electrode 413 of the first transistor $420_A$ and the gate electrode 413 of the third transistor $420_C$, and a second interconnect 415 may be included between the gate electrode 413 of the second transistor $420_B$ and the gate electrode 413 of the fourth transistor $420_D$. In the illustrated embodiment, a self-aligned architecture between the first strata and the second strata is shown. However, it is to be appreciated that substantially similar interconnects 415 between gate electrodes 413 may be implemented using an architecture similar to that of FIG. 2A.

Figure 5A:
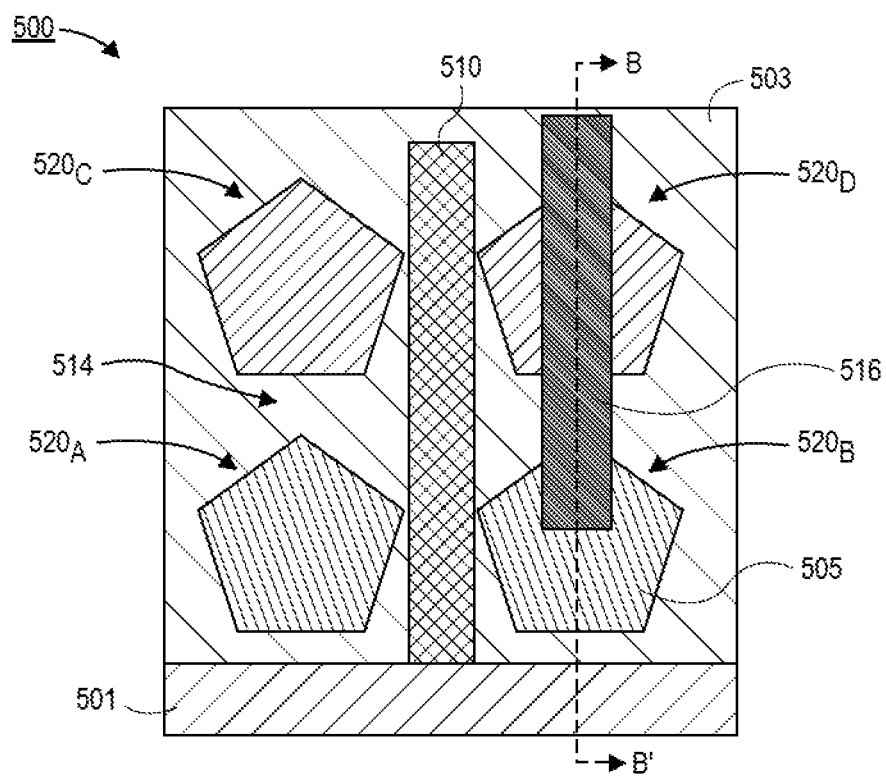
FIGS. 5A-5B are cross-sectional illustrations of stacked forksheet transistors with an interconnect between source/drain regions of a pair of the forksheet transistors, in accordance with various embodiments.

Referring now to FIG. 5A, a cross-sectional illustration of a semiconductor device 500 is shown, in accordance with an embodiment. The plane shown is perpendicular to the channel and through the source/drain regions 505. That is, a source/drain region 505 for each of the transistors $520_{A-D}$ on either side of the backbone 510 is shown. Also illustrated is a substrate 501 and an insulating layer 503 around the transistors 520.

In an embodiment, the source/drain regions 505 are arbitrarily shaped. This is due to the source/drain regions 505 being epitaxially grown from the semiconductor channels (not shown). In some embodiments, the source/drain regions 505 may contact the backbone 510. In other embodiments, the source/drain regions 505 are spaced away from the backbone 510, as shown in FIG. 5A. The source/drain regions 505 may be formed by conventional processes. For example, recesses adjacent to the gate stack are formed with an etching process. The recessing may expose ends of the semiconductor channels within the gate stack. These recesses may then be filled with a semiconductor using a selective epitaxial deposition process that grows from the ends of the semiconductor channels. In some implementations, the epitaxial semiconductor may be in-situ doped. For example, the epitaxial semiconductor may comprise in-situ doped silicon germanium, in-situ doped silicon carbide, or in-situ doped silicon. In alternate implementations, other silicon alloys may be used. For instance, alternate silicon alloy materials that may be used include, but are not limited to, nickel silicide, titanium silicide, cobalt silicide, and possibly may be doped with one or more of boron and/or aluminum.

In an embodiment, an interconnect 516 may be provided to electrically couple source/drain regions 505 in different strata of the semiconductor device 500. For example, an interconnect 516 provides an electrical connection between the source/drain region 505 of the fourth transistor $520_D$ and the second transistor $520_B$. The interconnect 516 may pass through an insulating layer 514 between the strata. In an embodiment, the interconnect 516 may be formed with any suitable process. For example, a trench may be etched into the source/drain regions 505 and filled with a conductive material. In the illustrated embodiment, the interconnect 516 passes completely through the source/drain region 505 of the fourth transistor $520_D$ and into (but not through) the source/drain region 505 of the second transistor $520_B$.

In an embodiment, source/drain region 505 of the first transistor $520_A$ may be electrically isolated from the source/drain region 505 of the third transistor $520_C$ by the insulating layer 514. Additionally, when looking globally at various locations on a semiconductor die, some forksheet transistor stacks may include interconnects 516 to connect stacked source/drain regions 505, and other forksheet transistor stacks may include no interconnect 516 between stacked source/drain regions 505. In yet another embodiment, a first interconnect 516 may be included between the source/drain region 505 of the first transistor $520_A$ and the source/drain region 505 of the third transistor $520_C$, and a second interconnect 516 may be included between the source/drain region 505 of the second transistor $520_B$ and the source/drain region 505 of the fourth transistor $520_D$. In the illustrated embodiment, a self-aligned architecture between the first strata and the second strata is shown. However, it is to be appreciated that substantially similar interconnects between source/drain regions 505 may be implemented using an architecture similar to that of FIG. 2A.

Figure 5B:
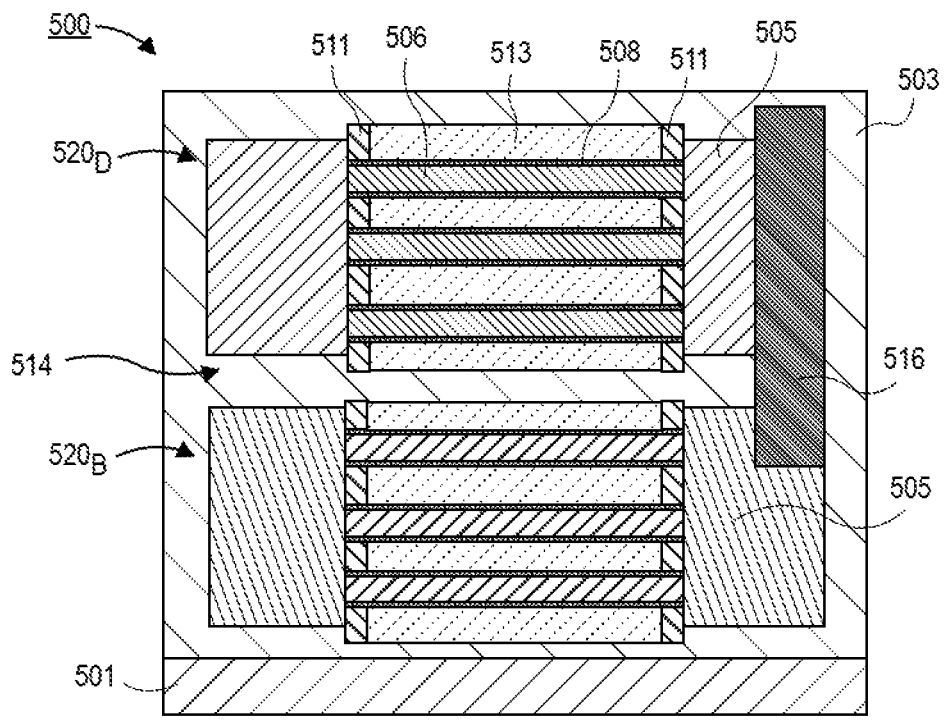

Referring now to FIG. 5B, a cross-sectional illustration of the semiconductor device 500 in FIG. $5_A$ along line B-B' is shown, in accordance with an embodiment. The plane of FIG. 5B is parallel to the semiconductor channels 506. As shown, a pair of source/drain regions 505 are on opposite ends of the semiconductor channels 506 for each transistor 520. In an embodiment, spacers 511 may define a channel region. The channel region may comprise a gate dielectric 508 surrounding the semiconductor channels 506 and a gate electrode 513 surrounding the gate dielectric 508. The workfunction metal between the gate electrode 513 and the gate dielectric 508 is omitted for simplicity.

As shown, the interconnect 516 extends through the source/drain region 505 of the fourth transistor $520_D$ and into the source/drain region 505 of the second transistor $520_B$. The interconnect 516 may be aligned with an edge of the source/drain regions 505. In other embodiments, the interconnect 516 may be entirely within a width of the source/drain regions 505.

Figure 5C:
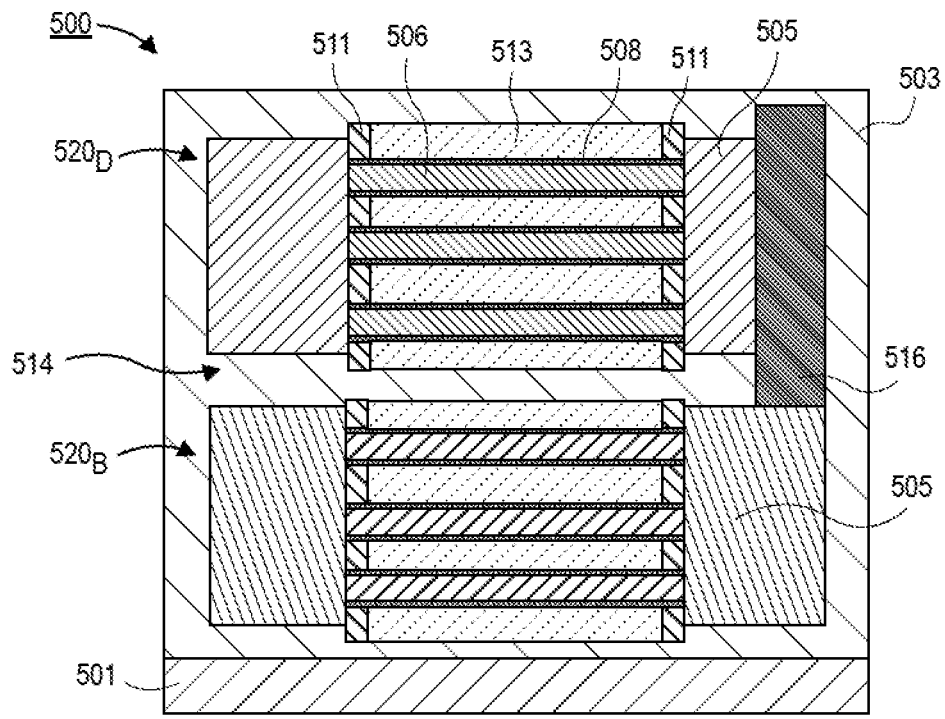

Referring now to FIG. 5C, a cross-sectional illustration of a semiconductor device 500 is shown, in accordance with an additional embodiment. The semiconductor device 500 in FIG. 5C is substantially similar to the semiconductor device 500 in FIG. 5B, with the exception that the interconnect 516 does not pass into the source/drain region 505 of the second transistor $520_B$. Instead, the interconnect 516 lands on a top surface of the source/drain region 505 of the second transistor $520_B$.

Figure 5D:
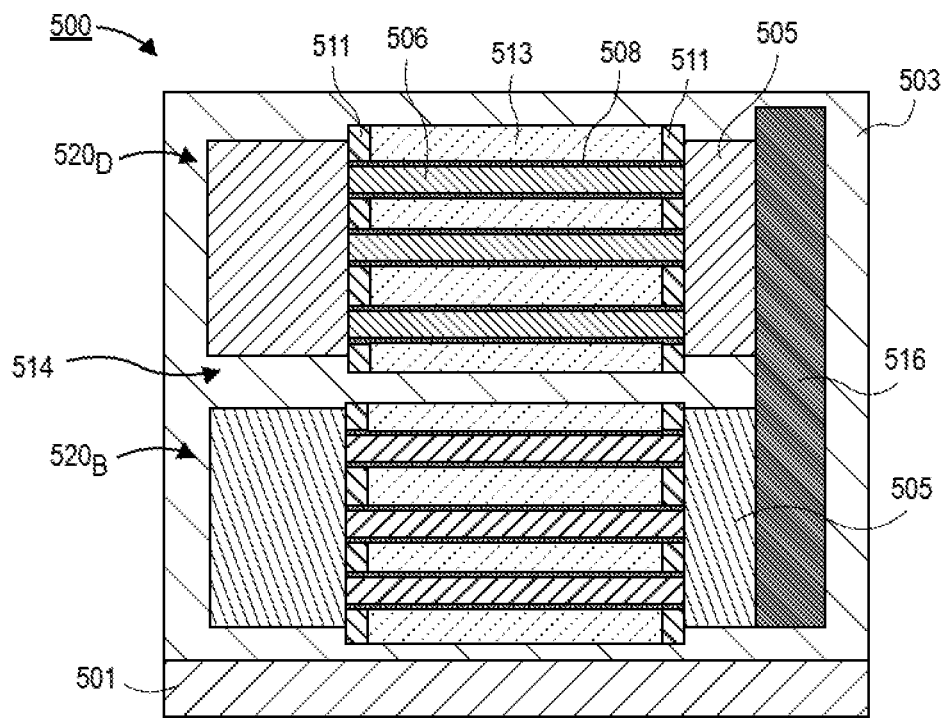

Referring now to FIG. 5D, a cross-sectional illustration of a semiconductor device 500 is shown, in accordance with another embodiment. The semiconductor device 500 in FIG. 5D is substantially similar to the semiconductor device 500 in FIG. 5B, with the exception that the interconnect 516 passes entirely through the source/drain region 505 of the second transistor $520_B$.

Figure 5E:
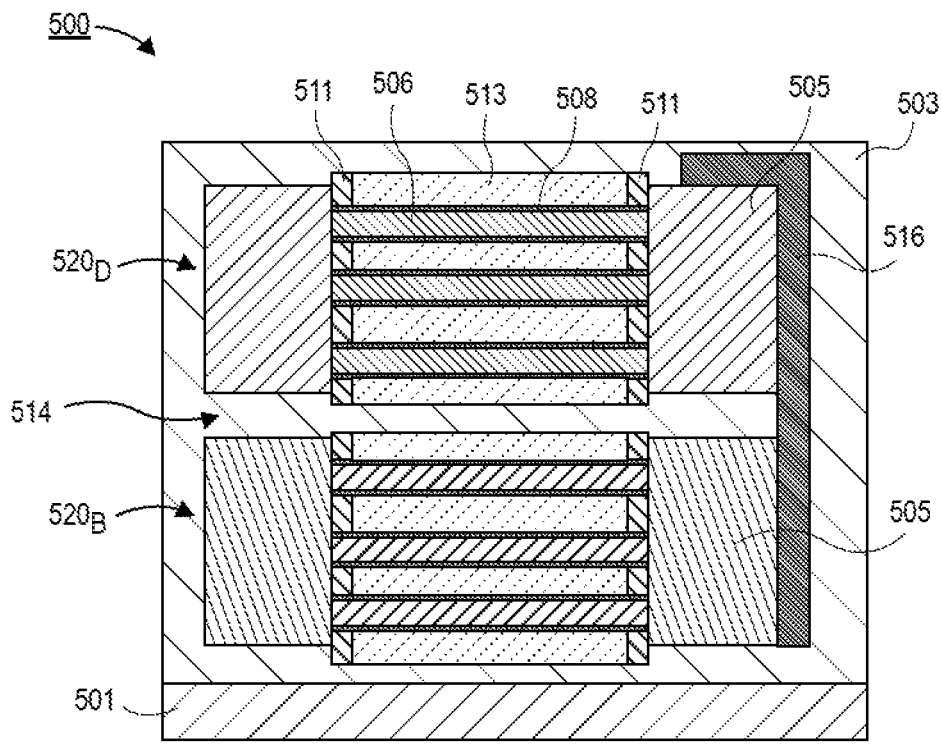

Referring now to FIG. 5E, a cross-sectional illustration of a semiconductor device 500 is shown, in accordance with yet another embodiment. The semiconductor device 500 in FIG. 5B is substantially similar to the semiconductor device 500 in FIG. 5B, with the exception that the interconnect 516 does not pass into either of the source/drain regions 505. Instead, the interconnect 516 wraps around one or more outer surfaces of one or both of the source/drain regions 505 of the fourth transistor $520_D$ and the second transistor $520_B$.

In FIGS. 4A-5E, examples of either gate electrode 413 interconnects 415 between strata (e.g., FIGS. 4A and 4B) or source/drain region 505 interconnects 516 between strata (e.g., FIGS. 5A-5E) are shown. However, it is to be appreciated that in some embodiments, a semiconductor device with stacked forksheet transistors may include both a source/drain region interconnect 516 and a gate electrode interconnect 415 between the strata.

In addition to providing interconnections between stacked strata of semiconductor device, embodiments also include providing interconnects to contacts below the forksheet transistors. In this way, the buried forksheet transistors (i.e., the first strata of transistors) can be contacted without having to pass through the overlying transistors. Examples of such configurations are provided in FIGS. 6 and 7.

Figure 6:
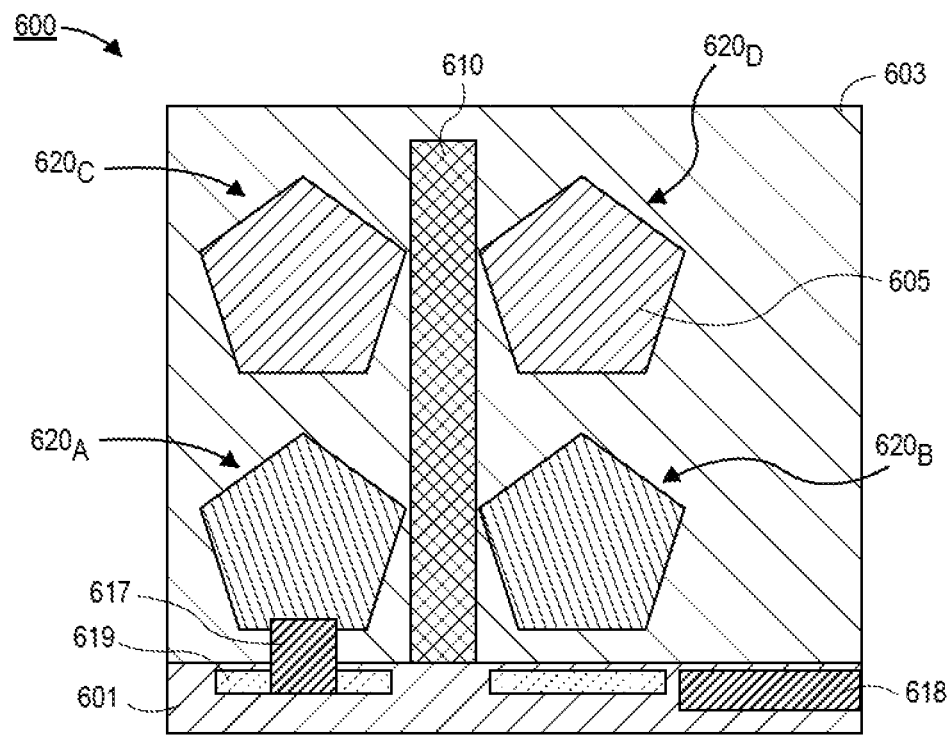
FIG. 6 is a cross-sectional illustration of stacked forksheet transistors with an interconnect to a source/drain region from a bottom contact, in accordance with an embodiment.

Referring now to FIG. 6, a cross-sectional illustration of a semiconductor device 600 is shown, in accordance with an embodiment. In an embodiment, the semiconductor device 600 may comprise a substrate 601 and forksheet transistors $620_{A-D}$ over the substrate 601. A backbone 610 may separate the first transistor $620_A$ from the second transistor $620_B$ and separate the third transistor $620_C$ from the fourth transistor $620_D$. The plane of the cross-section is through the source/drain regions 605 of the transistors 620. In an embodiment, an insulating layer 603 may surround the transistors 620.

In an embodiment, conductive features may be provided in the substrate 601. For example, a buried line 618 may be positioned adjacent to the stacked transistors 620. Conductive pads 619 may be located below the stacked transistors 620 and connected to the buried line 618 (out of the plane of FIG. 6). In an embodiment, an interconnect 617 may extend from the pad 619 to a source/drain region 605 of the first transistor $620_A$. In other embodiments, both the first transistor $620_A$ and the second transistor $620_B$ may be connected to underlying pads 619 by interconnects 617. It is to be appreciated that the architecture of the conductive features in FIG. 6 is exemplary in nature, and that any backside interconnect architecture may be used to contact the source/drain regions 605 of the transistors 620$_A$ and 620$_B$. For example, the backside interconnect architecture may include any number of layers of routing, vias, pads, and the like.

Figure 7:
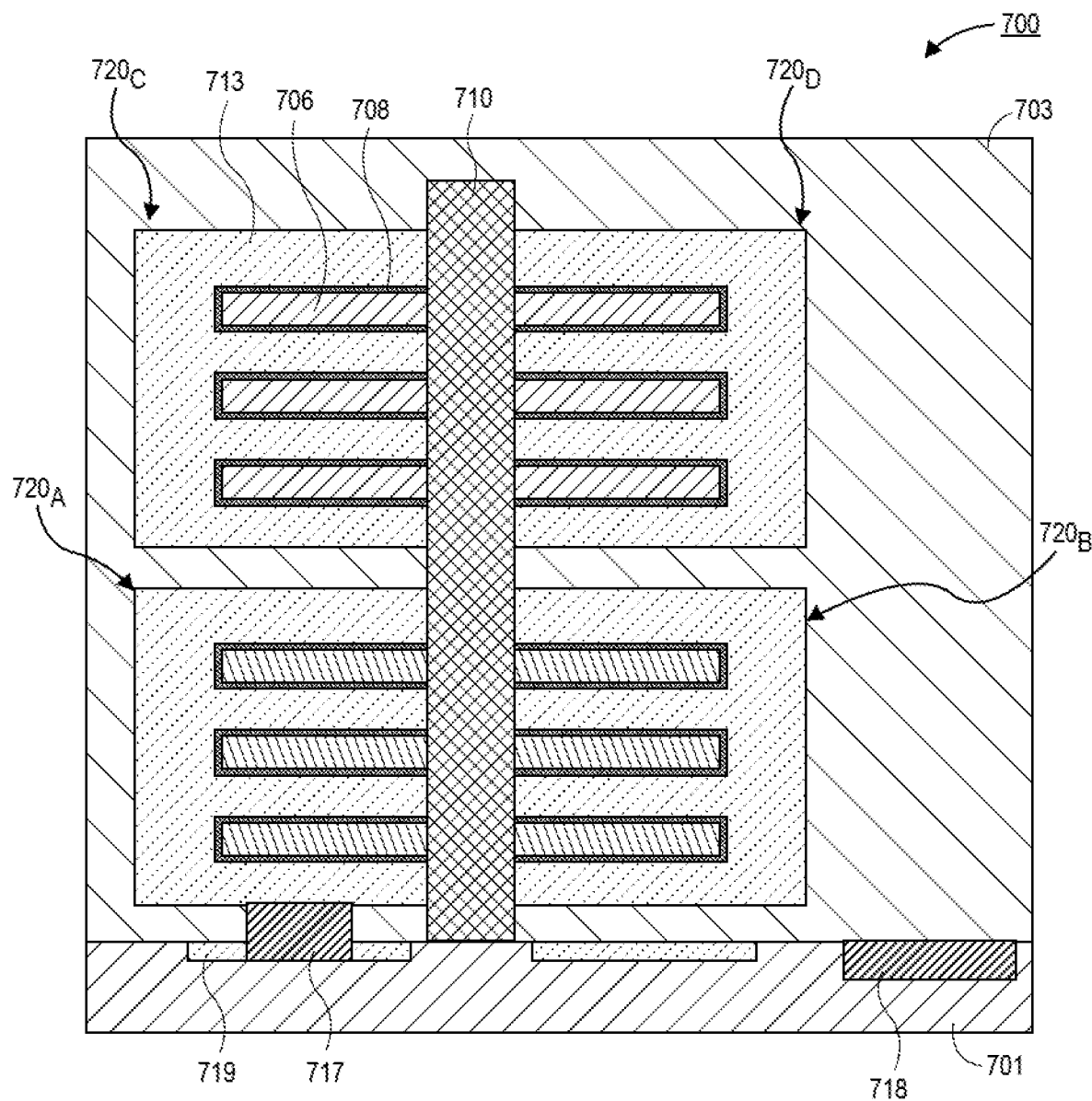
FIG. 7 is a cross-sectional illustration of stacked forksheet transistors with an interconnect to a gate electrode from a bottom contact, in accordance with an embodiment.

Referring now to FIG. 7, a cross-sectional illustration of a semiconductor device 700 is shown, in accordance with an embodiment. The illustrated plane in FIG. 7 is through the channel region. As shown, the semiconductor device 700 includes a substrate 701 and a plurality of stacked forksheet transistors 720$_{A-D}$. Each of the transistors 720 comprise semiconductor channels 706 that extend away from the backbone 710. A gate stack including a gate electrode 713 and a gate dielectric 708 surround portions of the semiconductor channels 706. An insulating layer 703 surrounds the transistors 720.

In an embodiment, conductive features may be provided in the substrate 701. For example, a buried line 718 may be positioned adjacent to the stacked transistors 720. Conductive pads 719 may be located below the stacked transistors 720 and connected to the buried line 718 (out of the plane of FIG. 7). In an embodiment, an interconnect 717 may extend from the pad 719 to a gate electrode 713 of the first transistor 720$_A$. In other embodiments, both the first transistor 720$_A$ and the second transistor 720$_B$ may be connected to underlying pads 719 by interconnects 717. It is to be appreciated that the architecture of the conductive features in FIG. 7 is exemplary in nature, and that any backside interconnect architecture may be used to contact the gate electrodes 713 of the transistors 720$_A$ and 720$_B$. For example, the backside interconnect architecture may include any number of layers of routing, vias, pads, and the like.

As noted above, existing forksheet transistors are not true GAA devices. This is because the semiconductor channels are in direct contact with the surface of the backbone. Therefore, the surface contacting the backbone cannot be gated. Accordingly, embodiments disclosed herein include forksheet transistor architectures that allow for true GAA control of the semiconductor channels.

Figure 8A:
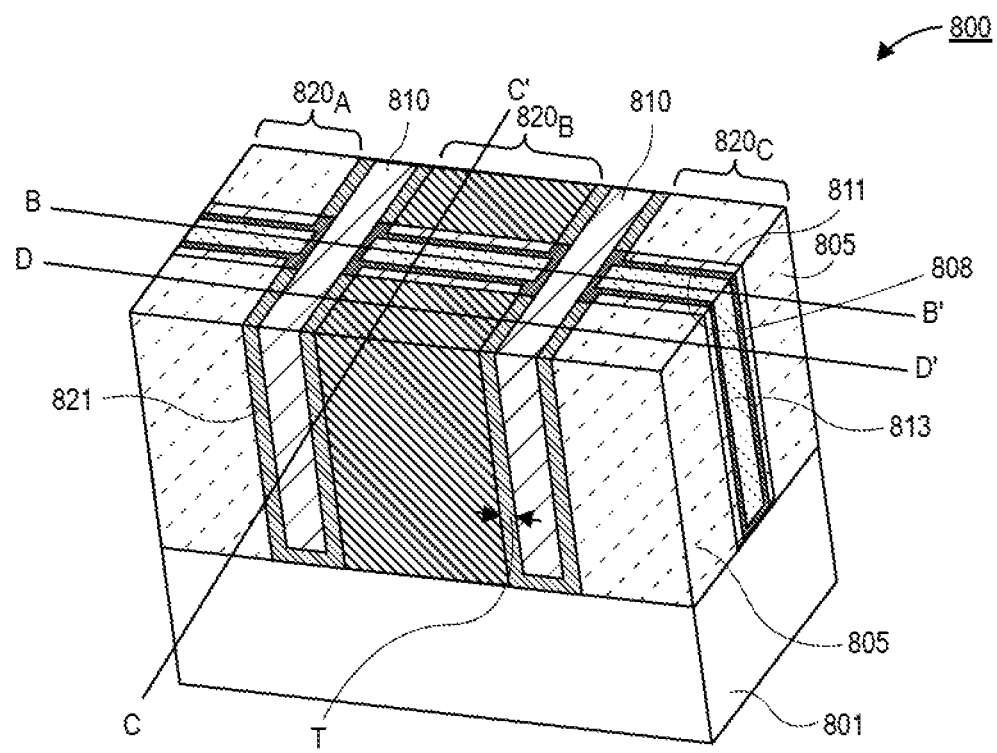
FIG. 8A is a perspective view illustration of forksheet transistors with backbones that comprise a liner, in accordance with an embodiment.

Referring now to FIG. 8A, a perspective view illustration of a semiconductor device 800 is shown, in accordance with an embodiment. The semiconductor device 800 illustrated in FIG. 8A comprises a first transistor 820$_A$, a second transistor 820$_B$, and a third transistor 820$_C$. The first transistor 820$_A$ is separated from the second transistor 820$_B$ by a backbone 810, and the second transistor 820$_B$ is separated from the third transistor 820$_C$ by a backbone 810. In an embodiment, the first transistor 820$_A$ and the third transistor 820$_C$ are a first conductivity type (e.g., P-type), and the second transistor 820$_B$ is a second conductivity type (e.g., N-type). In an embodiment, the transistors 820 are disposed over a substrate 801.

As shown in FIG. 8A, each transistor 820 comprises a pair of source/drain regions 805 that are separated from each other by a gate electrode 813. The gate electrode 813 may be separated from the source/drain regions 805 by a spacer 811, as is known to those skilled in the art. Portions of the gate dielectric 808 are also visible between the spacer 811 and the gate electrode 813.

A liner 821 is provide around portions of the backbones 810 in order to provide the GAA architecture. The liner 821 is visible adjacent to the source/drain regions 805. However, portions of the liner 821 are removed from the channel region (i.e., along the gate electrode 813). The liner 821 has a thickness T. In some embodiments, the thickness T may be approximately 3 nm or greater, or between approximately 3 nm and 6 nm.

Figure 8B:
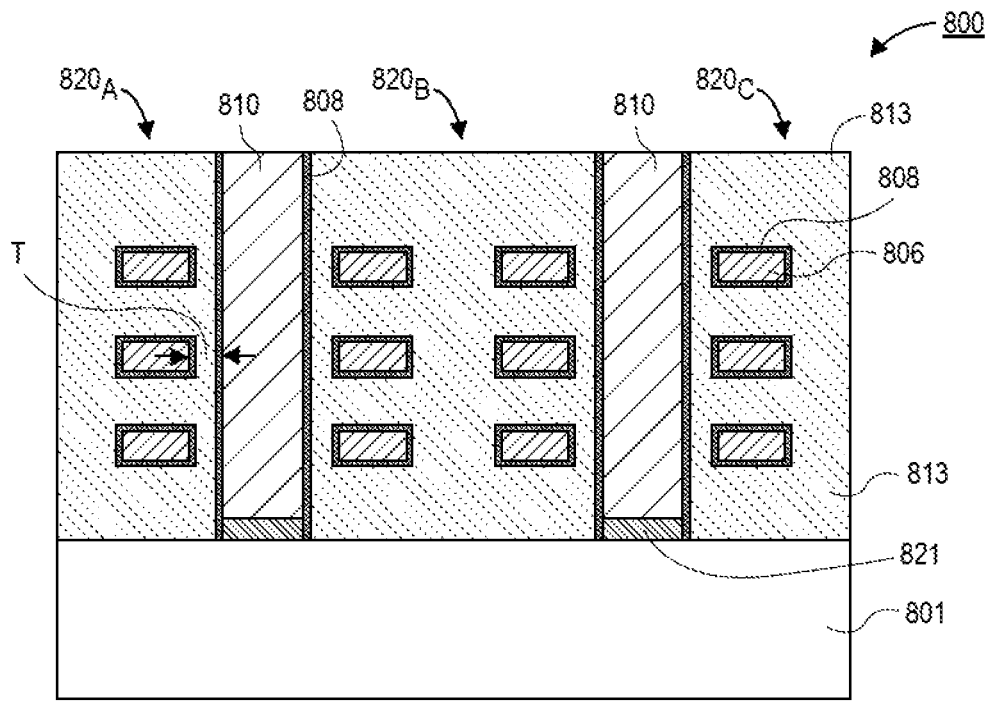
FIGS. 8B-8D are cross-sectional illustrations of the forksheet transistors in FIG. 8A along different planes, in accordance with an embodiment.

Referring now to FIG. 8B, a cross-sectional illustration of the semiconductor device 800 of FIG. 8A along line B-B' is shown, in accordance with an embodiment. As shown, each of the semiconductor channels 806 has a perimeter that is completely surrounded by the gate dielectric 808 and the gate electrode 813. A workfunction metal (not shown) is also over the gate dielectric 808. The ability to provide such a GAA architecture is provided by the removal of the liner 821 from the channel region. Removing the liner 821 leaves a spacing T between an edge of the semiconductor channel 806 and the backbone 810 that is equal to the thickness T of the liner 821. The space T is sufficient to allow for the deposition of the gate dielectric 808 and the workfunction metal between the edge of the semiconductor channel 806 and the edge of the backbone 810. In some embodiments, portions of the gate dielectric 808 may also be deposited along sidewalls of the backbone 810 during a conformal deposition process.

In an embodiment, the entirety of the liner 821 is not removed from the channel region. For example, a remnant of the liner 821 may be present along a bottom surface of the backbone 810. That is, the backbone 810 may be separated from the substrate 801 by the liner 821.

Figure 8C:
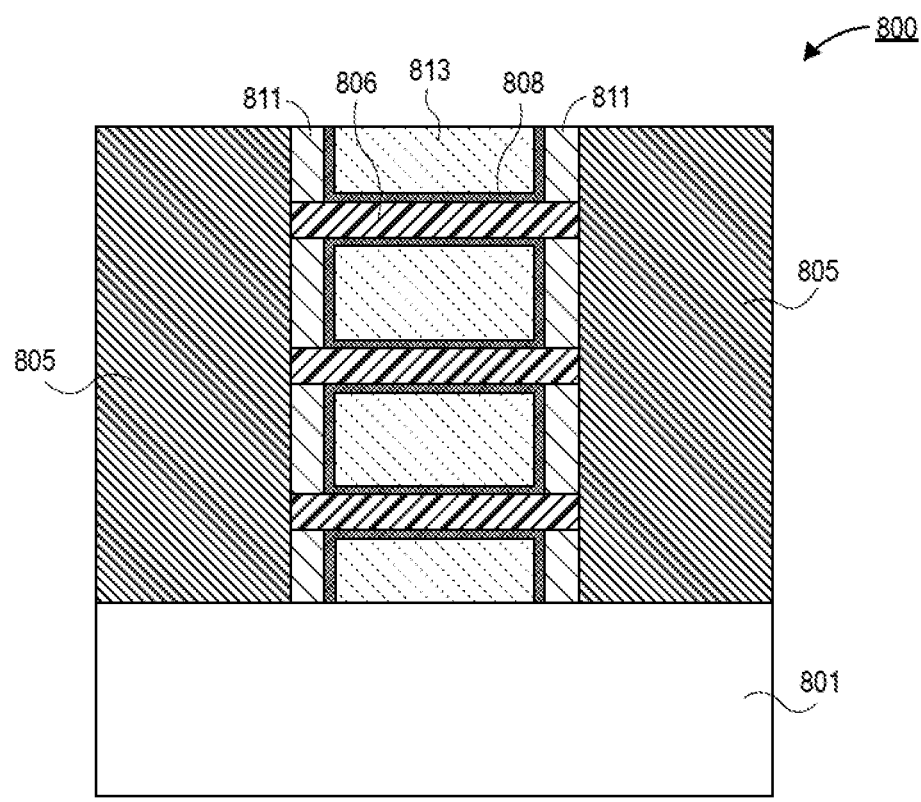

Referring now to FIG. 8C, a cross-sectional illustration of the semiconductor device 800 in FIG. 8A along line C-C' is shown, in accordance with an embodiment. As shown, the semiconductor channels 806 pass through the spacers 811 to contact the source/drain regions 805. The gate dielectric 808 may cover the surfaces of the channel region within the spacers 811. A portion of the gate dielectric 808 may also be disposed over the interior surfaces of the spacers 811.

Figure 8D:
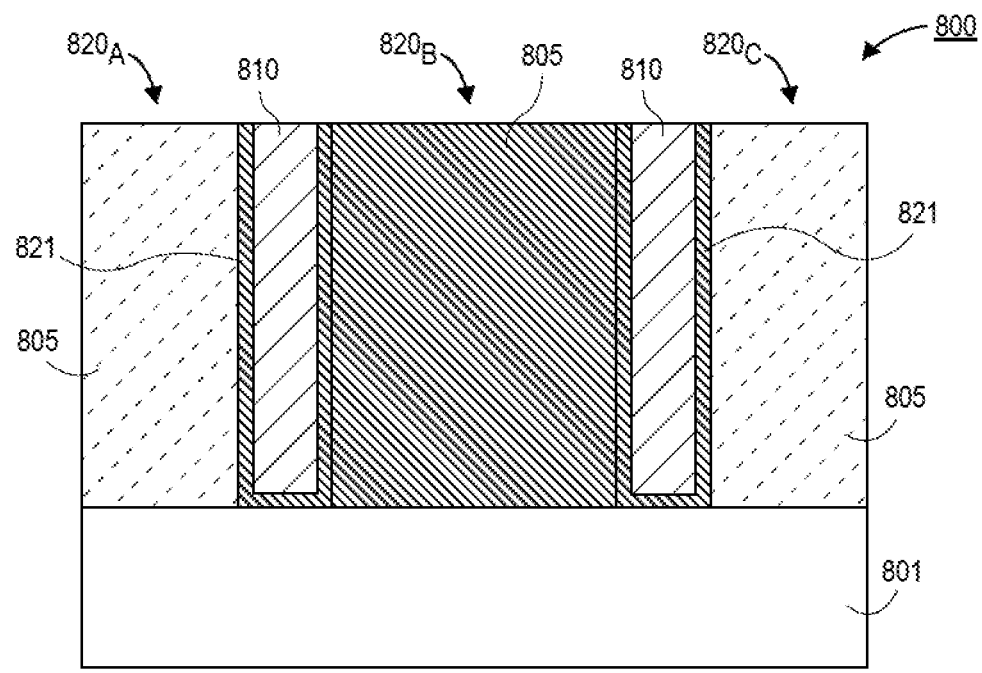

Referring now to FIG. 8D, a cross-sectional illustration of the semiconductor device 800 in FIG. 8A along line D-D' is shown, in accordance with an embodiment. This cross-sectional plane clearly illustrates portions of the liner 821. As shown, the portions of the liner 821 may wrap around the bottom and sidewalls of the backbone 810 adjacent to the source/drain regions 805. That is, the liner 821 may have a substantially U-shaped cross-section in some embodiments. In other embodiments, the liner 821 may be removed from only the region adjacent to substrate material 801 through a dry etch or similar process resulting in a backbone material 810 which is no longer separated from the substrate 801.

Figure 9A:
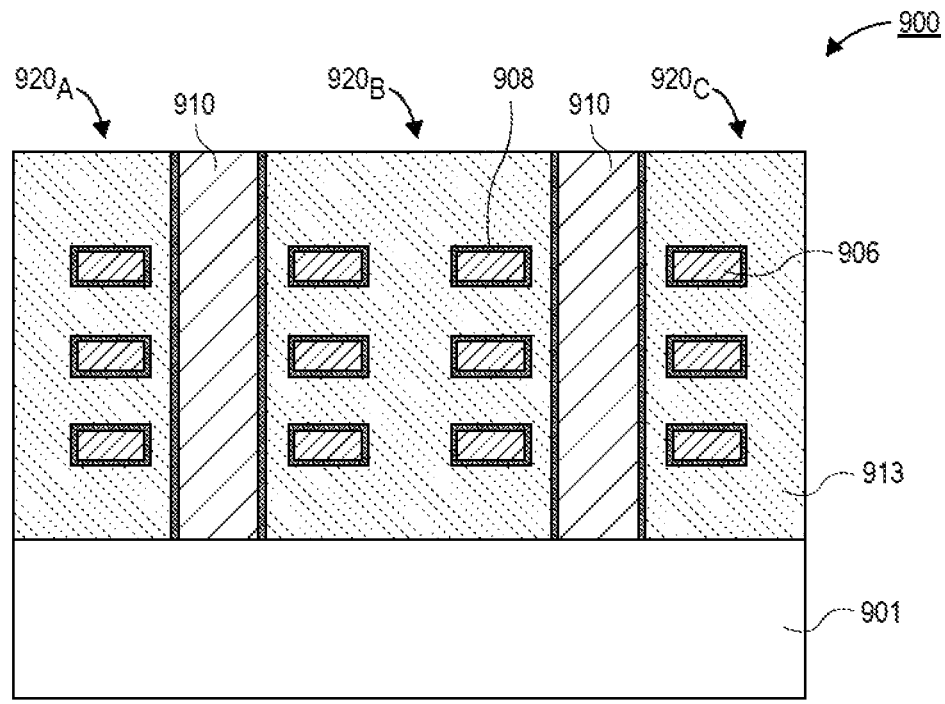
FIGS. 9A and 9B are cross-sectional illustrations of the forksheet transistors in FIG. 8A, in accordance with an additional embodiment.
Figure 9B:
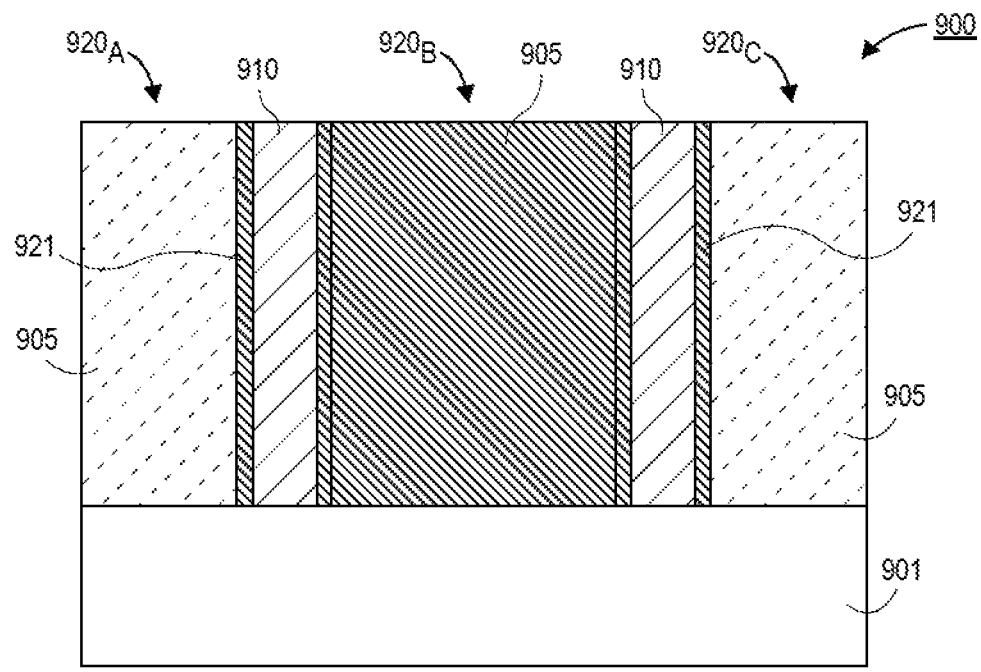

Referring now to FIGS. 9A and 9B, cross-sectional illustrations of a semiconductor device 900 are shown, in accordance with an additional embodiment. The semiconductor device 900 may comprise a substrate 901 and a plurality of forksheet transistors 920$_{A-C}$ over the substrate 901. The transistors 920 may comprise semiconductor channels 906 completely surrounded by a gate dielectric 908 and a gate electrode 913 (FIG. 9A). The transistors 920 may also comprise source/drain regions 905 (FIG. 9B).

The semiconductor device 900 in FIGS. 9A and 9B may be substantially similar to the semiconductor device 800 in FIGS. 8A-8D. Particularly, the cross-section in FIG. 9A is similar to the cross-section in FIG. 8B, and the cross-section in FIG. 9B is similar to the cross-section in FIG. 8D. The difference between semiconductor device 900 and semiconductor device 800 is that the liner 921 is removed from the bottom surfaces of the backbone 910. As shown in FIG. 9A, there is no remnant of the liner 921 in the channel region. Similarly, the bottom portion of the liner 921 between the backbone 910 and the substrate 901 is removed in FIG. 9$_B$. As such, the liner 921 is no longer substantially U-shaped, and instead includes a pair of discrete layers on either sidewall of the backbone 910.

Referring now to FIGS. 10A-10L, a series of illustrations depict a process for forming semiconductor devices with forksheet transistors that comprise GAA architectures using a liner is shown, in accordance with an embodiment.

Figure 10A:
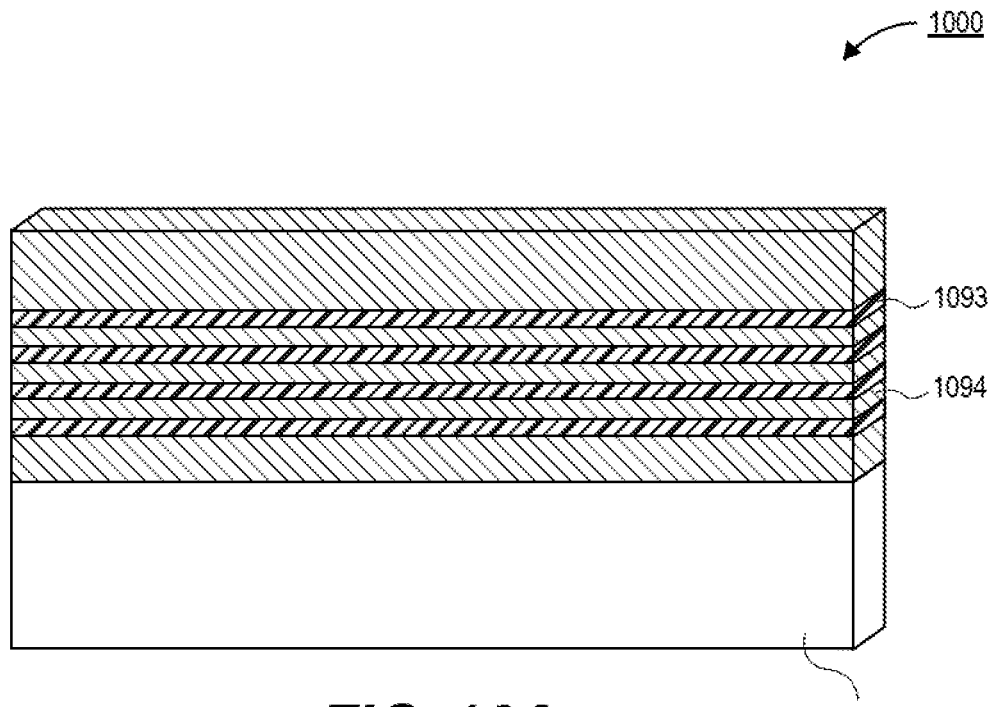
FIGS. 10A-10L are cross-sectional illustrations depicting a process for fabricating forksheet transistors with liners along the backbones, in accordance with an embodiment.

Referring now to FIG. 10A, a perspective view illustration of a semiconductor device 1000 is shown, in accordance with an embodiment. In an embodiment, the semiconductor device 1000 comprises a substrate 1001 and a plurality of layers 1093, 1094 over the substrate 1001. In an embodiment, the layers 1093, 1094 are patterned into a fin. The layers 1093 may be a semiconductor material that will be used for the channels of the semiconductor device 1000, and the layers 1094 may be sacrificial layers. For example, layers 1093 may be silicon, and layers 1094 may be silicon germanium.

Figure 10B:
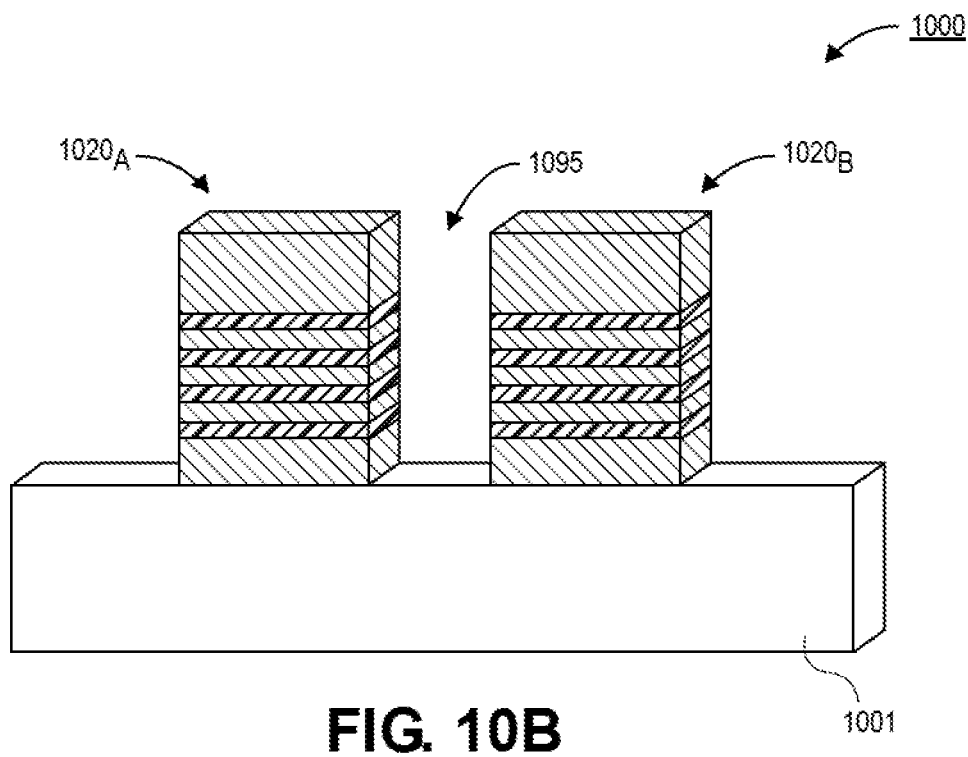

Referring now to FIG. 10B, a perspective view illustration of the semiconductor device 1000 after a backbone trench 1095 is patterned into the layers 1093, 1094. The backbone trench 1095 may define a first transistor $1020_A$ and a second transistor $1020_B$. The backbone trench 1095 may be patterned with any suitable etching process or processes.

Figure 10C:
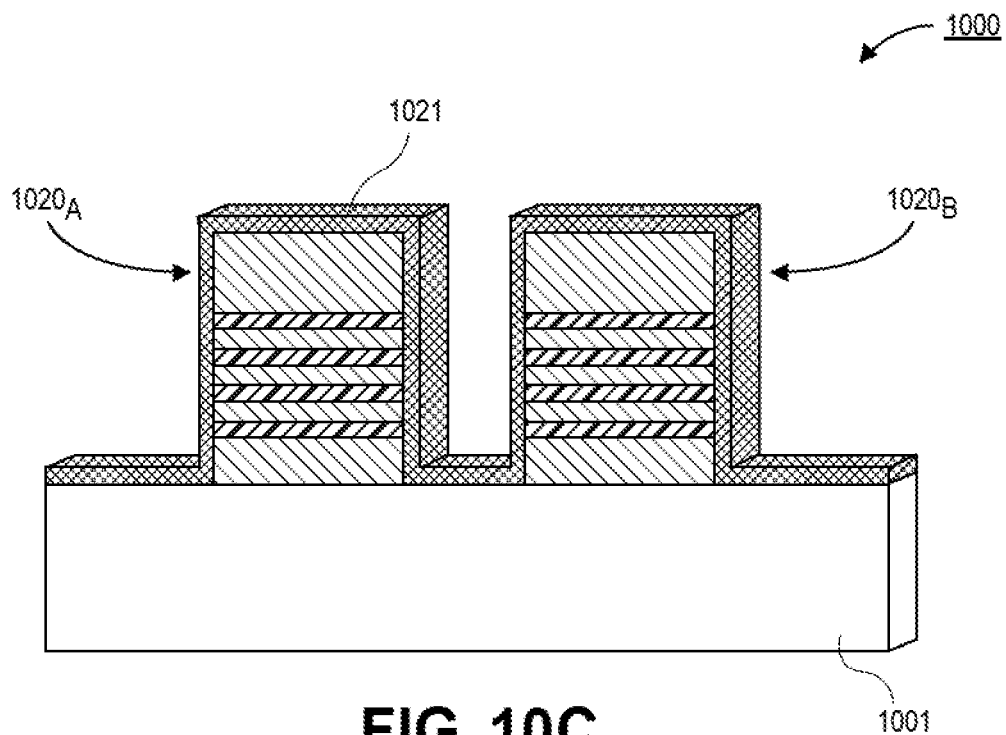

Referring now to FIG. 10C, a perspective view illustration of the semiconductor device 1000 after a backbone liner 1021 is disposed over exposed surfaces is shown, in accordance with an embodiment. In an embodiment, the backbone liner 1021 may be disposed with a conformal deposition process, so that the backbone liner 1021 lines sidewall surfaces of the first transistor $1020_A$ and the second transistor $1020_B$. In some embodiments, the planar surfaces of the backbone liner 1021 (e.g., over the substrate 1001 and over the top surfaces of the transistors 1020 may be etched away, leaving behind the backbone liner 1021 only over vertical surfaces. Such an etching process may be used to form a device similar to those described with respect to FIGS. 9A and 9B.

Figure 10D:
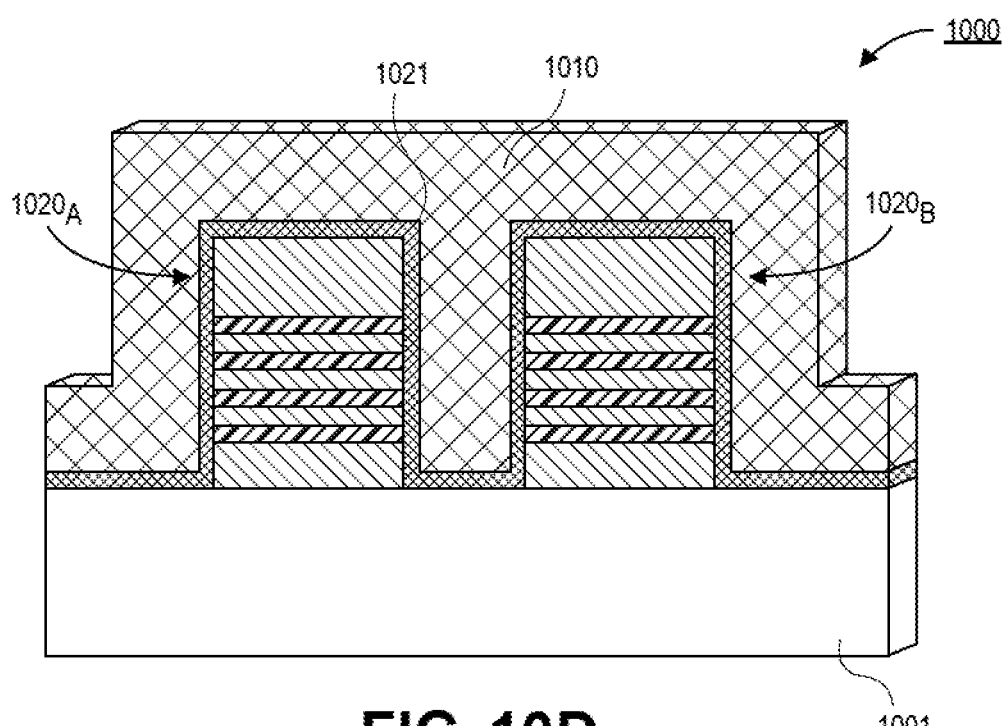

Referring now to FIG. 10D, a perspective view illustration of the semiconductor device 1000 after a backbone 1010 is disposed over the backbone liner 1021 is shown, in accordance with an embodiment. The backbone 1010 may be an insulative material that is etch selective to the backbone liner 1021.

Figure 10E:
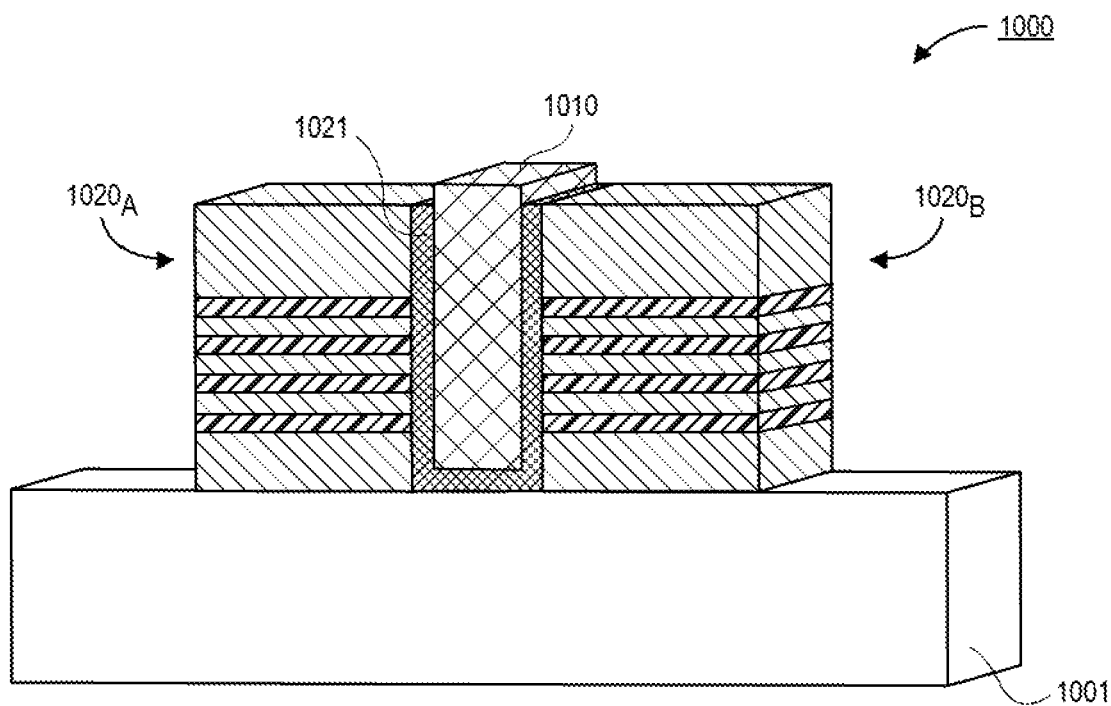

Referring now to FIG. 10E, a perspective view illustration of the semiconductor device 1000 after portions of the backbone 1010 and the backbone liner 1021 outside of the backbone trench 1095 are removed is shown, in accordance with an embodiment. The portions outside of the backbone trench 1095 may be removed with an etching process with a mask layer (not shown) protecting the backbone trench 1095.

Figure 10F:
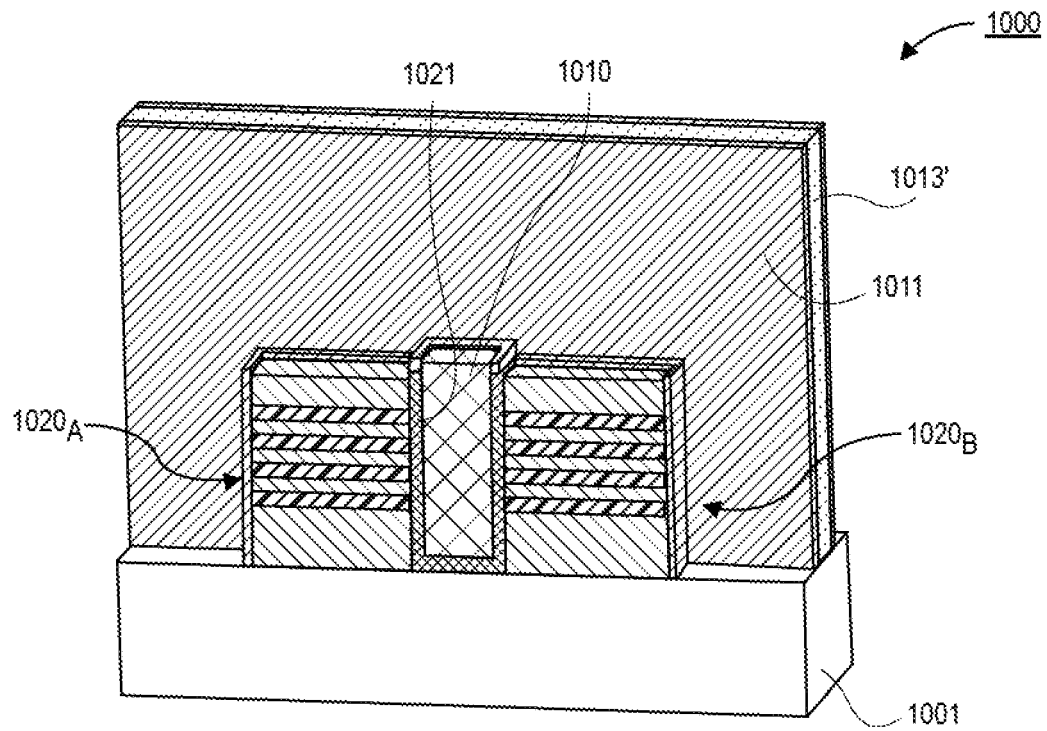

Referring now to FIG. 10F, a perspective view illustration of the semiconductor device 1000 after a gate structure is disposed over the transistors 1020 is shown, in accordance with an embodiment. The gate structure may comprise a dummy gate electrode 1013' with spacers 1011 on either side. The gate structure may cross over a top surface of the backbone 1010.

Figure 10G:
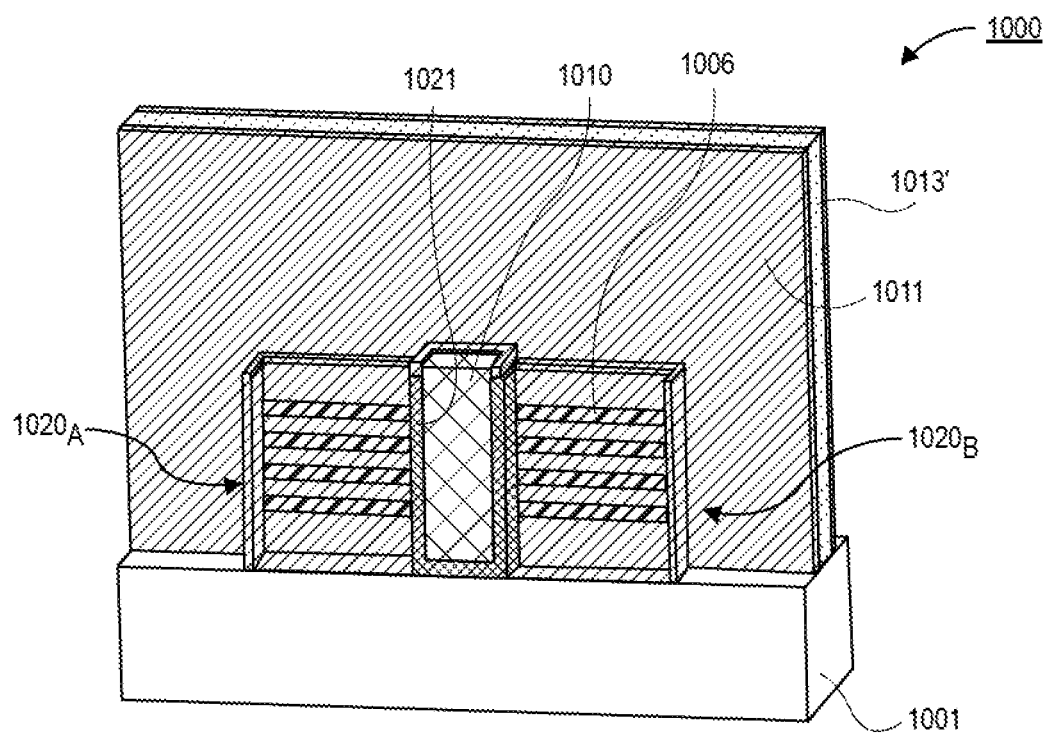

Referring now to FIG. 10G, a perspective view illustration of the semiconductor device 1000 after source/drain recesses are made is shown, in accordance with an embodiment. In an embodiment, the recesses are made by removing portions of the layers 1093, 1094 outside of the spacers 1011. Surfaces of the semiconductor channels 1006 that pass through the spacers 1011 are visible in FIG. 10G.

Figure 10H:
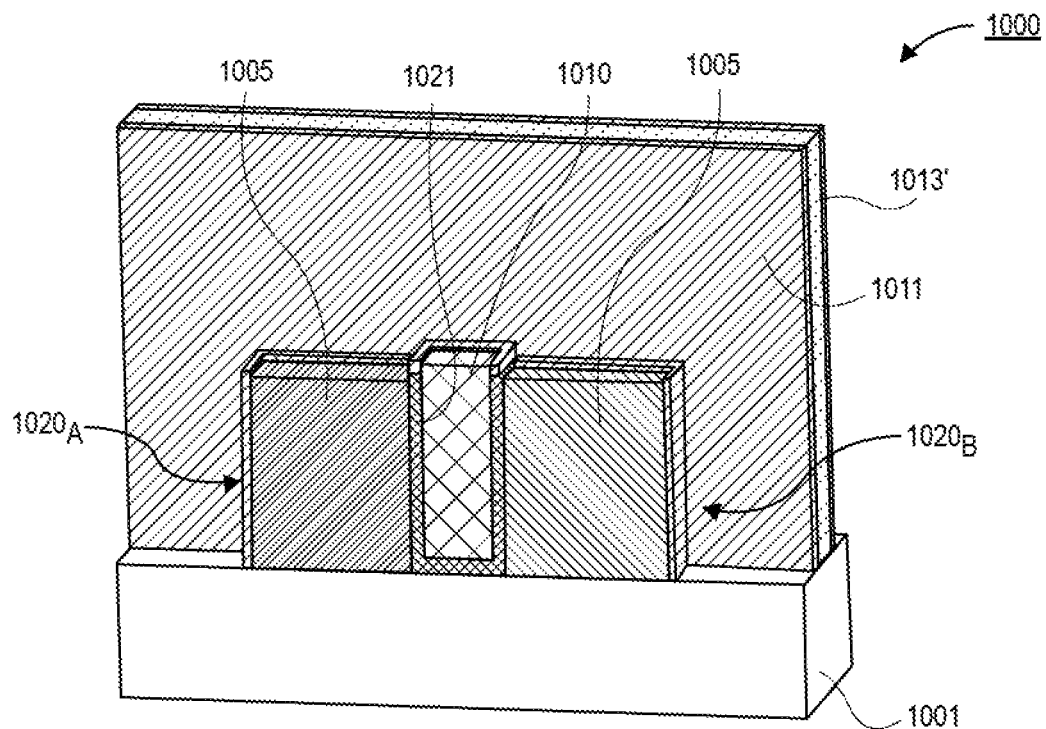

Referring now to FIG. 10H, a perspective view illustration of the semiconductor device 1000 after source/drain regions 1005 are formed is shown, in accordance with an embodiment. In an embodiment, the source/drain regions 1005 may be grown with an epitaxial growth process.

Figure 10I:
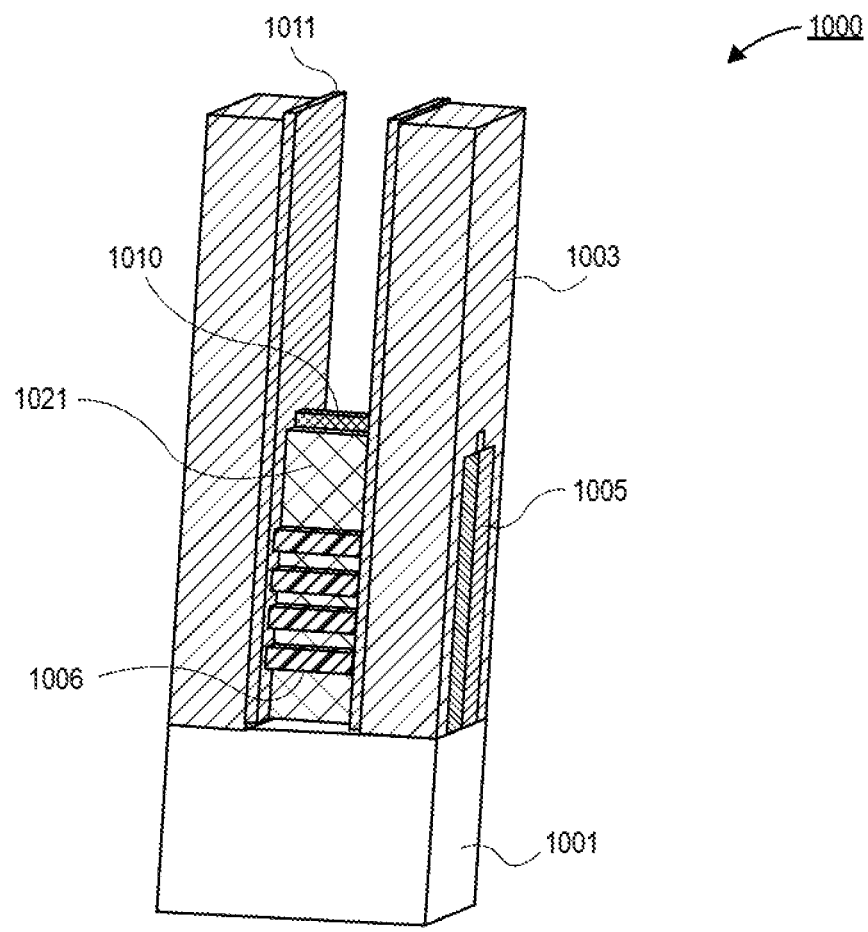

Referring now to FIG. 10I, a perspective view illustration of a portion of the semiconductor device 1000 after the dummy gate electrode 1013' is removed is shown, in accordance with an embodiment. In an embodiment, an insulative layer 1003 may be disposed over the source/drain regions 1005. As shown, removal of the dummy gate electrode 1013' exposes the semiconductor channels 1006, the backbone liner 1021, and the backbone 1010.

Figure 10J:
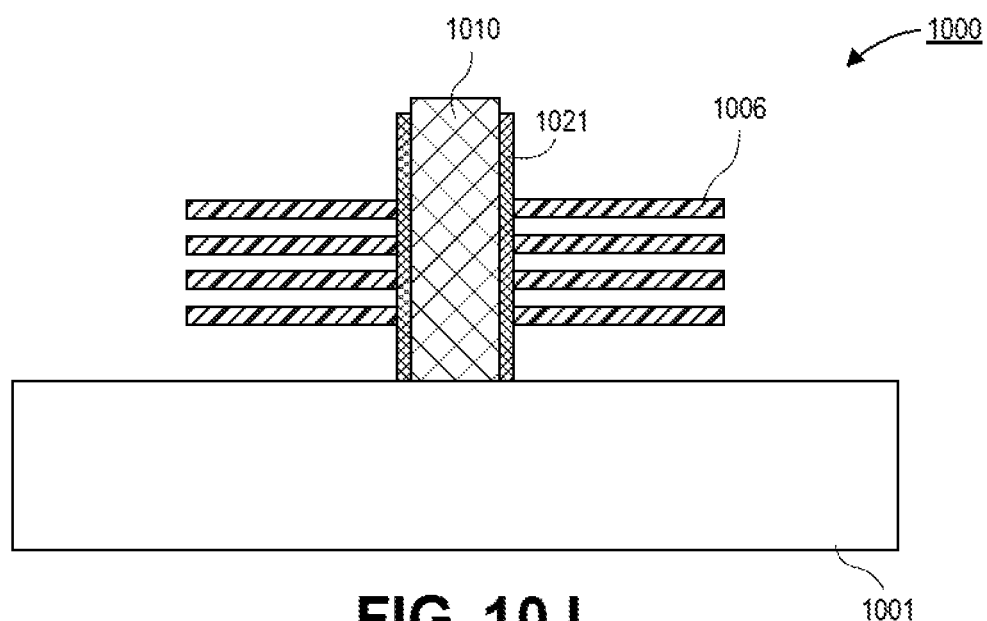

Referring now to FIG. 10J, a cross-sectional illustration of the semiconductor device 1000 in FIG. 10I is shown, in accordance with an embodiment. As shown, the semiconductor channels 1006 are in direct contact with the backbone liner 1021. The backbone liner 1021 may cover sidewall surfaces of the backbone 1010 and a bottom surface of the backbone 1010. In other embodiments, the backbone liner 1021 is absent from the bottom surface of the backbone 1010.

Figure 10K:
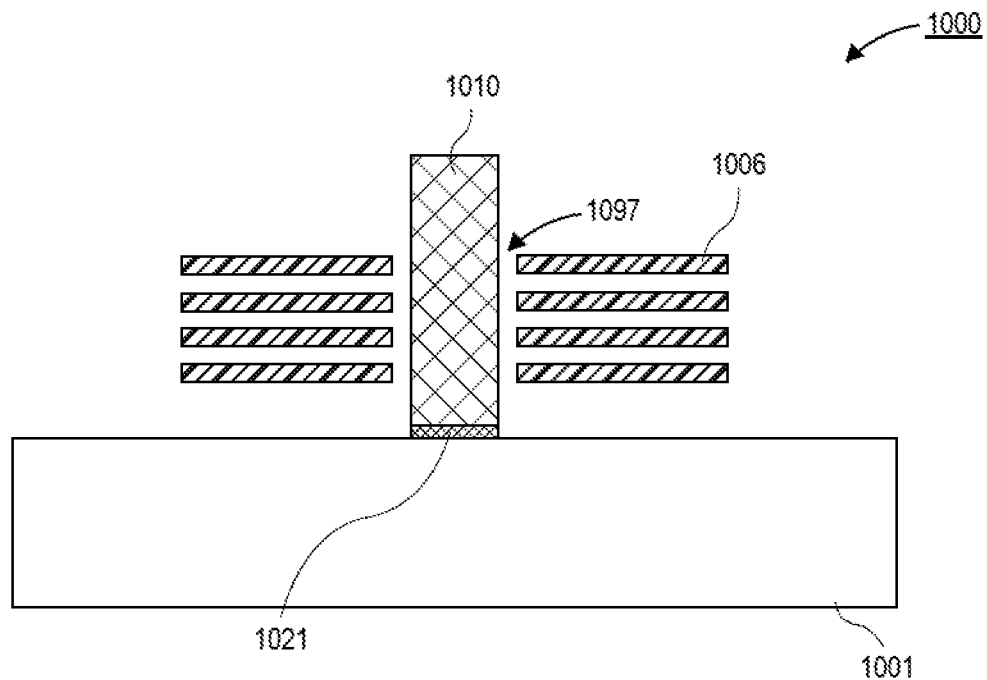

Referring now to FIG. 10K, a cross-sectional illustration of the semiconductor device 1000 after portions of the backbone liner 1021 are removed is shown, in accordance with an embodiment. As shown, removing the backbone liner 1021 provides a gap 1097 between a surface of the semiconductor channel 1006 and the surface of the backbone 1010. The gap 1097 provides sufficient space to form the gate dielectric and gate electrode around an entire perimeter of the semiconductor channel 1006.

Figure 10L:
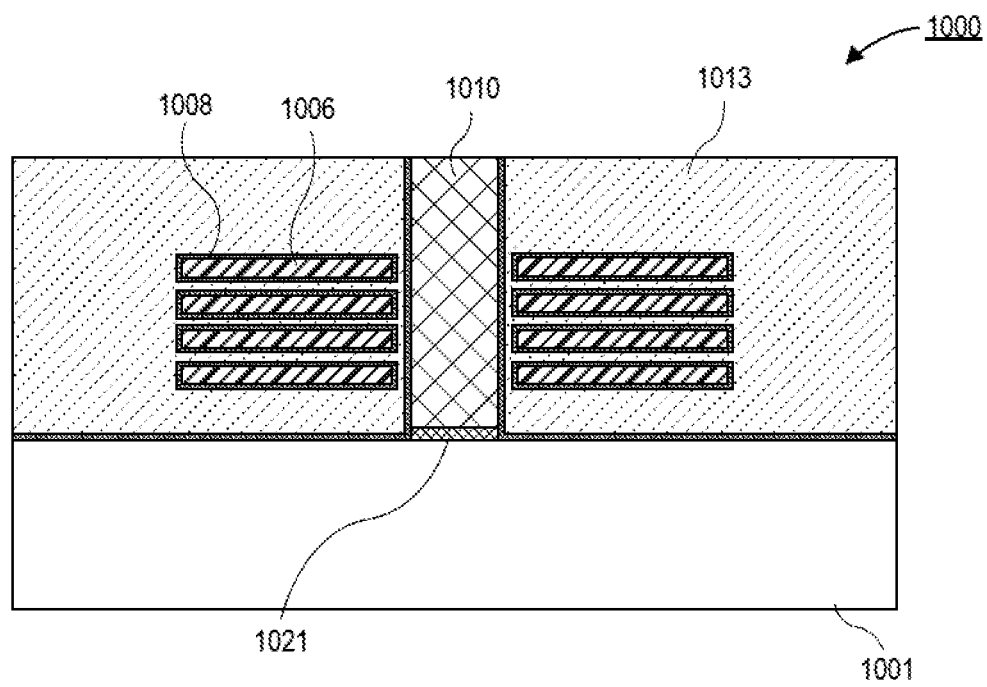

Referring now to FIG. 10L, a cross-sectional illustration of the semiconductor device 1000 after a gate stack is disposed over the semiconductor channels 1006 is shown, in accordance with an embodiment. In an embodiment, the gate stack comprises a gate dielectric 1008 that surrounds an entire perimeter of the semiconductor channels 1006. Portions of the gate dielectric 1008 may be disposed over the backbone 1010 and on the substrate 1001 due to a conformal deposition process. In an embodiment, a gate electrode 1013 is disposed over the gate dielectric 1008. As such, GAA control of the forksheet transistors of the semiconductor device 1000 is provided.

Referring now to FIG. 11A, a cross-sectional illustration of a semiconductor device 1100 is shown, in accordance with an additional embodiment. The plane of the cross-section in FIG. 11A is through the channel region. The semiconductor device 1100 may comprise a substrate 1101 and a plurality of forksheet transistors $1120_{A-C}$ above the substrate 1101. The transistors 1120 may each comprise a plurality of semiconductor channels 1106. The semiconductor channels 1106 have perimeters that are completely surrounded by a gate dielectric 1108 and a gate electrode 1113.

Each of the transistors 1120 may be separated from the neighboring transistor 1120 by a backbone 1110. As opposed to the embodiments above in FIGS. 8A-9B, a liner 1121 may be present in the channel region between the backbone 1110 and the semiconductor channels 1106. This is possible because the liner 1121 may comprise a catalytic oxidant material. For example, the liner 1121 may comprise alumina. When a structure with a catalytic oxidant is adjacent to a semiconductor material, such as the channel 1106, the application of heat results in a portion of the channel 1106 and a portion of the liner 1121 being oxidized. Subsequently, an etchant (e.g., a wet etch or an atomic layer etch (ALE) approach) that is selective to the oxide over the semiconductor channel can be applied in the channel region to remove the oxides and create a gap between the remaining portion of the channel 1106 and the remaining portion of the liner 1121. The gap allows sufficient room to deposit the gate dielectric 1108 and the gate electrode 1113 completely around the perimeter of the channel 1106.

Additionally, since the oxidation reaction is localized to the region of the liner 1121 adjacent to the channels 1106, a pattern of recesses 1124 may be present in the surface of the liner 1121 that faces the gate electrode 1113. In an embodiment, the recesses 1124 are aligned with the channels 1106. However, in other embodiments, the liner 1121 may be completely removed.

In FIG. 11A, the recesses 1124 are shown as having a substantially rectangular profile. It is to be appreciated that in some embodiments, the recesses 1124 may have a shape that is more characteristic of a diffusion event. FIG. 11B is a zoomed in illustration of a region 1123 that more clearly illustrates what a typical recess may look like. For example, the recesses 1124 may be bowl shaped, or have an otherwise non-vertical surface. FIG. 11B also illustrates the consumed portion of the channel 1106' (indicated with dashed lines). As shown, the channel 1106 is originally coplanar with the surface of the liner 1121 before the oxidization and etching process.

Referring now to FIG. 11C, an example of another embodiment of the zoomed in region 1123 is shown. In FIG. 11C, the gate electrode 1113 (or the workfunction metal (not shown), does not completely cover all surfaces of the gate dielectric 1108 around the channel 1106. That is, a void 1125 may be present at some locations. A void 1125 may prevent GAA control of the channel 1106. However, in some embodiments, a portion of the surface of the channel 1106 facing the backbone 1110 may still be gated to provide at least some additional control of the channel 1106.

Referring now to FIGS. 12A-12D a series of illustrations depicting a process to form a GAA forksheet architecture using a liner with a catalytic oxidant is shown, in accordance with an embodiment.

Figure 12A:
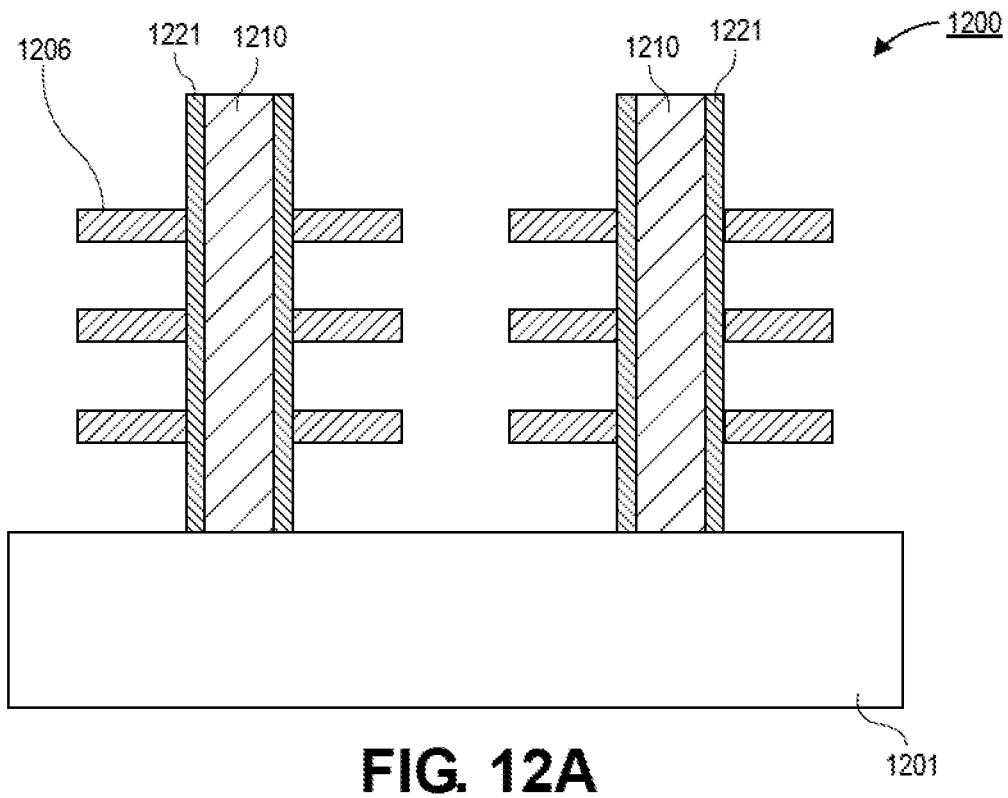
FIGS. 12A-12D are cross-sectional illustrations depicting a process for fabricating forksheet transistors with a liner comprising a catalytic oxidant material, in accordance with an embodiment.

Referring now to FIG. 12A, a cross-sectional illustration of a semiconductor device 1200 is shown, in accordance with an embodiment. The cross-sectional view depicts a cross-section of the channel region, with backbones 1210 separating individual transistors. In an embodiment, a liner 1221 is disposed along sidewalls of the backbones 1210. In some embodiments, the liner 1221 may also be over a bottom surface of the backbones 1210 over the substrate 1201. In an embodiment, the liners 1221 may comprise a catalytic oxidant material. For example, the liners 1221 may comprise alumina. In an embodiment, the semiconductor channels 1206 are in direct contact with the liners 1221.

Figure 12B:
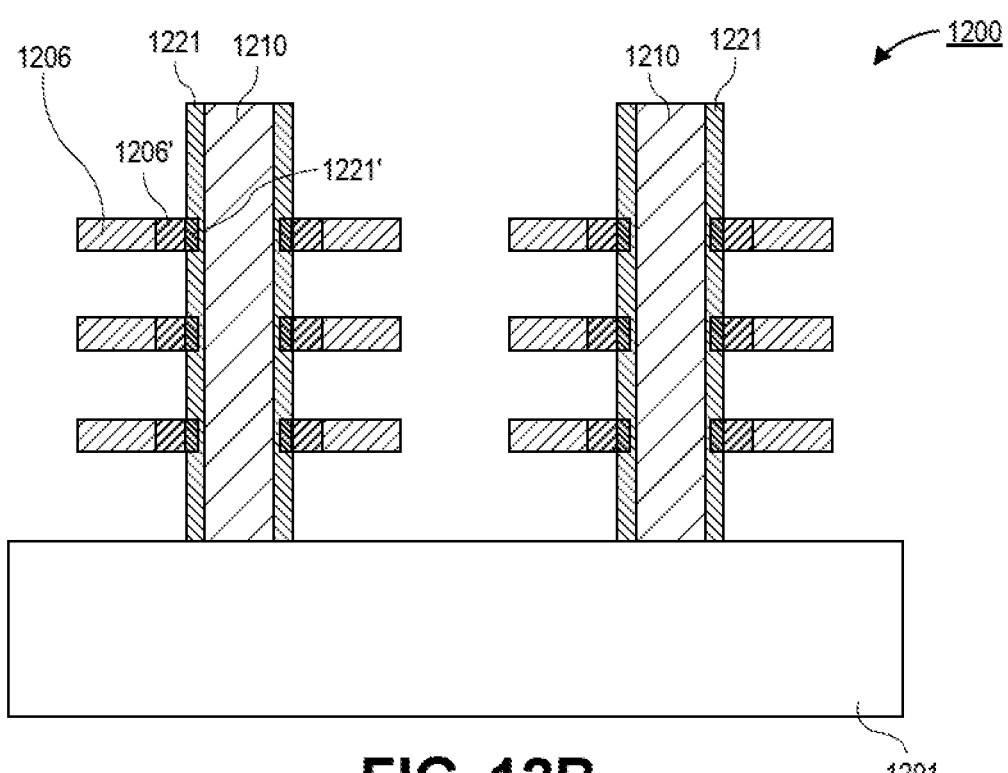

Referring now to FIG. 12B, a cross-sectional illustration of the semiconductor device 1200 after a heat treatment is shown, in accordance with an embodiment. In an embodiment, the heat treatment results in local oxidation of the liner 1221. For example, only portions of the liner 1221 that are proximate to the semiconductor channels 1206 are oxidized. Oxidized portions 1221' of the liner 1221 are shown with a different shading in FIG. 12B. In an embodiment, portions 1206' of the semiconductor channels may also be oxidized during the heat treatment.

Figure 12C:
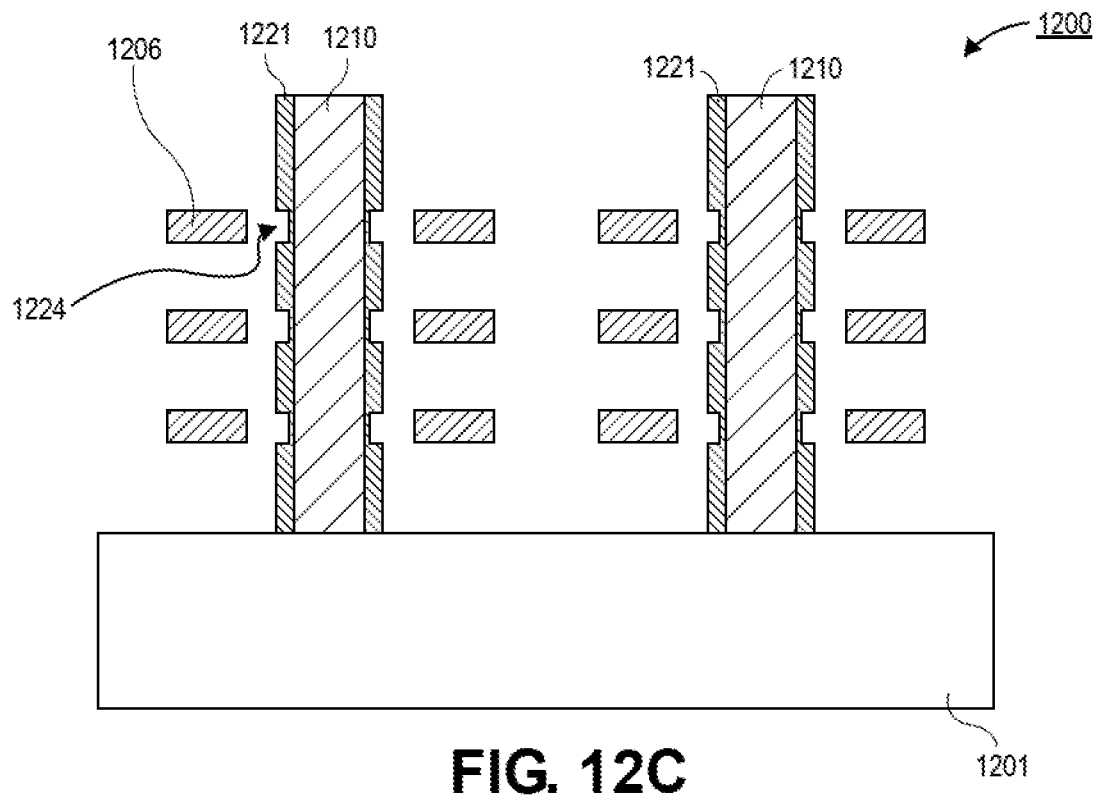

Referring now to FIG. 12C, a cross-sectional illustration of the semiconductor device 1200 after the oxidized portions 1206' and 1221' are removed is shown, in accordance with an embodiment. In an embodiment, the oxidized portions 1206' and 1221' may be removed with one or more etching processes that are selective to the semiconductor channels 1206 and/or the liner 1221. As such, recesses 1224 are formed into the liner 1221.

Figure 12D:
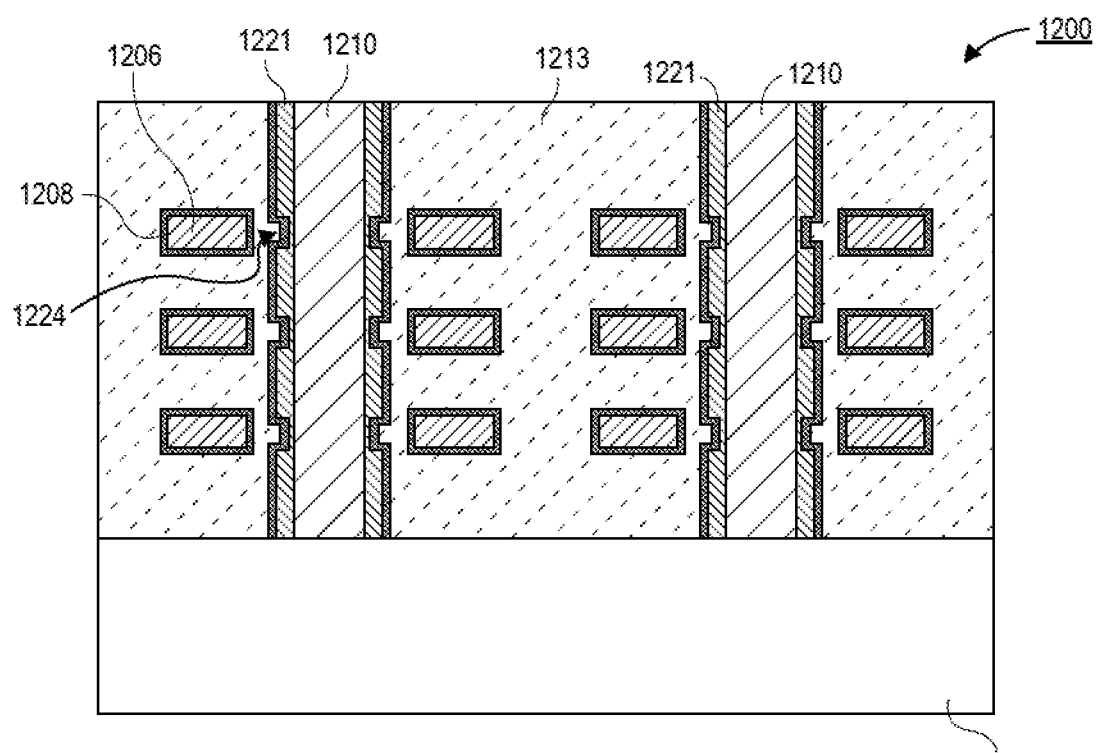

Referring now to FIG. 12D, a cross-sectional illustration of the semiconductor device 1200 after a gate stack is disposed over the semiconductor channels 1206 is shown, in accordance with an embodiment. In an embodiment, the gate stack may comprise a gate dielectric 1208 and a gate electrode 1213. The recess 1224 provides sufficient space for the gate dielectric 1208 and the gate electrode 1213 to completely surround the perimeter of the semiconductor channels 1206. As such, GAA control is provided in the semiconductor device 1200.

Figure 13A:
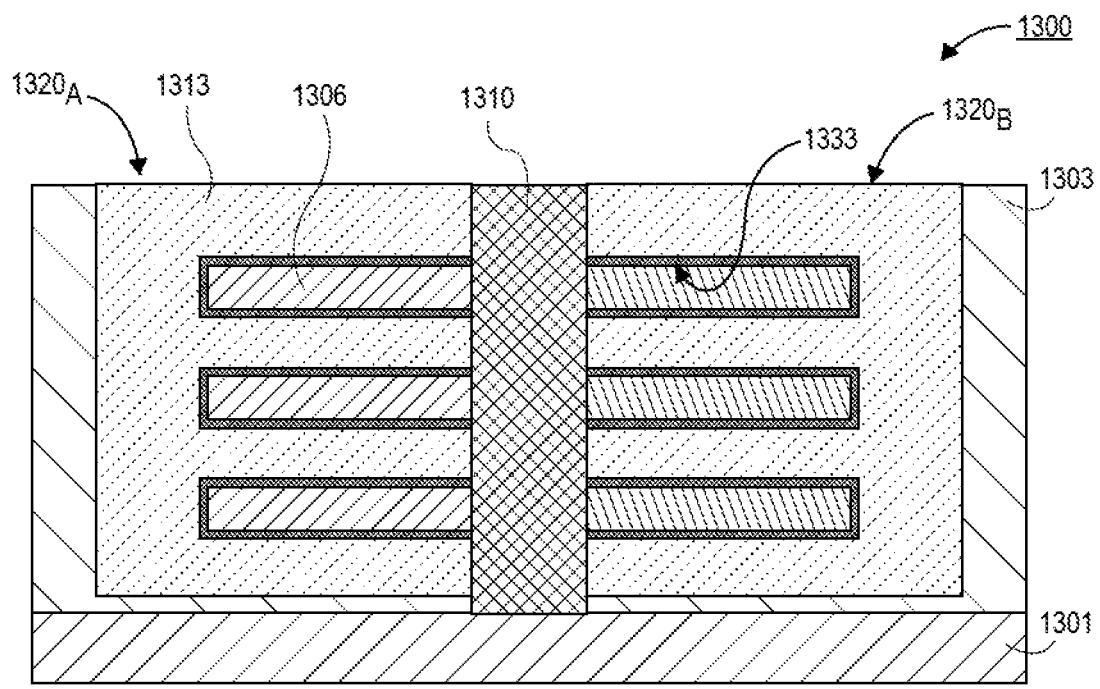
FIGS. 13A-13C are cross-sectional illustrations depicting a process for fabricating forksheet transistors with electrically coupled gate electrodes across the backbone with a timed etching process, in accordance with an embodiment.
Figure 13B:
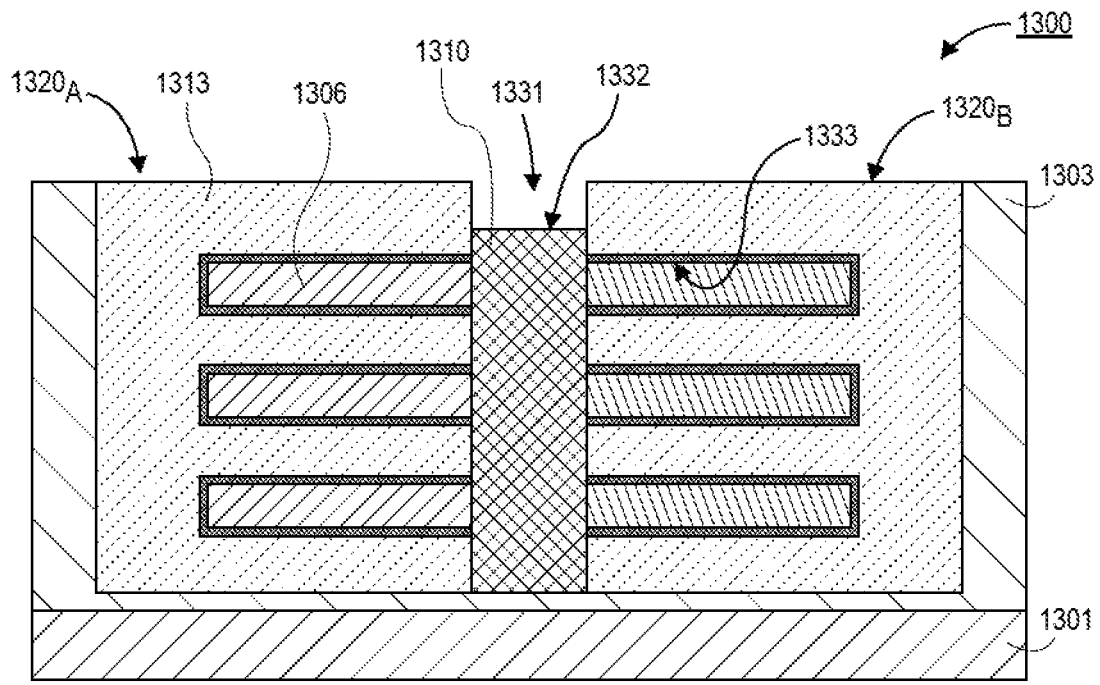
Figure 13C:
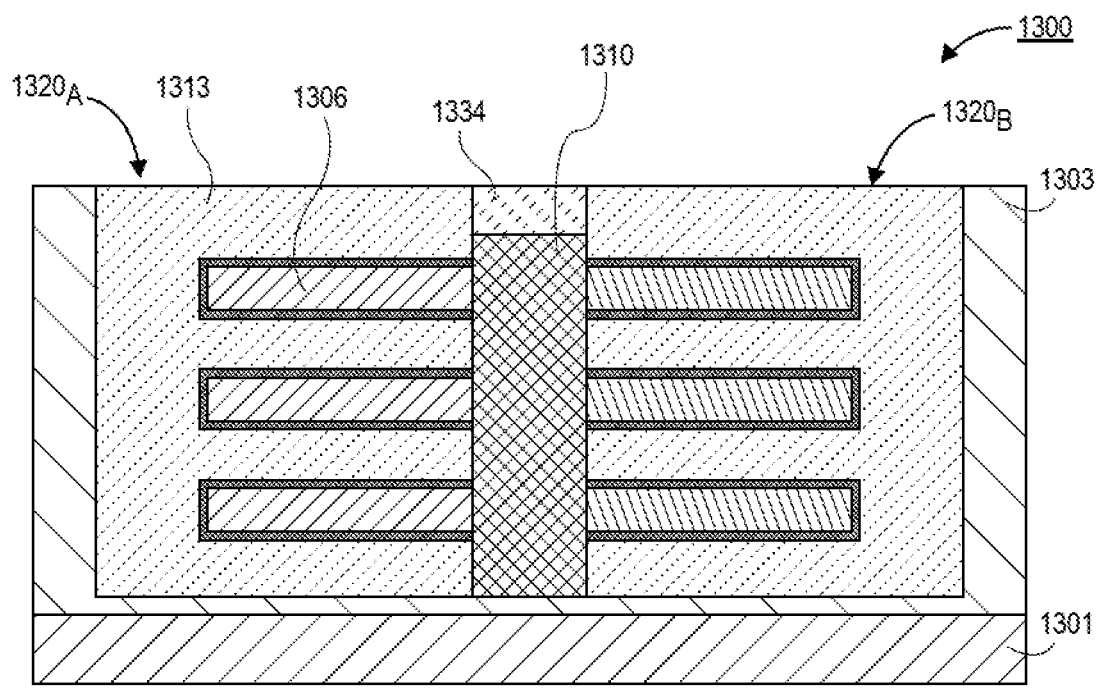

Referring now to FIGS. 13A-13C, a series of cross-sectional illustrations depicting a process to form an interconnect between the gate electrodes of two forksheet transistors that passes across the backbone is shown, in accordance with an embodiment.

Referring now to FIG. 13A, a cross-sectional illustration of a semiconductor device 1300 is shown, in accordance with an embodiment. In an embodiment, the semiconductor device 1300 comprises a substrate 1301, and a first transistor 1320$_A$ and a second transistor 1320$_B$ over the substrate 1301. The first transistor 1320$_A$ may be separated from the second transistor 1320$_B$ by a backbone 1310. In the illustrated embodiment, the semiconductor channels 1306 of the transistors 1320 extend out from the backbone 1310. In other embodiments, the semiconductor channels 1306 may have a GAA architecture similar to the architectures described above with respect to FIGS. 8A-9B or FIGS. 11A-11C. The channels 1306 may be surrounded by a gate electrode 1313, and an insulator 1303 may surround the transistors 1320. In an embodiment, the first transistor 1320$_A$ may be a first conductivity type (e.g., P-type) and the second transistor 1320$_B$ may be a second conductivity type (e.g., N-type). In other embodiments, the first transistor 1320$_A$ and the second transistor 1320$_B$ may be the same conductivity type.

Referring now to FIG. 13B, a cross-sectional illustration of the semiconductor device 1300 after the backbone 1310 is etched back is shown, in accordance with an embodiment. In an embodiment, the backbone 1310 may be etched with a timed etching process. The etching process is timed so that a top surface 1332 of the backbone 1310 is above (in the Z-direction) the top surfaces 1333 of the channels 1306. Keeping the top surface 1332 of the backbone 1310 above the channels 1306 prevents shorting to the channels 1306 when the interconnect is disposed in the recess 1331.

Referring now to FIG. 13C, a cross-sectional illustration of the semiconductor device 1300 after an interconnect 1334 is disposed in the recess 1331 is shown, in accordance with an embodiment. The interconnect 1334 provides an electrical connection between the gate electrode 1313 of the first transistor 1320$_A$ and the gate electrode 1313 of the second transistor 1320$_B$. In an embodiment, the interconnect 1334 is the same material as one or both of the gate electrodes 1313. In other embodiments, the interconnect 1334 is a different material than the gate electrodes 1313.

Figure 13D:
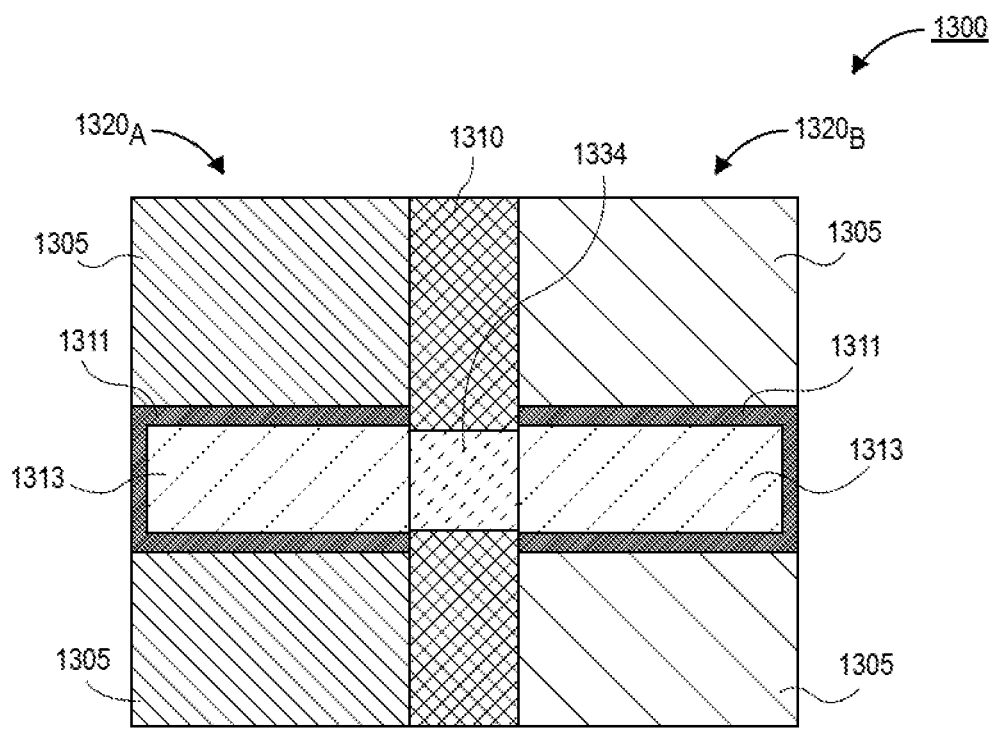
FIG. 13D is a plan view illustration of the forksheet transistors in FIG. 13C, in accordance with an embodiment.

Referring now to FIG. 13D, a plan view illustration of the semiconductor device 1300 in FIG. 13C is shown, in accordance with an embodiment. In an embodiment, the transistors 1320 include source/drains 1305 on opposite sides of the gate electrode 1313. The source/drains 1305 may be separated from the gate electrode 1313 by a spacer 1311. As shown, the interconnect 1334 is isolated to a portion of the backbone 1310 that is between the spacers 1311 in order to only provide an electrical connection through backbone 1310 within the channel region.

Figure 14A:
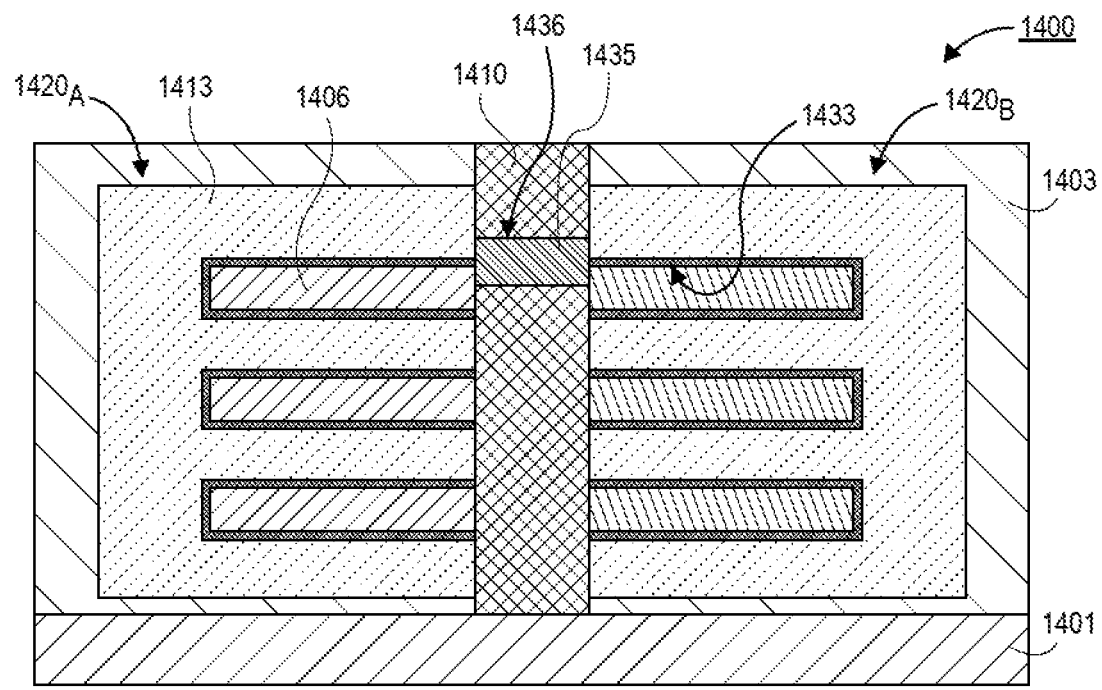
FIGS. 14A-14C are cross-sectional illustrations depicting a process for fabricating forksheet transistors with electrically coupled gate electrodes across the backbone with an etchstop layer in the backbone, in accordance with an embodiment.
Figure 14B:
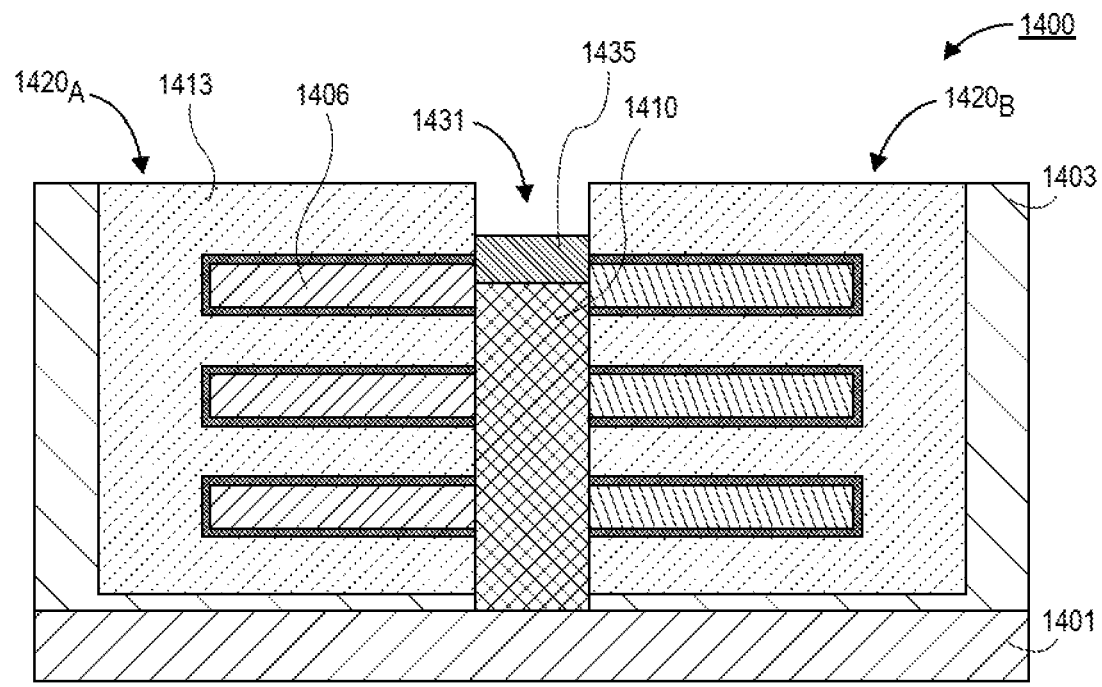
Figure 14C:
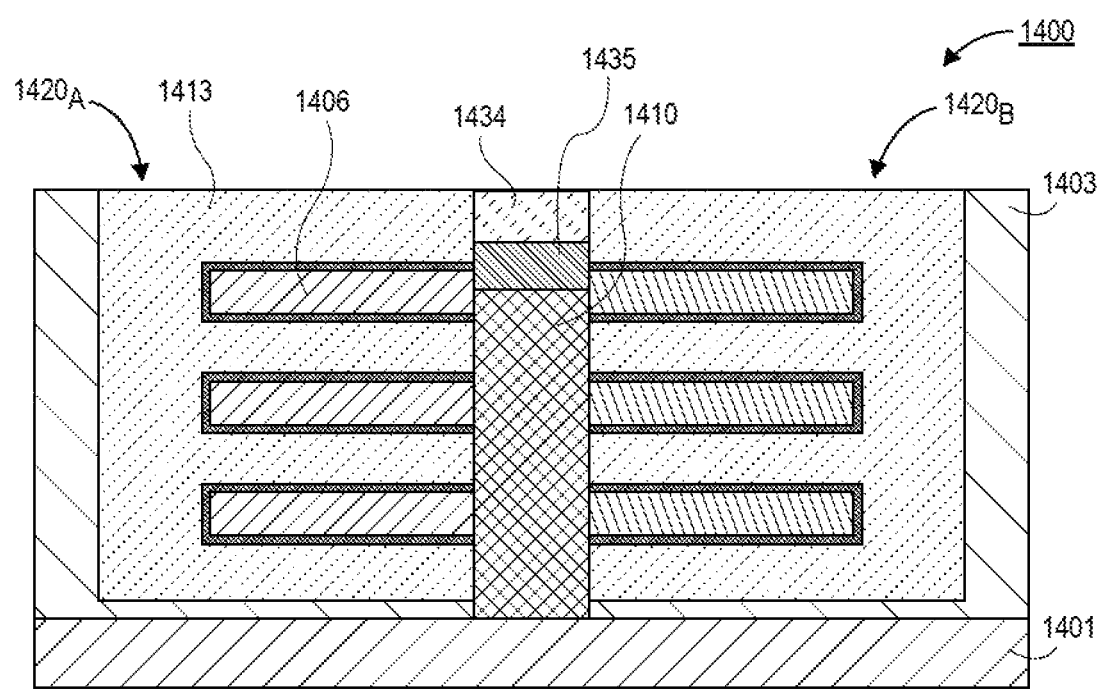

Referring now to FIGS. 14A-14C, a series of cross-sectional illustrations depicting a process for forming an interconnect between the gate electrodes across a backbone using an etchstop layer is shown, in accordance with an embodiment.

Referring now to FIG. 14A, a cross-sectional illustration of a semiconductor device 1400 is shown, in accordance with an embodiment. In an embodiment, the semiconductor device 1400 comprises a substrate 1401, and a first transistor 1420$_A$ and a second transistor 1420$_B$ over the substrate 1401. The first transistor 1420$_A$ may be separated from the second transistor 1420$_B$ by a backbone 1410. In the illustrated embodiment, the semiconductor channels 1406 of the transistors 1420 extend out from the backbone 1410. In other embodiments, the semiconductor channels 1406 may have a GAA architecture similar to the architectures described above with respect to FIGS. 8A-9B or FIGS. 11A-11C. The channels 1406 may be surrounded by a gate electrode 1413, and an insulator 1403 may surround the transistors 1420. In an embodiment, the first transistor 1420$_A$ may be a first conductivity type (e.g., P-type) and the second transistor 1420$_B$ may be a second conductivity type (e.g., N-type). In other embodiments, the first transistor 1420$_A$ and the second transistor 1420$_B$ may be the same conductivity type.

In an embodiment, the backbone 1410 may further comprise an etchstop layer 1435. The etchstop layer 1435 may have a high etch selectivity with respect to the remaining portion of the backbone 1410. As such, the portion of the backbone 1410 above the etchstop layer 1435 may be etched away without the tight process control needed in a timed etching process, such as the process described above with respect to FIGS. 13A-13C. In an embodiment, a top surface 1436 of the etchstop layer 1435 is above a top surface 1433 of the channels 1406. This prevents shorting to the channels after deposition of the interconnect between the gate electrodes 1413.

Referring now to FIG. 14B, a cross-sectional illustration of the semiconductor device 1400 after the top portion of the backbone 1410 is etched back is shown, in accordance with an embodiment. Removing the top portion of the backbone 1410 results in the formation of a recess 1431 that ends at the top surface of the etchstop layer 1435.

Referring now to FIG. 14C, a cross-sectional illustration of the semiconductor device 1400 after an interconnect is disposed in the recess 1431 is shown, in accordance with an embodiment. The interconnect 1434 provides an electrical connection between the gate electrode 1413 of the first transistor 1420$_A$ and the gate electrode 1413 of the second transistor 1420$_B$. In an embodiment, the interconnect 1434 is the same material as one or both of the gate electrodes 1413. In other embodiments, the interconnect 1434 is a different material than the gate electrodes 1413.

Referring now to FIGS. 15A-15D, cross-sectional illustrations of semiconductor devices 1500 are shown, in accordance with various embodiments. The illustrated embodiments depict different configurations of an etchstop layer that may be used in conjunction with the backbone in order to provide interconnects across the backbone.

Figure 15A:
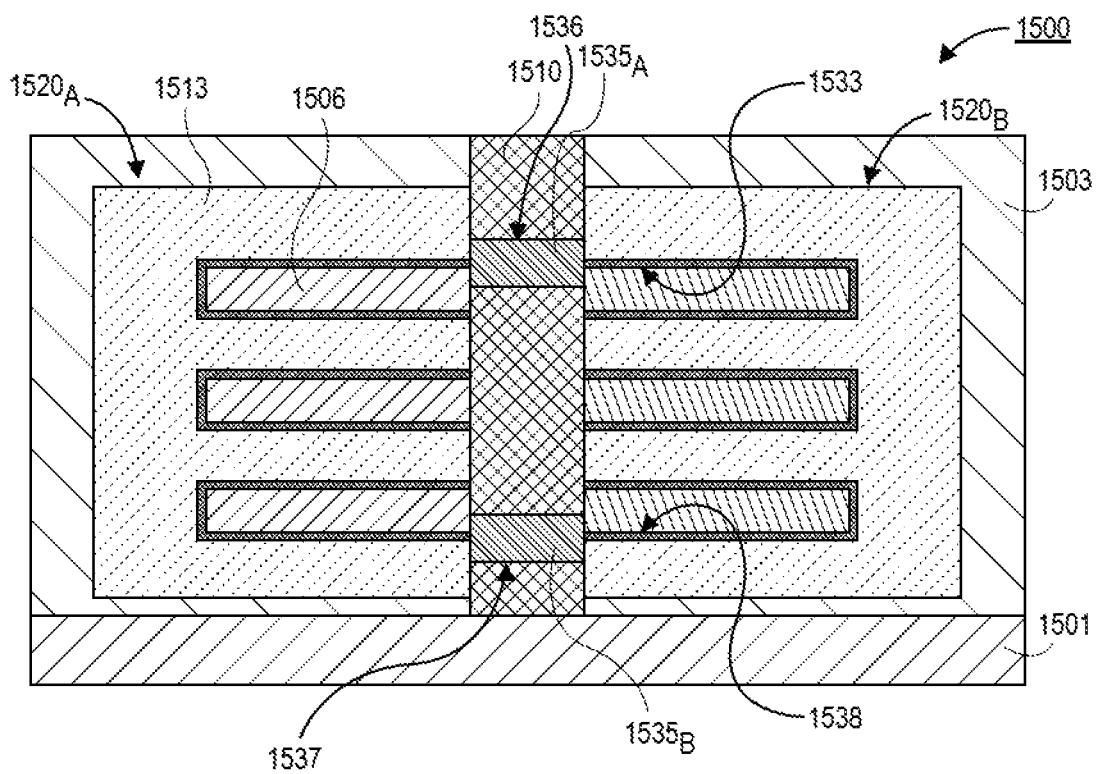
FIGS. 15A-15D are cross-sectional illustrations of forksheet transistors with etchstop layers in various locations within the backbone, in accordance with various embodiments.

Referring now to FIG. 15A, a cross-sectional illustration of a semiconductor device 1500 is shown, in accordance with an embodiment. In an embodiment, the semiconductor device 1500 comprises a substrate 1501, and a first transistor 1520$_A$ and a second transistor 1520$_B$ over the substrate 1501. The first transistor 1520$_A$ may be separated from the second transistor 1520$_B$ by a backbone 1510. In the illustrated embodiment, the semiconductor channels 1506 of the transistors 1520 extend out from the backbone 1510. In other embodiments, the semiconductor channels 1506 may have a GAA architecture similar to the architectures described above with respect to FIGS. 8A-9B or FIGS. 11A-11C. The channels 1506 may be surrounded by a gate electrode 1513, and an insulator 1503 may surround the transistors 1520. In an embodiment, the first transistor 1520$_A$ may be a first conductivity type (e.g., P-type) and the second transistor 1520$_B$ may be a second conductivity type (e.g., N-type). In other embodiments, the first transistor 1520$_A$ and the second transistor 1520$_B$ may be the same conductivity type.

In an embodiment, the backbone 1510 comprises a pair of etchstop layers 1535$_A$ and 1535$_B$. The first etchstop 1535$_A$ layer has a top surface 1536 that is above a top surface 1533 of the topmost channels 1506. The second etchstop layer 1535$_B$ has a bottom surface 1537 that is below the bottom surface 1538 of the bottommost channels 1506. Accordingly, interconnects (not shown) between the gate electrodes 1513 may be made across the backbone 1510 above and below the channels 1506.

Figure 15B:
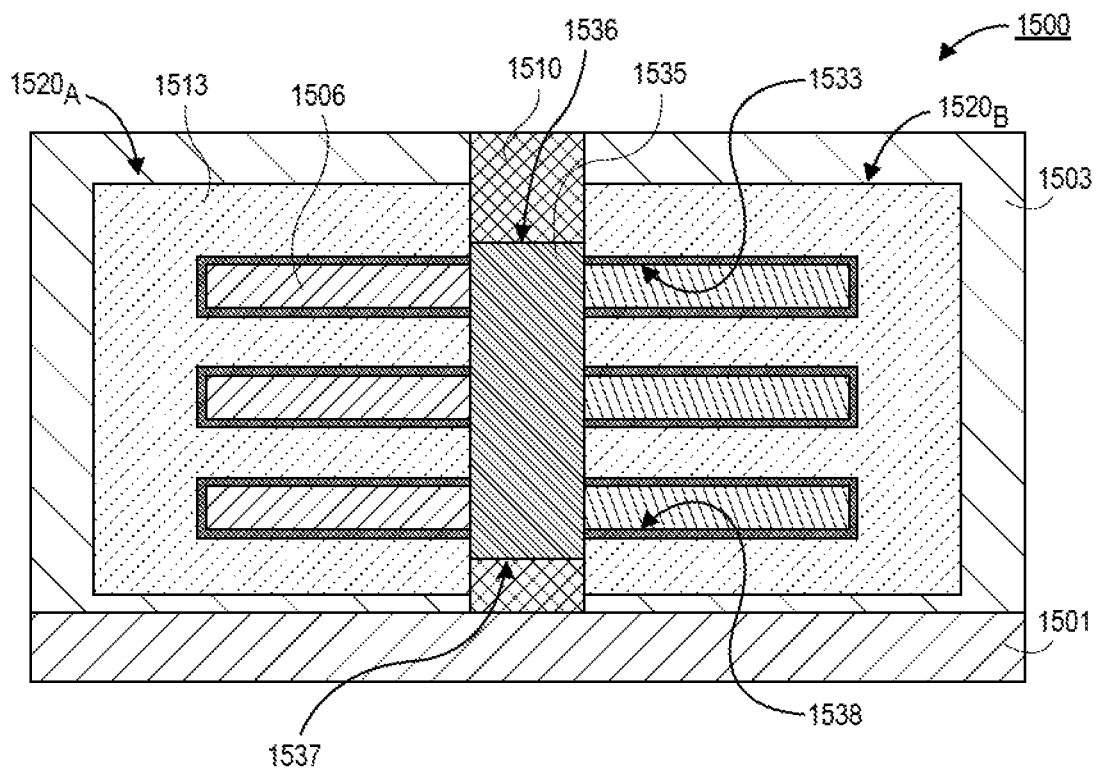

Referring now to FIG. 15B, a cross-sectional illustration of a semiconductor device 1500 is shown, in accordance with an additional embodiment. The semiconductor device 1500 in FIG. 15B may be substantially similar to the semiconductor device 1500 in FIG. 15A, except that a single etchstop layer 1535 is used. The top surface 1536 of the etchstop layer 1535 is above the top surface 1533 of the topmost channels 1506, and a bottom surface 1537 of the etchstop layer 1535 is below the bottom surface 1538 of the bottommost channel 1506.

Figure 15C:
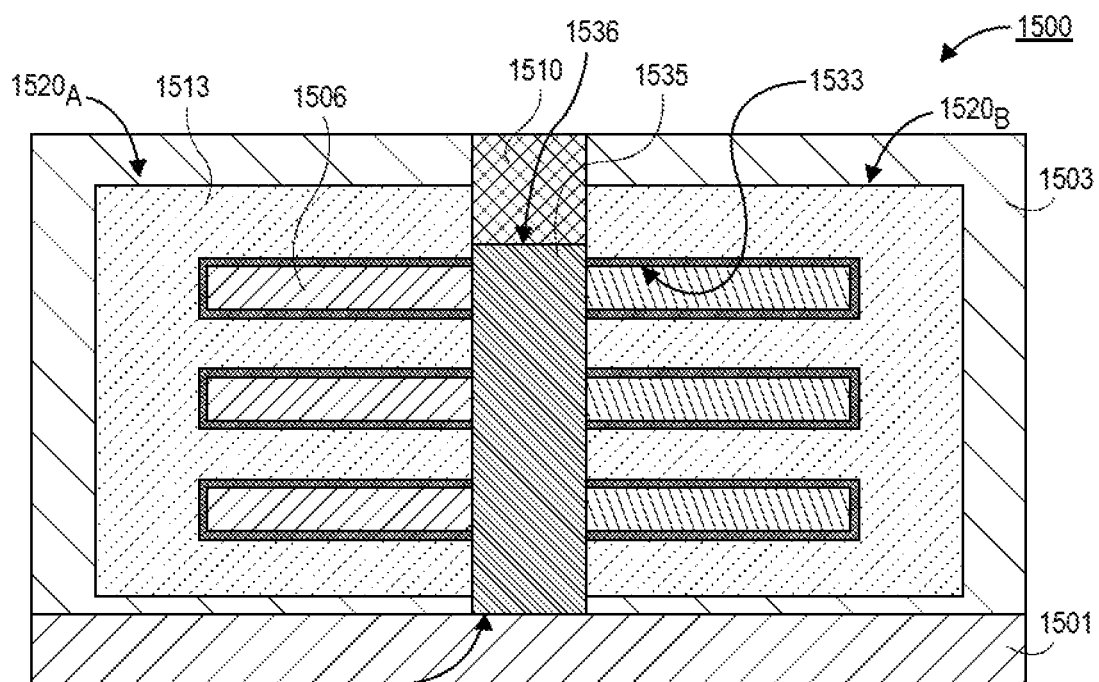

Referring now to FIG. 15C, a cross-sectional illustration of a semiconductor device 1500 is shown, in accordance with an additional embodiment. The semiconductor device 1500 in FIG. 15C may be substantially similar to the semiconductor device 1500 in FIG. 15B, except that the bottom surface 1537 of the etchstop layer 1535 extends all the way to the substrate 1501.

Figure 15D:
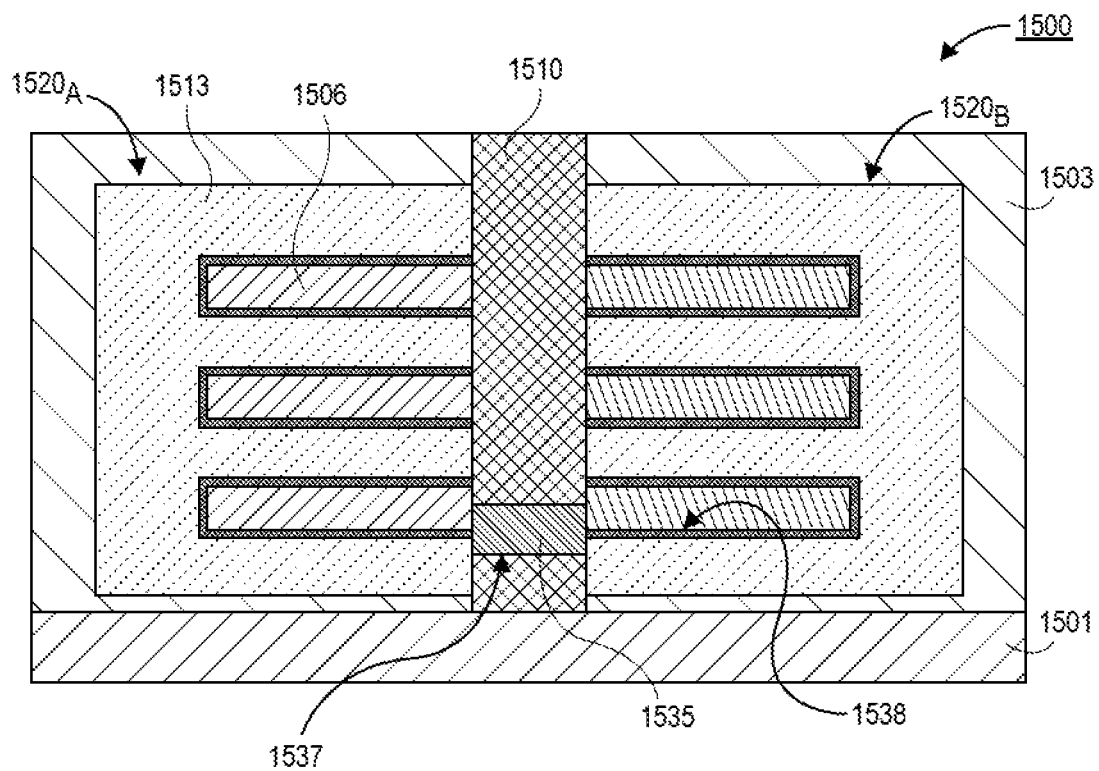

Referring now to FIG. 15D, a cross-sectional illustration of a semiconductor device 1500 is shown, in accordance with an additional embodiment. The semiconductor device 1500 in FIG. 15D may be substantially similar to the semiconductor device 1500 in FIG. 15A, except that the etchstop layer 1535 is positioned at the bottom of the backbone 1510. In an embodiment, a bottom surface 1537 of the etchstop layer 1535 is below a bottom surface 1538 of a bottommost channel 1506.

Referring now to FIGS. 16A-16D, cross-sectional illustrations along the length of the backbone 1610 are shown, in accordance with an embodiment. In an embodiment, the semiconductor channels 1606 are illustrated with dashed lines to indicate that they are into and out of the plane of FIGS. 16A-16D. Additionally, the locations of the source/drains 1605 are highlighted as being on opposite ends of the gate stack 1612.

Figure 16A:
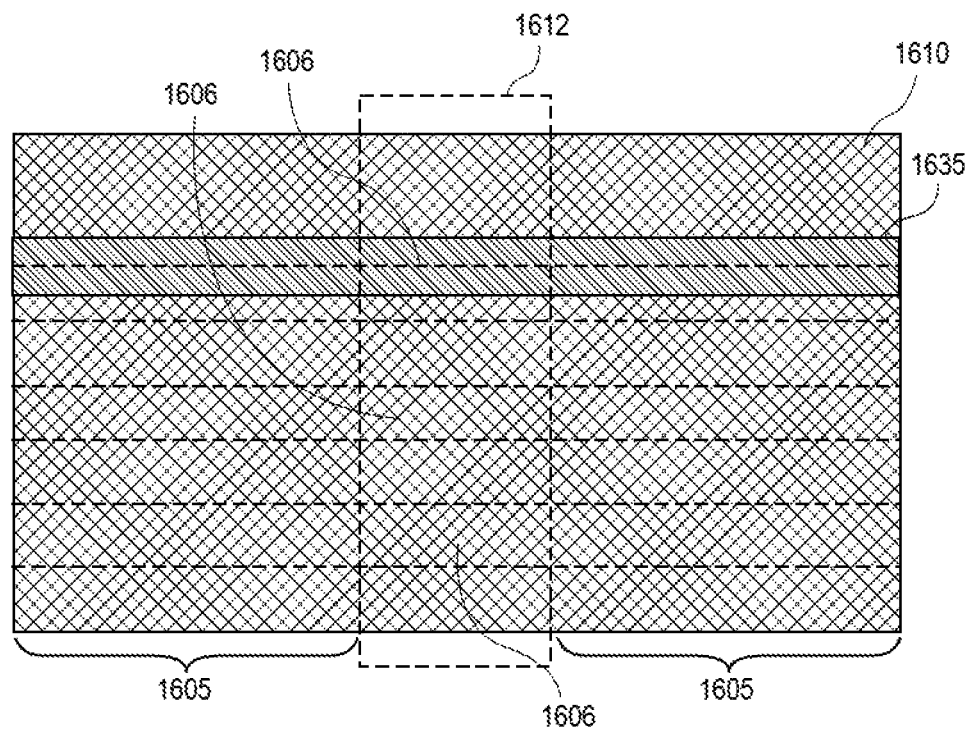
FIGS. 16A-16D are cross-sectional illustrations of a backbone with an embedded etchstop layer, in accordance with various embodiments.

Referring now to FIG. 16A, a cross-sectional illustration of the backbone 1610 is shown, in accordance with an embodiment. As shown, the etchstop layer 1635 extends along an entire length of the backbone 1610. That is the etchstop layer 1635 is positioned adjacent to the gate stack 1612 and the source/drain regions 1605. The etchstop layer 1635 is shown in a position (in the Z-direction) similar to the embodiment shown in FIGS. 14A-C. However, it is to be appreciated that the etchstop layer 1635 (or a plurality of etchstop layers 1635) may be located in any position (e.g., in the positions illustrated in FIGS. 15A-D).

Figure 16B:
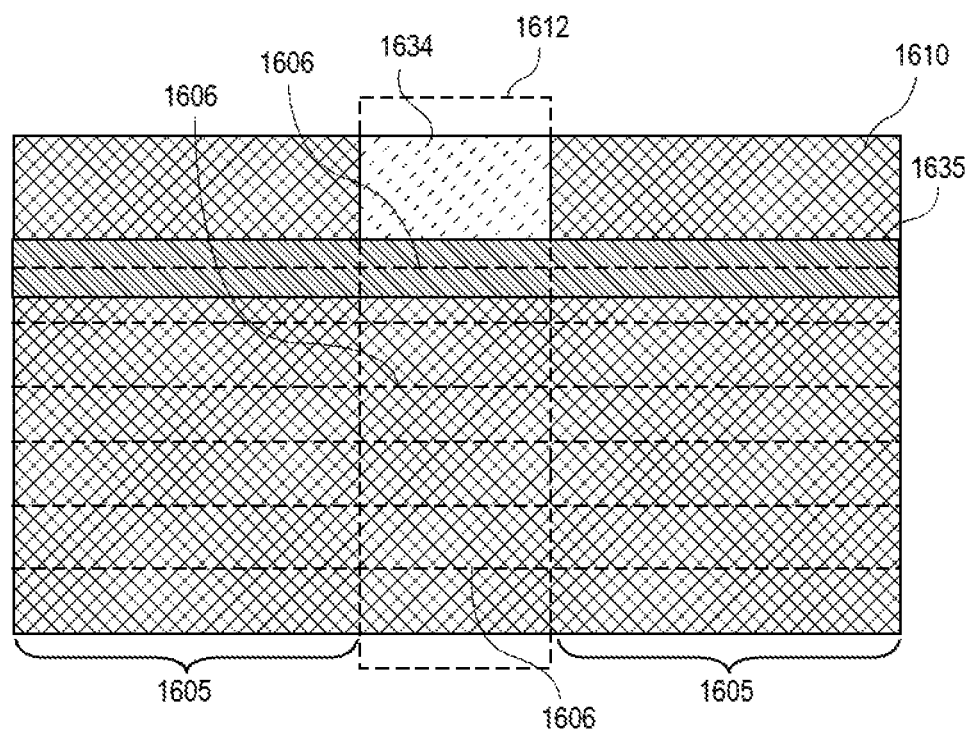

In FIG. 16B, a cross-sectional illustration of the backbone 1610 after an interconnect 1634 is formed through the backbone 1610 is shown, in accordance with an embodiment. As shown, the interconnect 1634 is disposed in a recess in the backbone 1610. Additionally, the interconnect 1634 is isolated to the gate stack 1612.

Figure 16C:
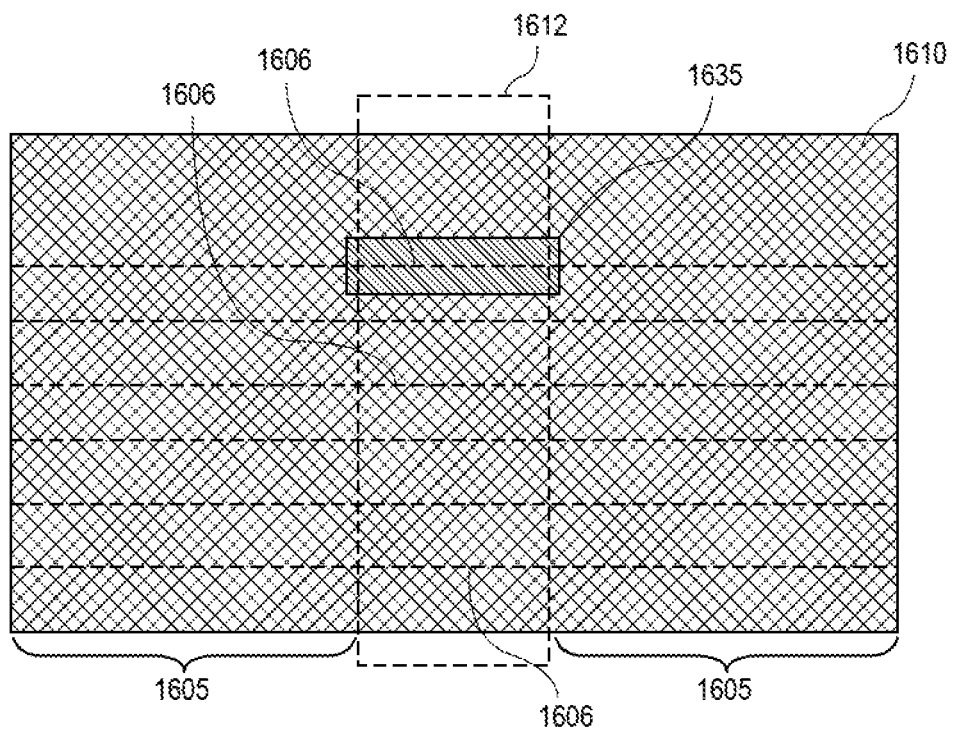
Figure 16D:
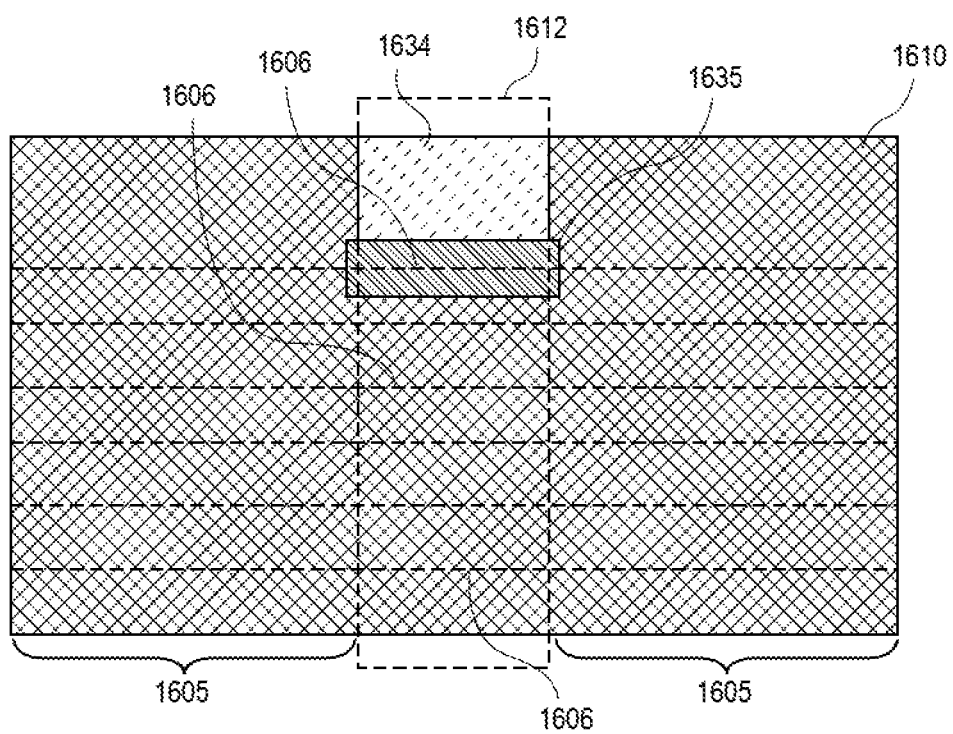

Referring now to FIGS. 16C and 16D, cross-sectional illustrations of a backbone 1610 before and after an interconnect 1634 is formed across the backbone 1610 is shown, in accordance with an embodiment. The backbone 1610 in FIGS. 16C and 16D are similar to those in FIGS. 16A and 16B, with the exception that the etchstop layer 1635 does not extend along an entire length of the backbone 1610. For example, the etchstop layer 1635 may be located proximate to the gate stack 1612. In some embodiments, the etchstop layer 1635 may extend beyond the gate stack 1612 without extending along the entire length of the backbone 1610.

Figure 17A:
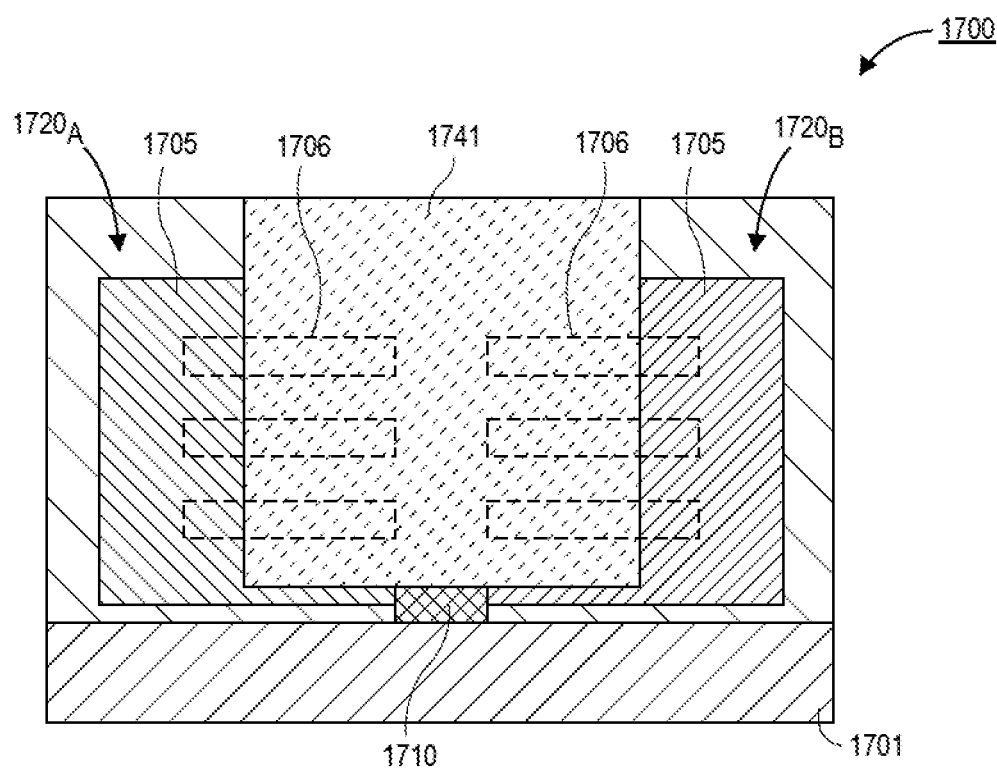
FIG. 17A is a cross-sectional illustration of forksheet transistors with an interconnect between source/drain regions across the backbone, in accordance with an embodiment.

Referring now to FIG. 17A, a cross-sectional illustration of a semiconductor device 1700 is shown, in accordance with an embodiment. In an embodiment, the semiconductor device 1700 comprises a substrate 1701 and a pair of forksheet transistor $1720_A$ and $1720_B$ over the substrate 1701. The forksheet transistors 1720 may be separated from each other by a backbone 1710. The plane of the illustrated embodiment is through the source/drain region 1705. The location of the channels 1706 are shown with dashed lines to indicate they are out of the plane shown in FIG. 17A. In an embodiment, the first transistor $1720_A$ may be a first conductivity type (e.g., P-type) and the second transistor $1720_B$ may be a second conductivity type (e.g., N-type). In other embodiments, the first transistor $1720_A$ and the second transistor $1720_B$ may be the same conductivity type. As shown, an interconnect 1741 is disposed through the backbone 1710 in order to electrically couple the source/drain region 1705 of the first transistor $1720_A$ to the source/drain region 1705 of the second transistor $1720_B$.

Figure 17B:
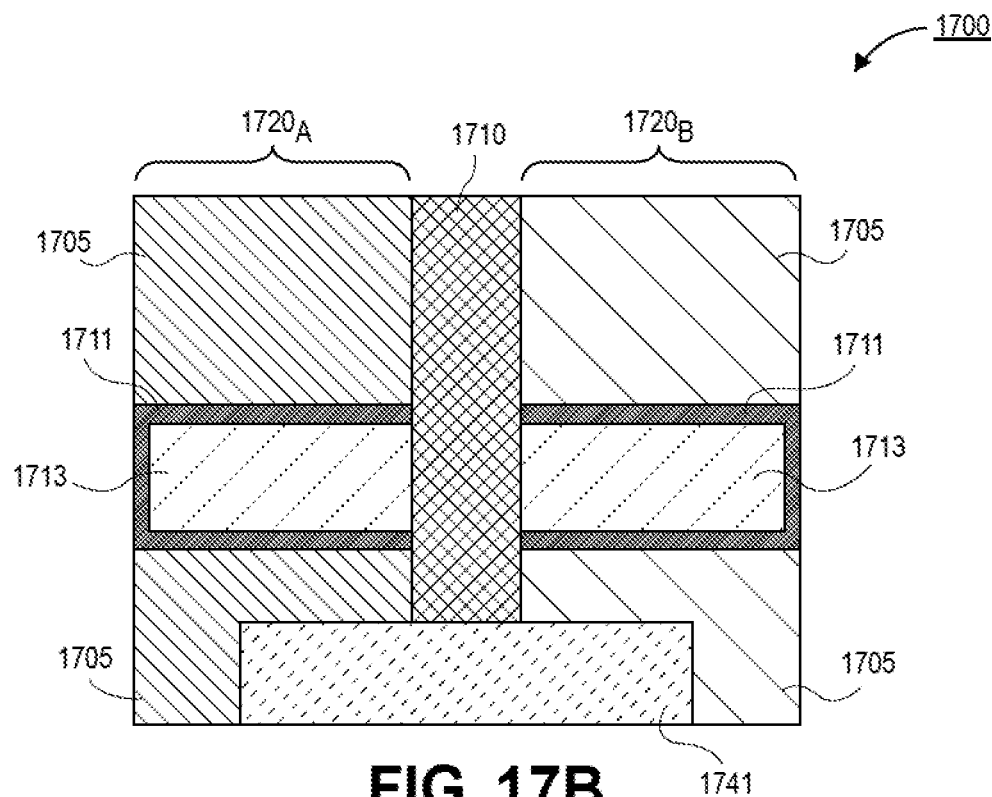
FIG. 17B is a plan view illustrations of the forksheet transistors in FIG. 17A, in accordance with an embodiment.

Referring to FIG. 17B, a plan view illustration of the semiconductor device 1700 in FIG. 17A is shown, in accordance with an embodiment. In FIG. 17B, the gate electrode 1713 and spacers 1711 are shown between the source/drain regions 1705 of each transistor 1720. Additionally, it is shown that the interconnect 1741 is isolated to a single side of the transistors 1720. For example, the bottom source/drain region 1705 (as viewed in FIG. 17B) of the first transistor $1720_A$ is electrically coupled to the bottom source/drain region 1705 (as viewed in FIG. 17B) of the second transistor $1720_B$.

Figure 18:
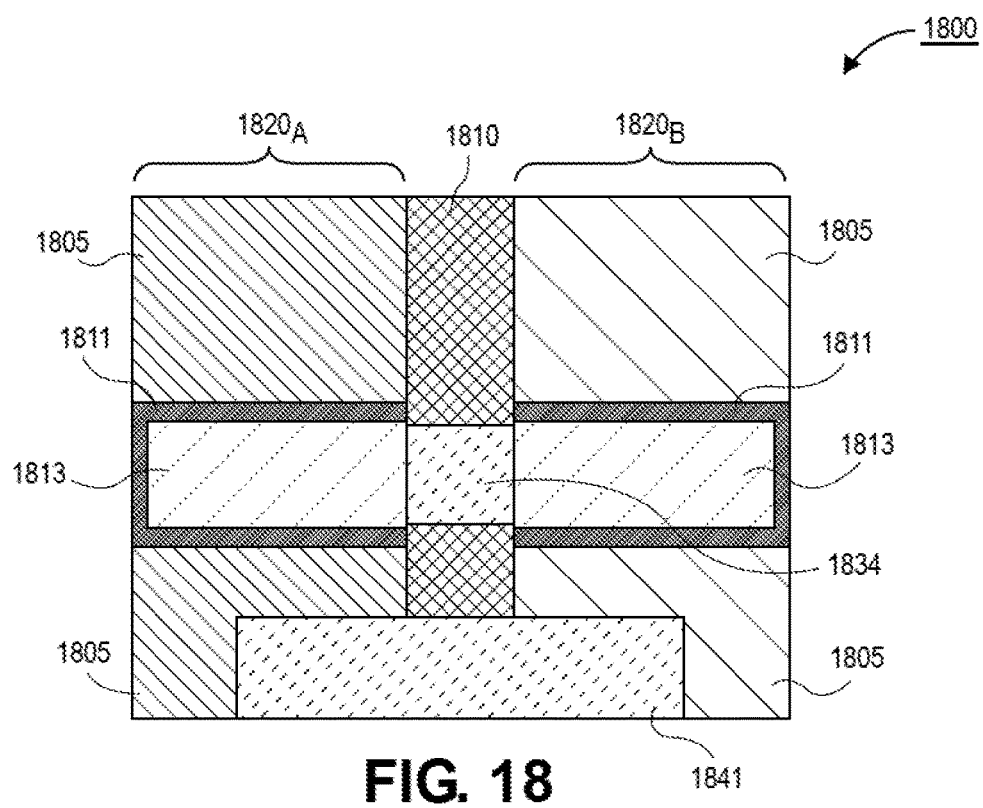
FIG. 18 is a plan view illustration of forksheet transistors that are configured as an inverter by interconnects across the backbone, in accordance with an embodiment.

Referring now to FIG. 18, a plan view illustration of a semiconductor device 1800 is shown, in accordance with an additional embodiment. The semiconductor device 1800 comprises a first forksheet transistor $1820_A$ and a second forksheet transistor $1820_B$ that are separated by a backbone 1810. Each transistor 1820 comprises source/drain regions 1805 that are on opposite ends of the gate electrode 1813 and spacers 1811. The semiconductor channels connecting the source/drain regions 1805 are hidden by the gate electrode 1813. In an embodiment, the first transistor $1820_A$ may be a first conductivity type (e.g., P-type) and the second transistor $1820_B$ may be a second conductivity type (e.g., N-type). In other embodiments, the first transistor $1820_A$ and the second transistor $1820_B$ may be the same conductivity type.

As shown, the semiconductor device 1800 comprises a first interconnect 1834 and a second interconnect 1841. The first interconnect 1834 electrically couples the gate electrodes 1813 of the first transistor $1820_A$ and the second transistor $1820_B$. The first interconnect 1834 may be similar to the interconnects described above with respect to FIGS. 13A-16D. The second interconnect 1841 electrically couples the source/drain regions 1805 of the first transistor $1820_A$ and the second transistor $1820_B$. The second interconnect 1841 may be similar to the interconnects described above with respect to FIGS. 17A and 17B. In an embodiment, providing interconnects 1834 and 1841 may allow for semiconductor device 1800 to be wired as an inverter. Other circuit elements may also be formed by providing various interconnects through the backbone 1810 to connect the source/drain regions 1805 and/or the gate electrodes 1813.

Figure 19A:
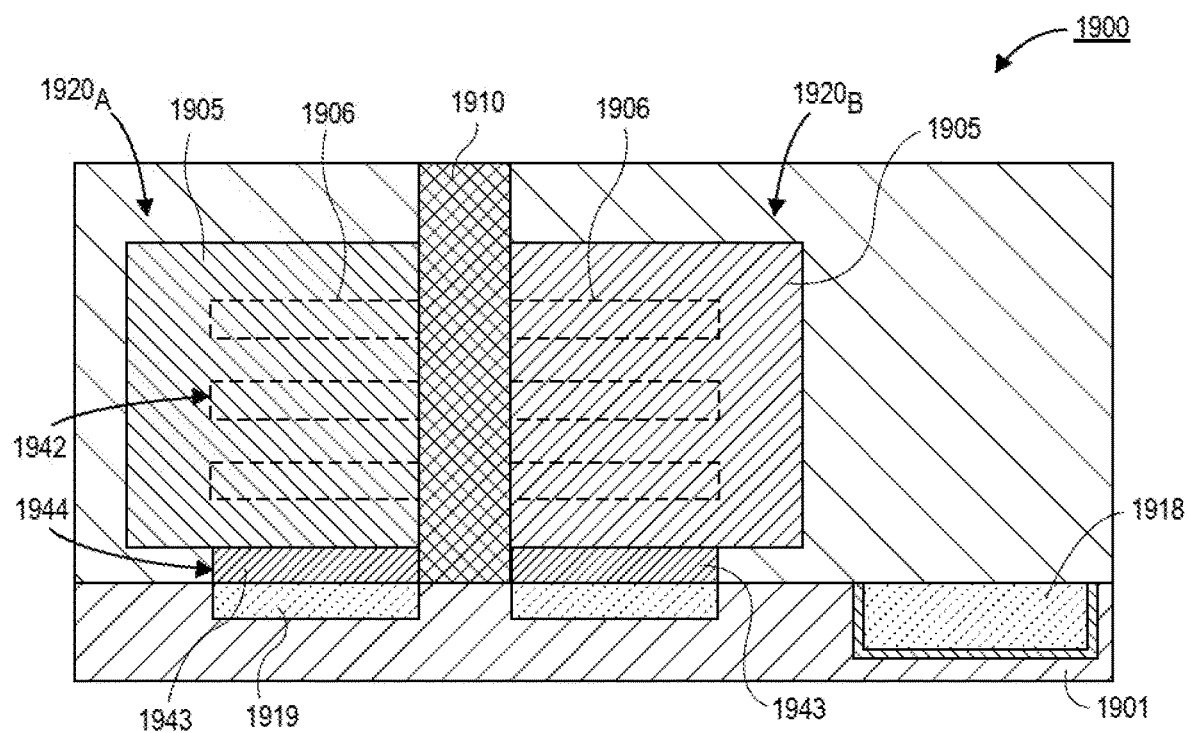
FIGS. 19A-19C are cross-sectional illustrations of forksheet transistors that comprise an etch selective layer between the source/drain regions and a bottom contact, in accordance with various embodiments.

Referring now to FIG. 19A, a cross-sectional illustration of a semiconductor device 1900 is shown, in accordance with an embodiment. In an embodiment, the semiconductor device 1900 comprises a substrate 1901 and forksheet transistors $1920_A$ and $1920_B$ over the substrate 1901. A backbone 1910 separates the first transistor $1920_A$ from the second transistor $1920_B$. The plane of the illustrated embodiment is through the source/drain region 1905. The location of the channels 1906 are shown with dashed lines to indicate they are out of the plane shown in FIG. 19A. In an embodiment, the first transistor $1920_A$ may be a first conductivity type (e.g., P-type) and the second transistor $1920_B$ may be a second conductivity type (e.g., N-type). In other embodiments, the first transistor $1920_A$ and the second transistor $1920_B$ may be the same conductivity type.

In an embodiment, conductive features may be provided in the substrate 1901. For example, a buried line 1918 may be positioned adjacent to the transistors 1920. Conductive pads 1919 may be located below the transistors 1920 and connected to the buried line 1918 (out of the plane of FIG. 19A). It is to be appreciated that the architecture of the conductive features in FIG. 19A is exemplary in nature, and that any backside interconnect architecture may be used. For example, the backside interconnect architecture may include any number of layers of routing, vias, pads, and the like.

In an embodiment, etch selective layers 1943 may be positioned between the source/drain regions 1905 and the pads 1919. In a particular embodiment, the etch selective layers 1943 may be aligned with the overlying channels 1906. For example, a distance between the backbone 1910 and a surface 1942 of the channels 1906 facing away from the backbone 1910 may be equal to a distance between the backbone 1910 and a surface 1944 of the etch selective layers 1943 facing away from the backbone 1910. In some instances, the etch selective layers 1943 may be referred to as being self-aligned with the overlying channels 1906. The self-alignment may result from the patterning of the channels 1906 and the etch selective layers 1943 with the same lithograph process (e.g., a single mask). In an embodiment, the etch selective layers 1943 may be a material that is etch selective to the surrounding materials. In a particular embodiment, the etch selective layers comprise titanium nitride, though other materials may also be used.

Figure 19B:
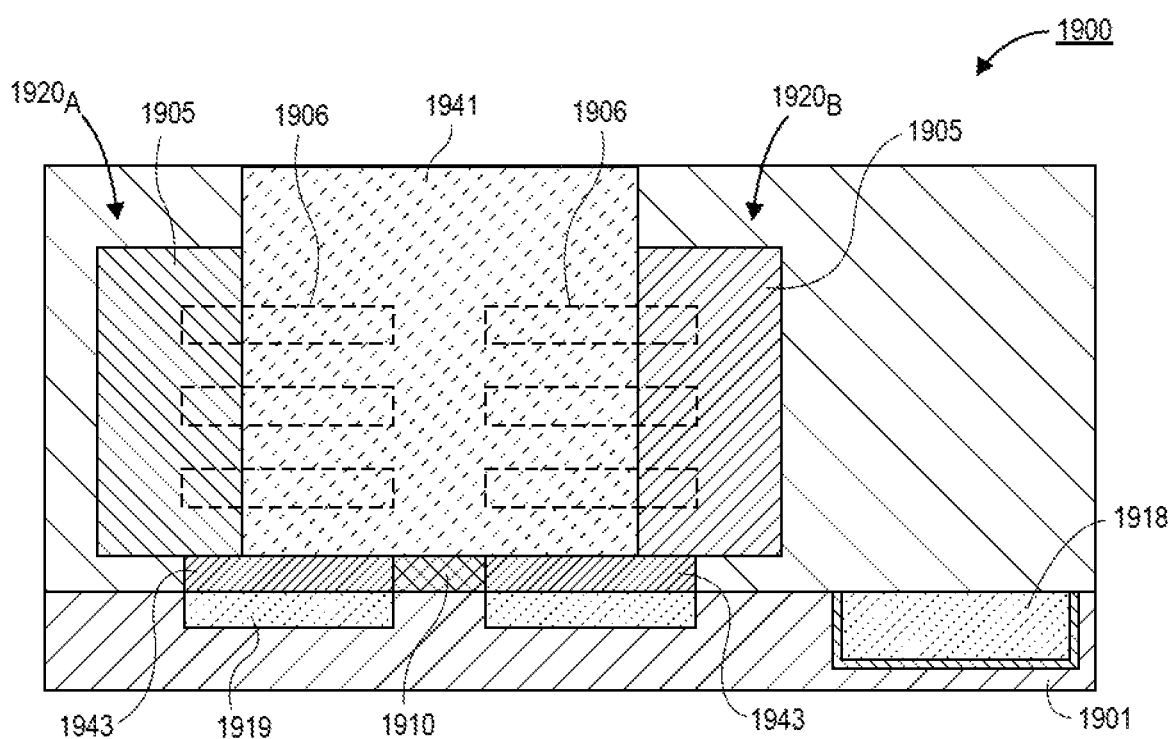

Referring now to FIG. 19B, a cross-sectional illustration of the semiconductor device 1900 after an interconnect 1941 is disposed across the backbone 1910 is shown, in accordance with an embodiment. In the illustrated embodiment, the etch selective layers 1943 are not etched away. That is, the etch selective layers 1943 serve as an etch stop that prevents the interconnect 1941 from contacting the underlying pads 1919.

Figure 19C:
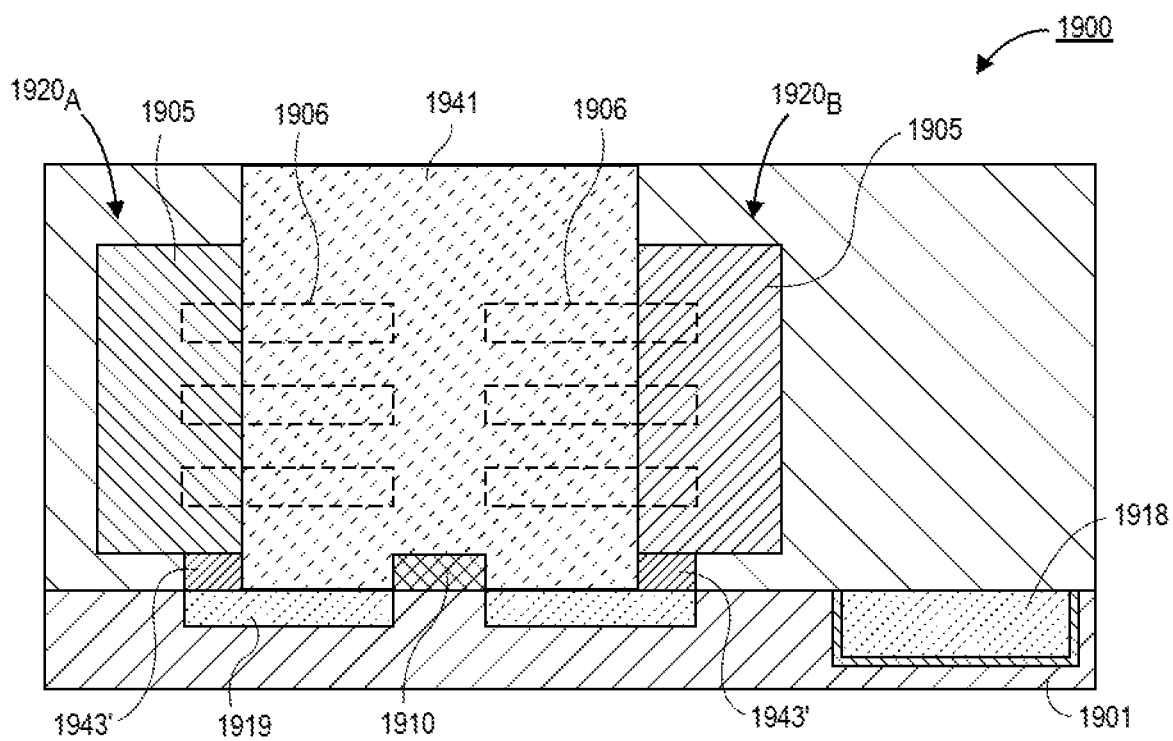

Referring now to FIG. 19C, a cross-sectional illustration of the semiconductor device 1900 with an interconnect 1941 that passes through the etch selective layers 1943 is shown, in accordance with an embodiment. In some embodiments, remnant portions 1943' of the etch selective layers 1943 may remain adjacent to the interconnect 1941. The interconnect 1941 may contact the underlying pads 1919. As those skilled in the art will appreciated, in a single semiconductor die, there may be instances where the etch selective layers 1943 remain to prevent connection to the underlying pads 1919

(e.g., similar to FIG. 19B), in addition to instances where only remnant portions 1943' of the etch selective layers 1943 remain. In yet another embodiment, the entirety of the etch selective layers 1943 below individual ones of the transistors 1920 may be removed.

Referring now to FIG. $20_A$, a cross-sectional illustration of a semiconductor device 2000 is shown, in accordance with an embodiment. The semiconductor device 2000 may be substantially similar to the semiconductor device 1900, with the exception that a first etch selective layer $2043_A$ comprises a different material than a second etch selective layer $2043_B$. For example, the first etch selective layer $2043_A$ may have an etch selectivity with respect to the second etch selective layer $2043_B$. As such, one of the first etch selective layer $2043_A$ or the second etch selective layer $2043_B$ may be removed without removing the other etch selective layer $2043_A$ or $2043_B$.

In an embodiment, the semiconductor device 2000 comprises a substrate 2001 and forksheet transistors $2020_A$ and $2020_B$ over the substrate 2001. A backbone 2010 separates the first transistor $2020_A$ from the second transistor $2020_B$. The plane of the illustrated embodiment is through the source/drain regions 2005. The location of the channels 2006 are shown with dashed lines to indicate they are out of the plane shown in FIG. $20_A$. In an embodiment, the first transistor $2020_A$ may be a first conductivity type (e.g., P-type) and the second transistor $2020_B$ may be a second conductivity type (e.g., N-type). In other embodiments, the first transistor $2020_A$ and the second transistor $2020_B$ may be the same conductivity type.

Figure 20A:
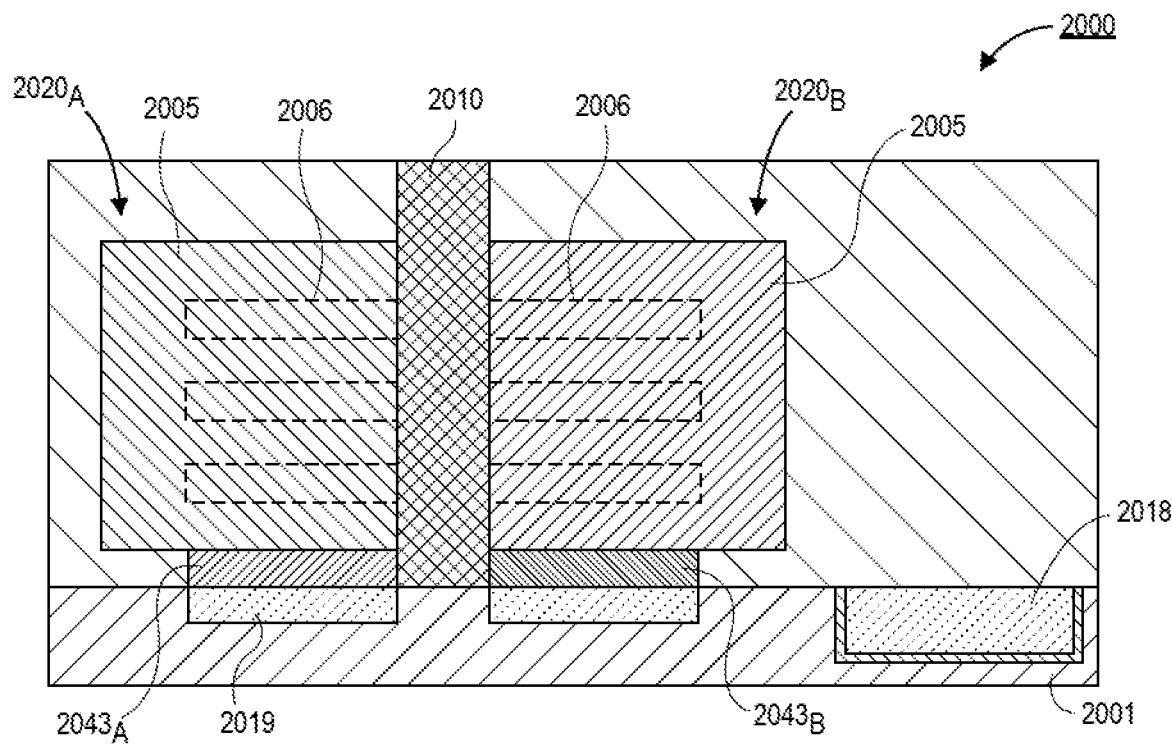
FIGS. 20A and 20B are cross-sectional illustrations of forksheet transistors that comprise different etch selective layers between the source/drain regions an bottom contacts, in accordance with various embodiments.

In an embodiment, conductive features may be provided in the substrate 2001. For example, a buried line 2018 may be positioned adjacent to the transistors 2020. Conductive pads 2019 may be located below the transistors 2020 and connected to the buried line 2018 (out of the plane of FIG. 20A). It is to be appreciated that the architecture of the conductive features in FIG. 20A is exemplary in nature, and that any backside interconnect architecture may be used. For example, the backside interconnect architecture may include any number of layers of routing, vias, pads, and the like.

Figure 20B:
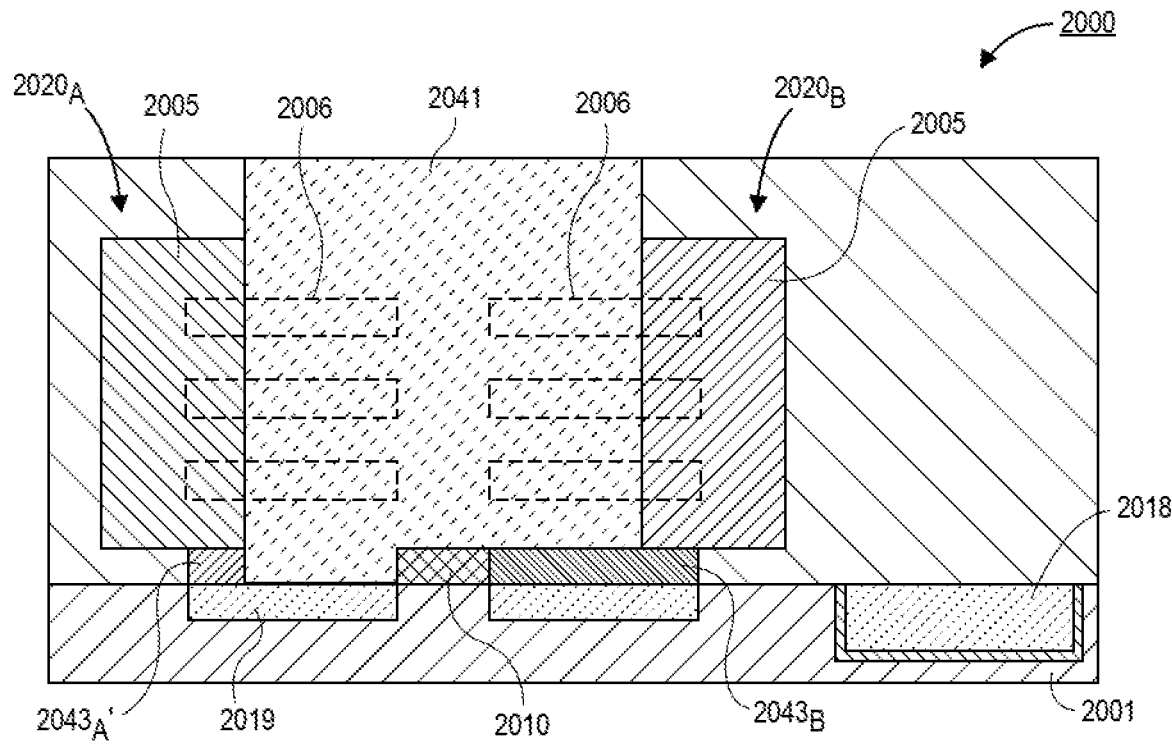

Referring now to FIG. 20B, a cross-sectional illustration of the semiconductor device 2000 after an interconnect 2041 across the backbone 2010 is provided is shown, in accordance with an embodiment. As shown, only the first etch selective layer $2043_A$ is etched to leave a first remnant portion $2043_A$'. The second etch selective layer $2043_B$ remains substantially unaltered. As such, the interconnect 2041 only contacts the pad 2019 below the first transistor $2020_A$, and the pad 2019 below the second transistor $2020_B$ is electrically isolated from the interconnect 2041. As such, further refinement and control of interconnect layouts is provided when multiple etch selective layers 2043 with different etch selectivities are used.

Figure 21:
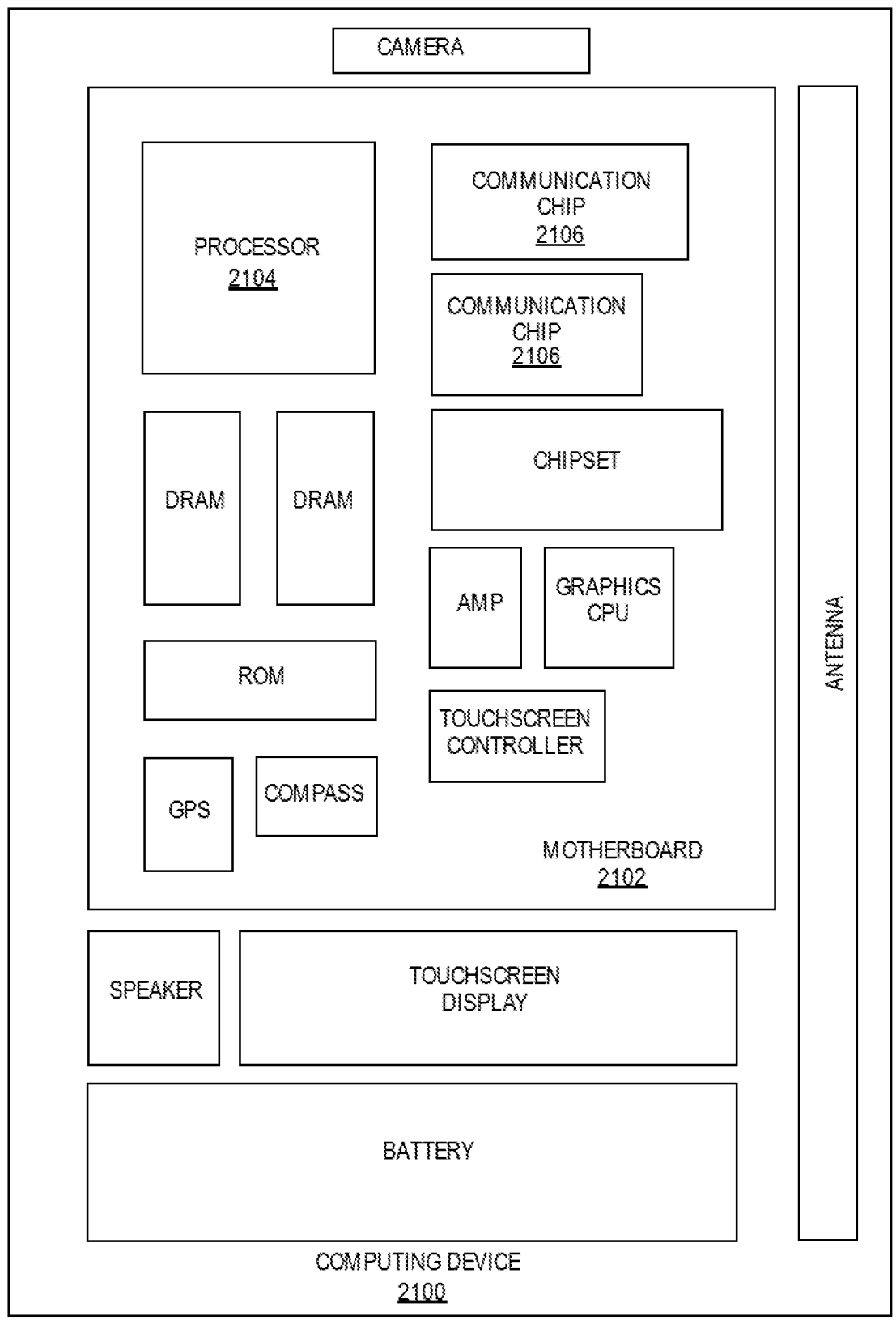
FIG. 21 illustrates a computing device in accordance with one implementation of an embodiment of the disclosure.

FIG. 21 illustrates a computing device 2100 in accordance with one implementation of an embodiment of the disclosure. The computing device 2100 houses a board 2102. The board 2102 may include a number of components, including but not limited to a processor 2104 and at least one communication chip 2106. The processor 2104 is physically and electrically coupled to the board 2102. In some implementations the at least one communication chip 2106 is also physically and electrically coupled to the board 2102. In further implementations, the communication chip 2106 is part of the processor 2104.

Depending on its applications, computing device 2100 may include other components that may or may not be physically and electrically coupled to the board 2102. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 2106 enables wireless communications for the transfer of data to and from the computing device 2100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 2100 may include a plurality of communication chips 2106. For instance, a first communication chip 2106 may be dedicated to shorter range wireless communications such as Wi-Fi and Bluetooth and a second communication chip 2106 may be dedicated to longer range wireless communications such as GPS, EDGE, GPRS, CDMA, WiMAX, LTE, Ev-DO, and others.

The processor 2104 of the computing device 2100 includes an integrated circuit die packaged within the processor 2104. In an embodiment, the integrated circuit die of the processor 2104 may comprise forksheet transistors, such as those described herein. The term "processor" may refer to any device or portion of a device that processes electronic data from registers and/or memory to transform that electronic data into other electronic data that may be stored in registers and/or memory.

The communication chip 2106 also includes an integrated circuit die packaged within the communication chip 2106. In an embodiment, the integrated circuit die of the communication chip 2106 may comprise forksheet transistors, such as those described herein.

In further implementations, another component housed within the computing device 2100 may comprise forksheet transistors, such as those described herein.

In various implementations, the computing device 2100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 2100 may be any other electronic device that processes data.

Figure 22:
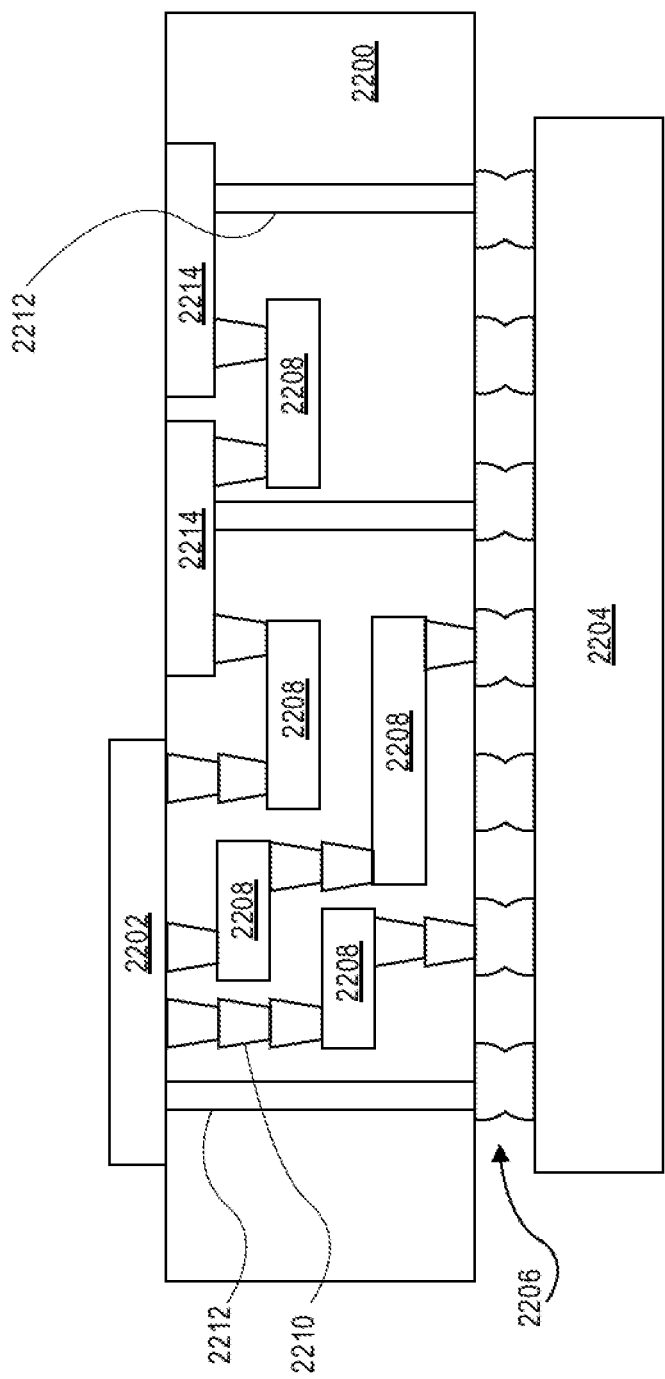
FIG. 22 is an interposer implementing one or more embodiments of the disclosure.

FIG. 22 illustrates an interposer 2200 that includes one or more embodiments of the disclosure. The interposer 2200 is an intervening substrate used to bridge a first substrate 2202 to a second substrate 2204. The first substrate 2202 may be, for instance, an integrated circuit die. The second substrate 2204 may be, for instance, a memory module, a computer motherboard, or another integrated circuit die. In an embodiment, one of both of the first substrate 2202 and the second substrate 2204 may comprise forksheet transistors, in accordance with embodiments described herein. Generally, the purpose of an interposer 2200 is to spread a connection to a wider pitch or to reroute a connection to a different connection. For example, an interposer 2200 may couple an integrated circuit die to a ball grid array (BGA) 2206 that can subsequently be coupled to the second substrate 2204. In some embodiments, the first and second substrates 2202/2204 are attached to opposing sides of the interposer 2200. In other embodiments, the first and second substrates 2202/204 are attached to the same side of the interposer 2200. And in further embodiments, three or more substrates are interconnected by way of the interposer 2200.

The interposer 2200 may be formed of an epoxy resin, a fiberglass-reinforced epoxy resin, a ceramic material, or a polymer material such as polyimide. In further implementations, the interposer 2200 may be formed of alternate rigid or flexible materials that may include the same materials described above for use in a semiconductor substrate, such as silicon, germanium, and other group III-V and group IV materials The interposer 2200 may include metal interconnects 2208 and vias 2210, including but not limited to through-silicon vias (TSVs) 2212. The interposer 2200 may further include embedded devices 2214, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 2200. In accordance with embodiments of the disclosure, apparatuses or processes disclosed herein may be used in the fabrication of interposer 2200.

Thus, embodiments of the present disclosure may comprise forksheet transistors, and the resulting structures.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a semiconductor device, comprising: a first transistor strata, wherein the first transistor strata comprises: a first backbone; a first transistor adjacent to a first edge of the first backbone; and a second transistor adjacent to a second edge of the first backbone; and a second transistor strata over the first transistor strata, wherein the second transistor strata comprises: a second backbone; a third transistor adjacent to a first edge of the second backbone; and a fourth transistor adjacent to a second edge of the second backbone.

Example 2: the semiconductor device of Example 1, wherein individual ones of the first transistor, the second transistor, the third transistor, and the fourth transistor comprise: a source; a drain; a semiconductor channel between the source and the drain; a gate dielectric surrounding portions of the semiconductor channel; and a gate electrode over the gate dielectric.

Example 3: the semiconductor device of Example 2, wherein a surface of the semiconductor channel directly contacts the first backbone or the second backbone.

Example 4: the semiconductor device of Example 2, wherein the semiconductor channel comprises a plurality of semiconductor channels in a vertical stack between the source and the drain.

Example 5: the semiconductor device of Examples 1-4, wherein the first edge of the first backbone is offset from the first edge of the second backbone.

Example 6: the semiconductor device of Examples 1-5, wherein the first edge of the first backbone is aligned with the first edge of the second backbone.

Example 7: the semiconductor device of Example 6, wherein the first backbone is connected to the second backbone.

Example 8: the semiconductor device of Examples 1-7, wherein the first transistor and the second transistor are P-type transistors, and wherein the third transistor and the fourth transistor are N-type transistors.

Example 9: the semiconductor device of Examples 1-8, wherein the first transistor and the third transistor are P-type transistors, and wherein the second transistor and the fourth transistor are N-type transistors.

Example 10: the semiconductor device of Examples 1-9, further comprising: an insulating layer between the first transistor strata and the second transistor strata.

Example 11: the semiconductor device of Example 10, further comprising: an interconnect through the insulating layer to electrically couple a gate electrode of the first transistor to a gate electrode of the third transistor.

Example 12: the semiconductor device of Example 10, further comprising: an interconnect through the insulating layer to electrically couple a source or a drain of the first transistor to a source or a drain of the third transistor.

Example 13: the semiconductor device of Example 12, wherein the interconnect extends through the source or the drain of the third transistor.

Example 14: the semiconductor device of Example 13, wherein the interconnect passes into the source or the drain of the first transistor.

Example 15: the semiconductor device of Example 12, wherein the interconnect contacts a perimeter of the source or the drain of the third transistor, and wherein the interconnect contacts a perimeter of the source or drain of the first transistor.

Example 16: the semiconductor device of Examples 1-15, further comprising: a contact below the first transistor strata, wherein the contact is separated from the first transistor strata by an insulating layer; and an interconnect through the insulating layer, wherein the interconnect electrically couples the contact to the first transistor.

Example 17: the semiconductor device of Example 16, wherein the interconnect electrically couples the contact to a source or a drain of the first transistor.

Example 18: the semiconductor device of Example 16, wherein the interconnect electrically couples the contact to a gate electrode of the first transistor.

Example 19: a semiconductor device, comprising: a backbone having a first edge and a second edge, wherein the backbone is an insulative material; a first transistor adjacent to the first edge of the backbone; and a second transistor adjacent to the second edge of the backbone, wherein individual ones of the first transistor and the second transistor comprise: a source; a drain; a semiconductor channel between the source and the drain, wherein an edge of the semiconductor channel closest to the backbone is spaced away from the first edge of the backbone or the second edge of the backbone; a gate dielectric completely surrounding a perimeter of the semiconductor channel; and a gate electrode completely surrounding the gate dielectric.

Example 20: the semiconductor device of Example 19, wherein the edge of the semiconductor channel closest to the backbone is spaced away from the first edge of backbone or the second edge of the backbone by approximately 6 nm or less.

Example 21: the semiconductor device of Example 19 or Example 20, further comprising: a liner below the backbone, wherein the liner is a material that has an etch selectivity to a material of the backbone.

Example 22: the semiconductor device of Examples 19-21, further comprising: a liner over a portion of the first edge of the backbone and over a portion of the second edge of the backbone.

Example 23: the semiconductor device of Example 22, wherein the liner is between the source of the first transistor and the backbone, between the source of the second transistor and the backbone, between the drain of the first transistor and the backbone, and between the drain of the second transistor and the backbone.

Example 24: the semiconductor device of Example 23, wherein a portion of the first edge of the backbone and a portion of the second edge of the backbone adjacent to the gate electrode are not covered by the liner.

Example 25: the semiconductor device of Example 24, wherein a spacing between the backbone and an edge of the semiconductor channel closest to the backbone is substantially equal to a thickness of the liner.

Example 26: the semiconductor device of Example 24, wherein the portion of the first edge of the backbone and the portion of the second edge of the backbone adjacent to the gate electrode are separated from the gate electrodes by the gate dielectric.

Example 27: the semiconductor device of Examples 19-25, further comprising: a liner over the first edge of the backbone and over the second edge of the backbone, wherein the liner comprises a catalytic oxidant.

Example 28: the semiconductor device of Example 27, wherein the catalytic oxidant comprises aluminum and oxygen.

Example 29: the semiconductor device of Example 27 or Example 28, wherein a surface of the liner facing the semiconductor channel comprises a depression.

Example 30: the semiconductor device of Example 29, wherein the depression is aligned with the semiconductor channel.

Example 31: the semiconductor device of Examples 19-30, further comprising: an air gap between the semiconductor channel and the backbone.

Example 32: the semiconductor device of Examples 19-31, wherein the first transistor is an N-type transistor and the second transistor is a P-type transistor.

Example 33: the semiconductor device of Examples 19-32, wherein the semiconductor channel comprises a plurality of semiconductor channels in a vertical stack between the source and the drain.

Example 34: a semiconductor device, comprising: a backbone having a first edge and a second edge, wherein the backbone is an insulative material; a first transistor adjacent to the first edge of the backbone; a second transistor adjacent to the second edge of the backbone, wherein individual ones of the first transistor and the second transistor comprise: a source; a drain; a semiconductor channel between the source and the drain; a gate dielectric surrounding at least a portion of a perimeter of the semiconductor channel; and a gate electrode over the gate dielectric; and an interconnect to electrically couple the first transistor to the second transistor, wherein the interconnect passes through the backbone.

Example 35: the semiconductor device of Example 34, wherein the interconnect connects the gate electrode of the first transistor to the gate electrode of the second transistor.

Example 36: the semiconductor device of Example 35, wherein the backbone comprises a first layer and a second layer, wherein the first layer has an etch selectivity to the second layer.

Example 37: the semiconductor device of Example 36, wherein a top surface of the first layer is above a topmost surface of the semiconductor channel of the first transistor and a topmost surface of the semiconductor channel of the second transistor, and wherein the second layer is adjacent to the semiconductor channel of the first transistor and the semiconductor channel of the second transistor.

Example 38: the semiconductor device of Example 37, wherein the interconnect contacts the top surface over the second layer.

Example 39: the semiconductor device of Examples 36-38, wherein a bottom surface of the first layer is below a bottommost surface of the semiconductor channel of the first transistor and a bottommost surface of the semiconductor channel of the second transistor, and wherein the second layer is adjacent to the semiconductor channel of the first transistor and the semiconductor channel of the second transistor.

Example 40: the semiconductor device of Example 39, wherein the interconnect contacts the bottom surface of the first layer.

Example 41: the semiconductor device of Examples 36-40, wherein a top surface of the first layer is above a topmost surface of the semiconductor channel of the first transistor and a topmost surface of the semiconductor channel of the second transistor, and wherein the second layer is above the first layer.

Example 42: the semiconductor device of Examples 36-41, wherein the second layer and the first layer both extend along an entire length of the backbone.

Example 43: the semiconductor device of Examples 36-41, wherein a length of the first layer is smaller than a length of the second layer.

Example 44: the semiconductor device of Example 43, wherein the first layer is aligned with the gate electrode of the first transistor and the gate electrode of the second transistor.

Example 45: the semiconductor device of Examples 34-44, wherein the interconnect connects the source or the drain of the first transistor to the source or the drain of the second transistor.

Example 46: the semiconductor device of Example 45, further comprising: a first etch selective layer below the first transistor; and a second etch selective layer below the second transistor.

Example 47: the semiconductor device of Example 46, wherein the first etch selective layer is the same material as the second etch selective layer.

Example 48: the semiconductor device of Example 46, wherein the first etch selective layer has an etch selectivity with respect to the second etch selective layer.

Example 49: the semiconductor device of Example 46, wherein a first edge of the first etch selective layer that faces away from the backbone is spaced away from the backbone by a first spacing equal to a second spacing between a second edge of the semiconductor channel of the first transistor that faces away from the backbone and the backbone, and wherein a third edge of the second etch selective layer that faces away from the backbone is spaced away from the backbone by a third spacing equal to a fourth spacing between a fourth edge of the semiconductor channel of the second transistor that faces away from the backbone and the backbone.

Example 50: the semiconductor device of Example 49, wherein a width of one or both of the first etch selective layer and the second etch selective layer is smaller than a width of the overlying semiconductor channel.

Example 51: the semiconductor device of Example 46, wherein a bottom interconnect passes adjacent to one or both of the first etch selective layer and the second etch selective layer to electrically couple one or both of the source or the drain of the first transistor to contacts below the first transistor and the second transistor.

Example 52: the semiconductor device of Examples 34-51, wherein the interconnect comprises: a first interconnect that passes through the backbone, wherein the first interconnect electrically couples the gate electrode of the first transistor to the gate electrode of the second transistor; and a second interconnect that passes through the backbone, wherein the second interconnect electrically couples the source or the drain of the first transistor to the source or the drain of the second transistor.

Example 53: the semiconductor device of Examples 34-52, wherein the semiconductor device is an inverter.

Example 54: the semiconductor device of Examples 34-53, wherein the first transistor is an N-type transistor, and wherein the second transistor is a P-type transistor.

Example 55: the semiconductor device of Examples 34-53, wherein the semiconductor channel comprises a plurality of semiconductor channels in a vertical stack between the source and the drain.

Example 56: an electronic system, comprising: a board; an electronic package connected to the board; and a die electrically coupled to the electronic package, wherein the die comprises: a backbone having a first edge and a second edge, wherein the backbone is an insulative material; a first transistor adjacent to the first edge of the backbone; a second transistor adjacent to the second edge of the backbone; and an interconnect to electrically couple the first transistor to the second transistor, wherein the interconnect passes through the backbone.

Example 57: the electronic system of claim 56, wherein individual ones of the first transistor and the second transistor comprise: a source; a drain; a semiconductor channel between the source and the drain; a gate dielectric surrounding at least a portion of a perimeter of the semiconductor channel; and a gate electrode over the gate dielectric.

Example 58: the electronic system of Example 57, wherein the gate dielectric completely surrounds a perimeter of the semiconductor channel.

Example 59: the electronic system of Examples 56-58, further comprising: a third transistor over the first transistor; a fourth transistor over the second transistor; and a second backbone between the third transistor and the fourth transistor.

Example 60: the electronic system of Example 59, wherein the third transistor is electrically coupled to the first transistor, wherein the fourth transistor is electrically coupled to the second transistor, or wherein the third transistor is electrically coupled to the first transistor and the fourth transistor is electrically coupled to the second transistor.

What is claimed is:

1. A semiconductor device, comprising:
   a first transistor strata, wherein the first transistor strata comprises:
      a first backbone;
      a first transistor adjacent to a first edge of the first backbone; and
      a second transistor adjacent to a second edge of the first backbone; and
   a second transistor strata over the first transistor strata, wherein the second transistor strata comprises:
      a second backbone, the second backbone separate and distinct from the first backbone, and the second backbone at least partially vertically overlapping with the first backbone;
      a third transistor adjacent to a first edge of the second backbone; and
      a fourth transistor adjacent to a second edge of the second backbone.

2. The semiconductor device of claim 1, wherein individual ones of the first transistor, the second transistor, the third transistor, and the fourth transistor comprise:
   a source;
   a drain;
   a semiconductor channel between the source and the drain;
   a gate dielectric surrounding portions of the semiconductor channel; and
   a gate electrode over the gate dielectric.

3. The semiconductor device of claim 2, wherein a surface of the semiconductor channel directly contacts the first backbone or the second backbone.

4. The semiconductor device of claim 2, wherein the semiconductor channel comprises a plurality of semiconductor channels in a vertical stack between the source and the drain.

5. The semiconductor device of claim 1, wherein the first edge of the first backbone is offset from the first edge of the second backbone.

6. The semiconductor device of claim 1, wherein the first edge of the first backbone is aligned with the first edge of the second backbone.

7. The semiconductor device of claim 6, wherein the first backbone is connected to the second backbone.

8. The semiconductor device of claim 1, wherein the first transistor and the second transistor are P-type transistors, and wherein the third transistor and the fourth transistor are N-type transistors.

9. The semiconductor device of claim 1, wherein the first transistor and the third transistor are P-type transistors, and wherein the second transistor and the fourth transistor are N-type transistors.

10. The semiconductor device of claim 1, further comprising:
    an insulating layer between the first transistor strata and the second transistor strata.

11. The semiconductor device of claim 10, further comprising:
    an interconnect through the insulating layer to electrically couple a gate electrode of the first transistor to a gate electrode of the third transistor.

12. The semiconductor device of claim 10, further comprising:

an interconnect through the insulating layer to electrically couple a source or a drain of the first transistor to a source or a drain of the third transistor.

13. The semiconductor device of claim 12, wherein the interconnect extends through the source or the drain of the third transistor.

14. The semiconductor device of claim 13, wherein the interconnect passes into the source or the drain of the first transistor.

15. The semiconductor device of claim 12, wherein the interconnect contacts a perimeter of the source or the drain of the third transistor, and wherein the interconnect contacts a perimeter of the source or drain of the first transistor.

16. The semiconductor device of claim 1, further comprising:
   a contact below the first transistor strata, wherein the contact is separated from the first transistor strata by an insulating layer; and
   an interconnect through the insulating layer, wherein the interconnect electrically couples the contact to the first transistor.

17. The semiconductor device of claim 16, wherein the interconnect electrically couples the contact to a source or a drain of the first transistor.

18. The semiconductor device of claim 16, wherein the interconnect electrically couples the contact to a gate electrode of the first transistor.

19. A semiconductor device, comprising:
   a backbone having a first edge and a second edge, wherein the backbone is an insulative material, and a liner is over a portion of the first edge of the backbone and over a portion of the second edge of the backbone;
   a first transistor adjacent to the first edge of the backbone; and
   a second transistor adjacent to the second edge of the backbone, wherein individual ones of the first transistor and the second transistor comprise:
      a source;
      a drain;
      a semiconductor channel between the source and the drain, wherein an edge of the semiconductor channel closest to the backbone is spaced away from the first edge of the backbone or the second edge of the backbone;
      a gate dielectric completely surrounding a perimeter of the semiconductor channel; and
      a gate electrode completely surrounding the gate dielectric.

20. The semiconductor device of claim 19, wherein the edge of the semiconductor channel closest to the backbone is spaced away from the first edge of backbone or the second edge of the backbone by approximately 6 nm or less.

21. An electronic system, comprising:
   a board;
   an electronic package connected to the board; and
   a die electrically coupled to the electronic package, wherein the die comprises:
      a backbone having a first edge and a second edge, wherein the backbone is an insulative material, and a liner is over a portion of the first edge of the backbone and over a portion of the second edge of the backbone;
      a first transistor adjacent to the first edge of the backbone;
      a second transistor adjacent to the second edge of the backbone; and
      an interconnect to electrically couple the first transistor to the second transistor, wherein the interconnect passes through the backbone.

22. The electronic system of claim 21, wherein individual ones of the first transistor and the second transistor comprise:
   a source;
   a drain;
   a semiconductor channel between the source and the drain;
   a gate dielectric surrounding at least a portion of a perimeter of the semiconductor channel; and
   a gate electrode over the gate dielectric.

23. The electronic system of claim 22, wherein the gate dielectric completely surrounds a perimeter of the semiconductor channel.

24. A semiconductor device, comprising:
   a backbone having a first edge and a second edge, wherein the backbone is an insulative material;
   a liner below the backbone, wherein the liner is a material that has an etch selectivity to a material of the backbone;
   a first transistor adjacent to the first edge of the backbone; and
   a second transistor adjacent to the second edge of the backbone, wherein individual ones of the first transistor and the second transistor comprise:
      a source;
      a drain;
      a semiconductor channel between the source and the drain, wherein an edge of the semiconductor channel closest to the backbone is spaced away from the first edge of the backbone or the second edge of the backbone;
      a gate dielectric completely surrounding a perimeter of the semiconductor channel; and
      a gate electrode completely surrounding the gate dielectric.

* * * * *